US006962860B2

(12) United States Patent
Yamazaki et al.

(10) Patent No.: US 6,962,860 B2
(45) Date of Patent: Nov. 8, 2005

(54) METHOD OF MANUFACTURING A SEMICONDUCTOR DEVICE

(75) Inventors: Shunpei Yamazaki, Tokyo (JP); Hisashi Ohtani, Tochigi (JP); Masaaki Hiroki, Kanagawa (JP); Koichiro Tanaka, Kanagawa (JP); Aiko Shiga, Kanagawa (JP); Akihisa Shimomura, Kanagawa (JP); Mai Akiba, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/289,219

(22) Filed: Nov. 7, 2002

(65) Prior Publication Data

US 2003/0148594 A1 Aug. 7, 2003

(30) Foreign Application Priority Data

Nov. 9, 2001 (JP) ........................................ 2001-344208

(51) Int. Cl.[7] ................................................ H01L 21/20
(52) U.S. Cl. ....................... 438/487; 438/463; 438/535; 438/662
(58) Field of Search ........................ 438/487, 158–166, 438/463, 535, 662

(56) References Cited

U.S. PATENT DOCUMENTS

| 4,330,363 A | 5/1982 | Biegesen et al. |
| 5,643,826 A | 7/1997 | Ohtani et al. |
| 5,854,803 A | 12/1998 | Yamazaki et al. |

(Continued)

FOREIGN PATENT DOCUMENTS

| JP | 62-104117 | 5/1987 |
| JP | 02-18419 | 7/1990 |
| JP | 04-282869 | 10/1992 |
| JP | 07-130652 | 5/1995 |
| JP | 08-078329 | 3/1996 |
| JP | 08-195357 | 7/1996 |
| JP | 10-135468 | 5/1998 |
| JP | 10-135469 | 5/1998 |
| JP | 3221724 | 8/2001 |

OTHER PUBLICATIONS

Akito Hara et al., "Ultra–high Performance Poly–Si TFTs on a Glass bu a Stable Scanning CW Laser Lateral Crystallization", TFT3–1, AM–LCD '01, pp. 227–230.

F. Takeuchi et al., "Performance of poly–Si TFTs fabricated by a Stable Scanning CW Laser Crystallization", AM–LCD '01, pp. 251–254.

*Primary Examiner*—Dung A. Le
(74) *Attorney, Agent, or Firm*—Nixon Peabody LLP; Jeffrey L. Costellia

(57) ABSTRACT

To provide a continuous-oscillating laser apparatus capable of improving the efficiency of substrate treatment, a method of irradiating a laser beam, and a method of manufacturing a semiconductor device using the laser apparatus. Of the entire semiconductor film, a portion that needs to be left on the substrate after patterning is identified according to a mask. Then, a portion to be scanned by respective lasers are defined, so that a laser beam is irradiated twice in different scanning directions to a portion to be obtained at least through patterning and beam spots are impinged upon the scanned portion, thereby partially crystallizing the semiconductor film. In other words, in the invention, it is arranged in such a manner that a laser beam is not irradiated by scanning a laser beam across the entire semiconductor film but by scanning a laser beam twice at least to the absolutely necessary portion. According to the above arrangement, it is possible to save the time to irradiate a laser beam in waste to the semiconductor film at a portion to be removed through patterning, and the crystalline characteristics of the semiconductor film obtained after the patterning can be further enhanced.

36 Claims, 38 Drawing Sheets

U.S. PATENT DOCUMENTS

| | | |
|---|---|---|
| 5,923,962 A | 7/1999 | Ohtani et al. |
| 5,953,597 A | 9/1999 | Kusumoto et al. |
| 6,204,099 B1 | 3/2001 | Kusumoto et al. |
| 6,210,996 B1 | 4/2001 | Yamazaki et al. |
| 6,265,745 B1 | 7/2001 | Kusumoto et al. |
| 6,285,042 B1 | 9/2001 | Ohtani et al. |
| 6,335,541 B1 | 1/2002 | Ohtani et al. |
| 6,437,284 B1 * | 8/2002 | Okamoto et al. ...... 219/121.73 |
| 6,650,480 B2 * | 11/2003 | Tanaka ....................... 359/618 |
| 2001/0019861 A1 | 9/2001 | Yamazaki et al. |
| 2003/0075733 A1 * | 4/2003 | Yamazaki et al. .......... 257/200 |

* cited by examiner

First Scanning

Second Scanning

Forming Base Film/Forming Semiconductor Film

Crystallizing Semiconductor Film by Laser Light Irradiation

Forming Semiconductor Island by Patterning

Forming 1st Conductive Film and 2nd Conductive Film

1st Etching Treatment

2nd Etching Treatment/1st Doping Treatment

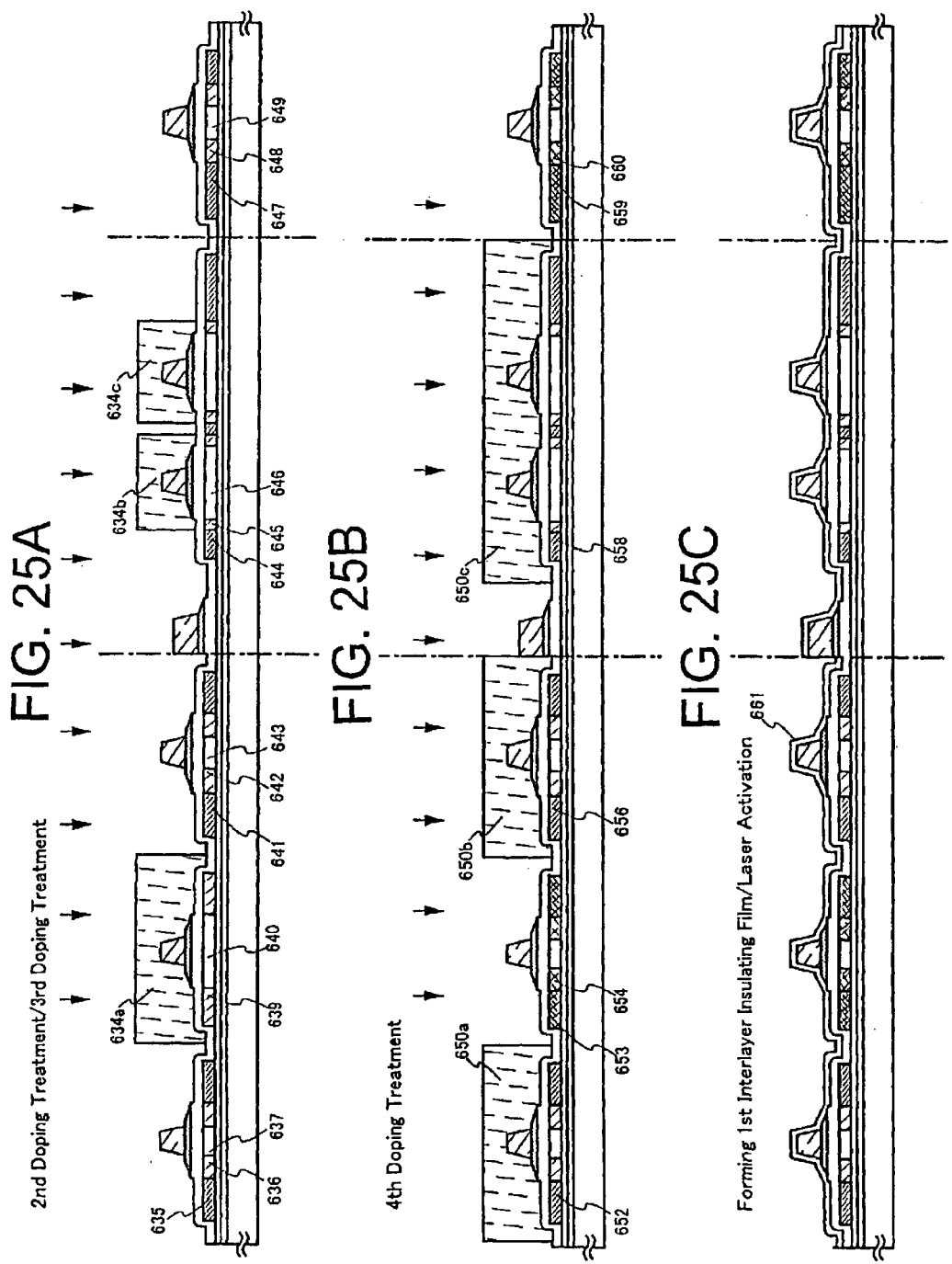

METHOD OF MANUFACTURING A SEMICONDUCTOR DEVICE

BACKGROUND OF THE INVENTION

1. Field of the Invention

The present invention relates to a laser processing apparatus and a laser irradiation method for crystallizing a semiconductor substrate, a semiconductor film or the like using a laser light or for performing activation after ion implantation, a semiconductor device formed by using the laser apparatus and a manufacturing method therefore, an electronic equipment using the semiconductor device, and a production system of the semiconductor device using the laser apparatus.

2. Description of Related Art

In recent years, a technique of forming a TFT on a substrate has greatly progressed, and its application and development for an active matrix semiconductor display device has been advanced. In particular, since a TFT using a poly crystalline semiconductor film has higher field-effect mobility (also referred to as a mobility) than a TFT using a conventional amorphous silicon film, it enables high speed operation. Therefore, although the pixel is conventionally controlled on a driver circuit provided outside the substrate, it is possible to control the pixel on the driver circuit formed on the same substrate.

Incidentally, as the substrate used in the semiconductor device, a glass substrate is regarded as important in comparison with a single crystal silicon substrate in terms of the cost. Since a glass substrate is inferior in heat resistance and is susceptible to heat-deformation, in the case where a polysilicon TFT is formed on the glass substrate, laser annealing is used for crystallization of the semiconductor film in order to avoid heat-deformation of the glass substrate.

Characteristics of laser annealing are as follows: it can greatly reduce a processing time in comparison with an annealing method using radiation heating or conductive heating; and it hardly causes thermal damage to the substrate by selectively and locally heating a semiconductor or the semiconductor film.

Note that the laser annealing method here indicates a technique of recrystallizing the damaged layer formed on the semiconductor substrate or the semiconductor film, and a technique of crystallizing the amorphous semiconductor film formed on the substrate. Also, the laser annealing method here includes a technique applied to leveling or surface reforming of the semiconductor substrate or the semiconductor film. A laser oscillation apparatus applied is a gas laser oscillation apparatus represented by an excimer laser or a solid laser oscillation apparatus represented by a YAG laser. It is known as the apparatus which performs crystallization by heating a surface layer of the semiconductor by irradiation of the laser light in an extremely short period of time of about several ten nanoseconds to several hundred microseconds.

Lasers are roughly divided into two types: pulse oscillation and continuous oscillation, according to an oscillation method. In the pulse oscillation laser, an output energy is relatively high, so that mass productivity can be increased assuming the size of a beam spot to be several $cm^2$ or more. In particular, when the shape of the beam spot is processed using an optical system and made to be a linear shape of 10 cm or more in length, it is possible to efficiently perform irradiation of the laser light to the substrate and further enhance the mass productivity. Therefore, for crystallization of the semiconductor film, the use of a pulse oscillation laser is becoming mainstream.

However, in recent years, in crystallization of the semiconductor film, it is found that grain size of the crystal formed in the semiconductor film is larger in the case where the continuous oscillation laser is used than the case where the pulse oscillation laser is used. When the crystal grain size in the semiconductor film becomes large, the mobility of the TFT formed using the semiconductor film becomes high and variation of the TFT characteristics due to a grain boundary is suppressed. Therefore, a continuous oscillation laser is recently attracting attention.

However, since the maximum output energy of the continuous oscillation laser is generally small in comparison with that of the pulse oscillation laser, the size of the beam spot is small, which is about $10^{-3}$ $mm^2$. Accordingly, in order to treat one large substrate, it is necessary to move a beam irradiation position on the substrate upward and downward, and right and left, it results in increasing the processing time per one substrate. Thus, processing efficiency is poor and it is an important object to improve the processing speed of the substrate.

Note that, a technique that a processing efficiency is enhanced by synthesizing a plurality of beam spots to be use as one beam spot has been conventionally used (see Reference 1 and reference 2, for example).

Patent Gazette No. 3221724 (Page 2, FIG. 11)

Patent Application Laid-open No. Hei 4-282869 (Page 2 to 3, FIG. 1a)

SUMMARY OF THE INVENTION

The present invention has been made in view of the above problems, and therefore it is an object of the present invention to provide a laser apparatus, a laser irradiation method, and a method of manufacturing a semiconductor device using the laser apparatus, which can enhance a processing efficiency in comparison with the conventional example.

The laser apparatus of the present invention includes: a first means for controlling an irradiation position of each laser light on an object to be processed; a second means (laser oscillation apparatuses) for oscillating laser lights; a third means (optical system) for processing the laser lights; and a fourth means for controlling the first means so that beam spots of the laser lights cover a position determined in accordance with data (pattern information) concerning a shape of a mask.

It should be noted here that the position determined in accordance with the mask data indicates a portion of a semiconductor film to be obtained by performing patterning after crystallization. With the present invention, in accordance with the mask, the fourth means grasps a portion of the semiconductor film formed on an insulating surface that should be left on a substrate after the patterning. In addition, a portion to be scanned with a first laser light is determined so that at least the portion to be obtained by performing the patterning is crystallized, and the first means is controlled so that the beam spots strike the portion to be scanned. In this manner, the semiconductor film is partially crystallized. Subsequently, the scanning direction is changed by controlling the first means. An area to be scanned with a second laser light is so defined as to crystallize at least the portion to be obtained by patterning. Then, the second laser light is irradiated on the scanned area. At this time, an angle between the scanning direction of the first laser light and that of the second laser light is most preferably as close to 90° as possible.

That is, with the present invention, the laser lights are not scanned and irradiated onto the entire surface of the semiconductor film but are scanned so that at least an indispensable portion is crystallized. With the construction described above, it becomes possible to save a time taken to irradiate the laser lights onto a portion to be removed through the patterning after the crystallization of the semiconductor film.

Some of the crystal grains formed by the irradiation of the first laser light grow into a single crystal grain of a larger size due to the irradiation of the second laser light in the different scanning direction. This is because the crystal grains grown in a given direction due to the irradiation of the first laser light act as seeds, which grow along the different direction from the above given direction as a result of the irradiation of the second laser light. Accordingly, the two laser irradiation processes in the different scanning directions provide a semiconductor film locally enhanced in crystallinity. A portion of the semiconductor film that has an even higher crystallinity may be used for forming an active layer of a TFT and thus, the TFT having an enhanced mobility may be obtained.

With the present invention, in order to conduct a laser irradiation selectively with a mask, after the formation of the semiconductor film, prior to the crystallization using the laser lights, a marker is given to the semiconductor film using a laser light. Then, a position, at which the laser lights should be scanned, is determined based on a mask with reference to the position of the marker.

With the construction described above, it becomes possible to shorten a time taken to irradiate the laser lights and also to improve a speed at which a substrate is processed.

BRIEF DESCRIPTION OF THE DRAWINGS

FIGS. 25A, 25B and 25C are views showing the method of manufacturing the semiconductor device using the laser apparatus of the invention.

DETAILED DESCRIPTION OF THE PREFERRED EMBODIMENTS

Figure 1:
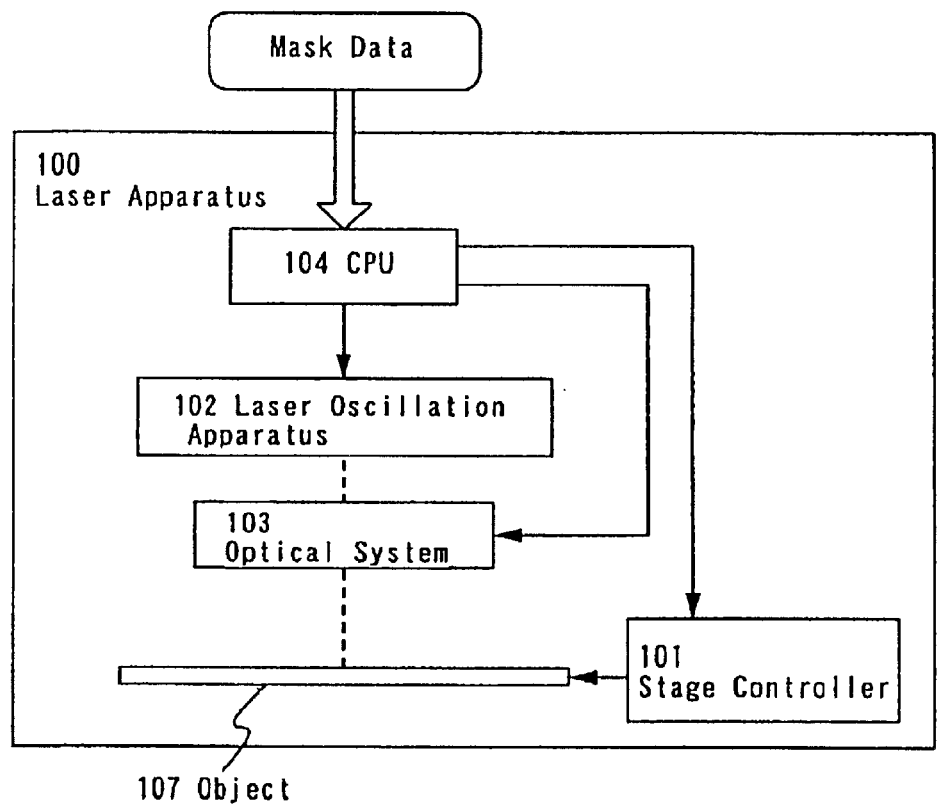
FIG. 1 is a view showing a structure of a laser apparatus of the invention.

Hereinafter, there will be described a construction of the laser apparatus of the present invention. FIG. 1 is a block diagram of a light emitting device of the present invention.

A laser apparatus 100 of the present invention includes a stage controller 101 that corresponds to a first means for controlling an irradiation position of each laser light on an object to be processed. Note that, in FIG. 1, laser light irradiation positions can be moved (scanned) or scanning direction of the laser lights can be changed by shifting the position of the substrate by means of the stage controller 101. However, the present invention is not limited to this configuration. The laser lights may be scanned or the scanning direction of the laser lights may be changed by means of an optical system.

Also, the laser apparatus 100 of the present invention includes a laser oscillation apparatus 102 that corresponds to a second means for oscillating laser lights. Note that an example where one laser oscillation apparatus 102 is provided is shown in FIG. 1, although the number of the laser oscillation apparatus 102 possessed by the laser apparatus 100 of the present invention is not limited to this. Beam spots of respective laser lights emitted from the laser oscillation apparatus may be superpositioned on each other to form a single beam spot.

It is possible to change the laser as appropriate depending on the purpose of processing. In the present invention, it is possible to use a publicly known laser. As the laser, it is possible to use a gas laser or solid-state laser of pulse oscillation or continuous oscillation. As the gas laser, it is possible to use an excimer laser, an Ar laser, a Kr laser, and the like. On the other hand, as the solid-state laser, it is possible to cite a YAG laser, a $YVO_4$ laser, a YLF laser, a $YAlO_3$ laser, a glass laser, a ruby laser, an alexandrite laser, a Ti: sapphire laser, a $Y_2O_3$ laser, and the like. As the solid-state laser, there is applied a laser that uses a crystal such as YAG, $YVO_4$, YLF, $YAlO_3$, or the like doped with Cr, Nd, Er, Ho, Ce, Co, Ti, Yb, or Tm. The fundamental wave of the laser differs depending on a material to be doped and there is obtained a laser light having a fundamental wave in the neighborhood of 1 $\mu$m. It is possible to obtain a harmonic wave with respect to the fundamental wave using a nonlinear optical element.

Also, it is further possible to use an ultraviolet laser light obtained by converting an infrared laser light emitted from a solid-state laser into a green laser light using a nonlinear optical element and by further processing the green laser light using another nonlinear optical element.

It should be noted that the laser apparatus of the present invention may include another means for controlling the temperature of the object to be processed in addition to the above-mentioned four means.

Also, the laser apparatus 100 of the present invention includes an optical system 103 that corresponds to a third means that is capable of having beam spots of laser lights oscillated from the laser oscillation apparatus 102 on the object to be processed.

The shapes of the laser spots of laser lights oscillated from the laser oscillation apparatus 102 on the object 107 to be processed differ depending on the kind of the laser and it is possible to shape the beam spots with an optical system. For instance, the laser light emitted from the XeCl excimer laser (whose wavelength is 308 nm and pulse-width is 30 ns) L3308 manufactured by Lambda Physik AG has a rectangular shape whose size is 10 mm×30 mm (both of which are the half-value width in a beam profile). Also, the laser light emitted from the YAG laser has a circular shape if a rod has a cylindrical shape, and has a rectangular shape if the rod has a slab shape. Also, by further shaping such a laser light with an optical system, it is possible to form a laser light having a desired size.

When a plurality of laser oscillation apparatus is used, the beam spots emitted from the respective laser oscillation apparatuses may be superpositioned on each other to form a single beam spot by using the optical system.

The laser apparatus 100 of the present invention further includes a CPU 104 that corresponds to a fourth means. The CPU 104 is capable of controlling the oscillation by the laser oscillation apparatuses 102 and also controlling the stage controller 101 corresponding to the first means so that the beam spots of the laser lights cover positions determined in accordance with data concerning masks.

Figure 2A:
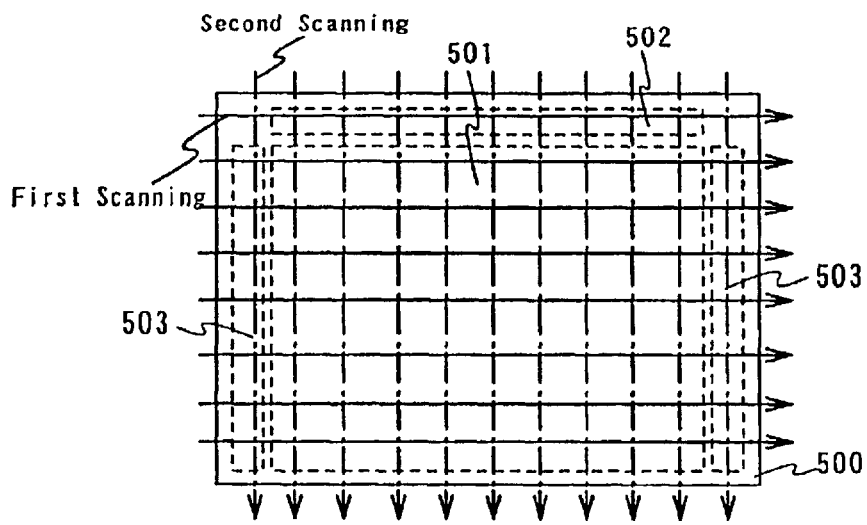
FIGS. 2A, 2B and 2C are views showing a direction in which a laser beam moves on an object to be processed.

Referring to FIG. 2A, description is made on scanning directions of the laser light when a semiconductor film 500 which is formed to manufacture an active matrix type semiconductor apparatus is scanned with the laser light. In FIG. 2A, a broken line 501 corresponds to a portion in which there is formed a pixel portion, a broken line 502 corresponds to a portion in which there is formed a signal line driving circuit, and a broken line 503 corresponds to a portion in which there is formed a scanning line driving circuit.

In FIG. 2A, an arrow indicates a scanning direction of the laser light. In the present invention, the semiconductor film is irradiated with two laser lights of different scanning directions, an arrow shown by a solid line indicating the scanning direction of the first laser light, an arrow shown by a broken line indicating the scanning direction of the second laser light as shown in FIG. 2A. An active layer is formed at an intersection of the first laser light and the second laser light.

Although FIG. 2A shows that the scanning direction of the first laser light intersects the scanning direction of the second laser light substantially at an angle of 90°, the intersection angle is not limited to this.

Figure 2B:
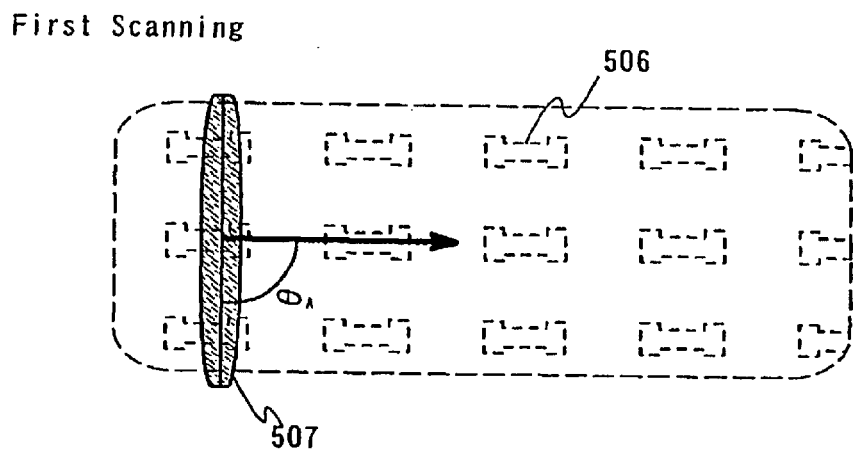
Figure 2C:
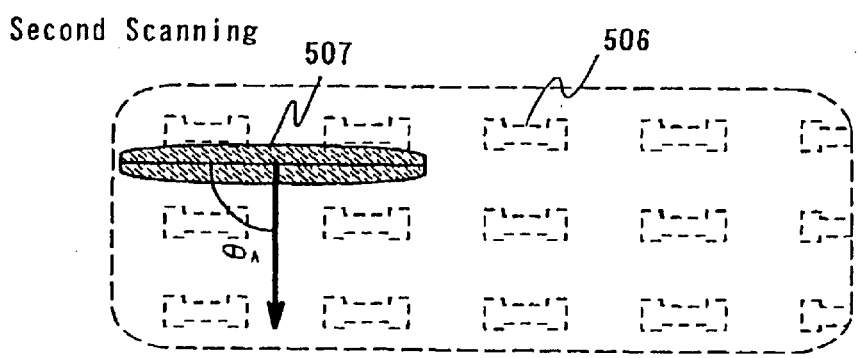

FIG. 2B is an enlarged view showing a beam spot 507 of the first scanning. Further, FIG. 2C is an enlarged view showing the beam spot 507 of the second scanning. In the present invention, a center axis of the beam spot may be orthogonal to the scanning direction or may not (specifically, an acute angel $\theta_A$ between the center axis of the beam spot and the scanning direction is in the range of 45°±35° or more preferably at 45°). In a case where the center axis of the beam spot is orthogonal to the scanning direction, the substrate may be processed at the highest efficiency. On the other hand, if the scanning is performed in a scanning direction at an angle of 45°±35° or more preferably at 45° relative to the center axis of the synthesized beam spot, the resultant active layer contains a greater number of crystal grains than the case where the scanning is performed in a scanning direction orthogonal to the center axis of the beam spot. Thus, the active layer is reduced in characteristic variations associated with crystal orientations or crystal grains.

In addition, the energy densities of the laser lights in edge portions of the beam spots are lower than those in other portions, and there is a case where it is impossible to uniformly perform the processing of the object to be processed. Consequently, it is preferable that the laser lights are irradiated so that there is prevented a situation where each portion 506 corresponding to an island-like semiconductor film obtained by patterning the semiconductor film after crystallization overlaps the edges of the paths of the laser lights.

Figure 3A:
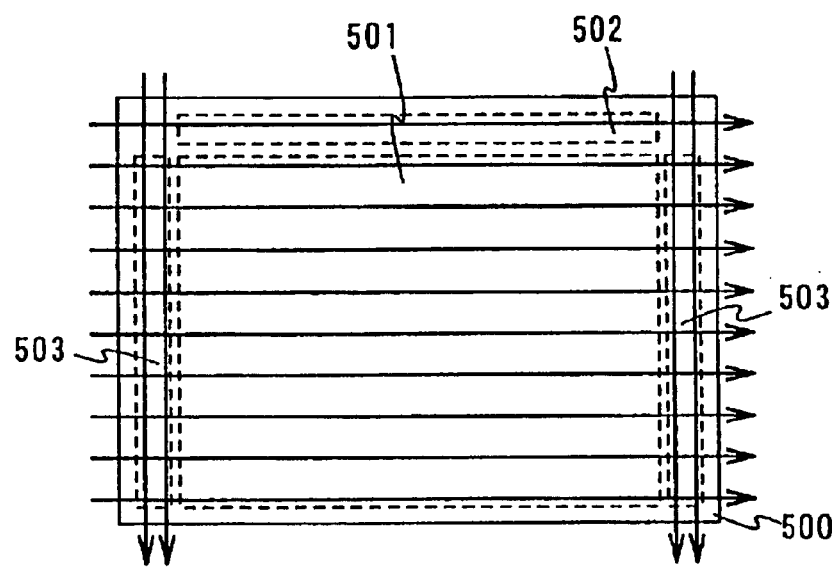
FIGS. 3A and 3B are views showing a direction in which a laser beam moves on an object to be processed.
Figure 3B:
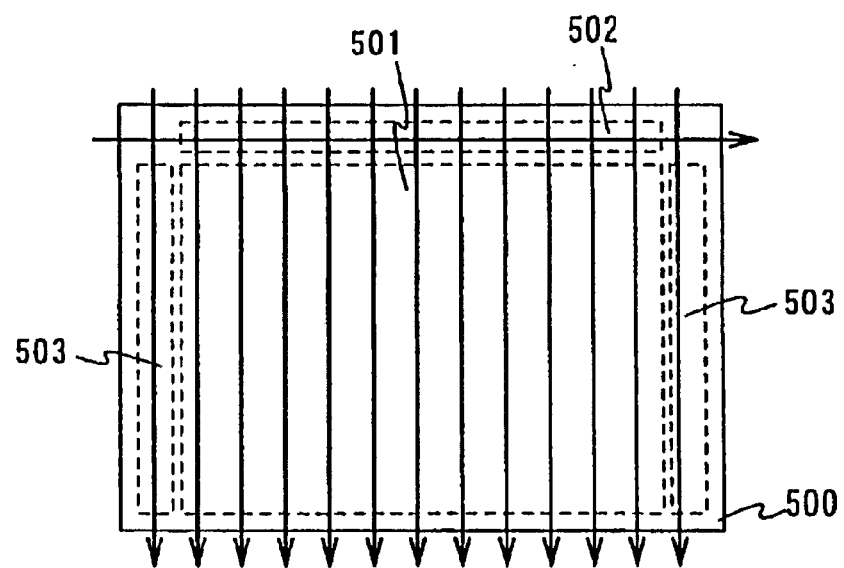

It should be note that although FIG. 2A shows that the pixel portion 501, the signal line driving circuit 502 and the scanning line driving circuit 503 are all scanned twice with the laser light, the configuration of the invention is not limited to this. FIG. 3A shows a case where the scanning line driving circuit 503 is irradiated with laser light twice. In this case, an active layer is formed in an area where laser light is irradiated twice in the scanning line driving circuit 503. Further, FIG. 3B shows a case where the signal line driving circuit 502 is irradiated with laser light twice. In this case, an active layer is formed in an area where the laser light is irradiated twice in the signal line driving circuit 502. Furthermore, an active layer is formed in an area where laser light is irradiated at one time at the pixel portion 501 and the scanning line driving circuit 503. Incidentally, it is possible to irradiate the laser light twice only to the pixel portion depending on the arrangement of the signal line driving circuit and the scanning line driving circuit. Further, it is also possible to irradiate the laser light twice to any two of the pixel electrode, the signal line driving circuit and the scanning line driving circuit.

Also, with the present invention, each portion to be scanned with the first laser light and the second laser light is determined in accordance with a mask for patterning the semiconductor film inputted into the CPU 104. Note that the portion to be scanned with the laser lights is set so as to cover a portion of the semiconductor film to be obtained through patterning after crystallization. The CPU 104 determines the portion to be scanned with the laser lights so that at least each portion of the semiconductor film to be obtained by performing patterning can be crystallized, and controls the stage controller 101 corresponding to the first means so that beam spots, that is, irradiation positions strike the portion to be scanned. In this manner, the semiconductor film is partially crystallized.

Figure 4A:
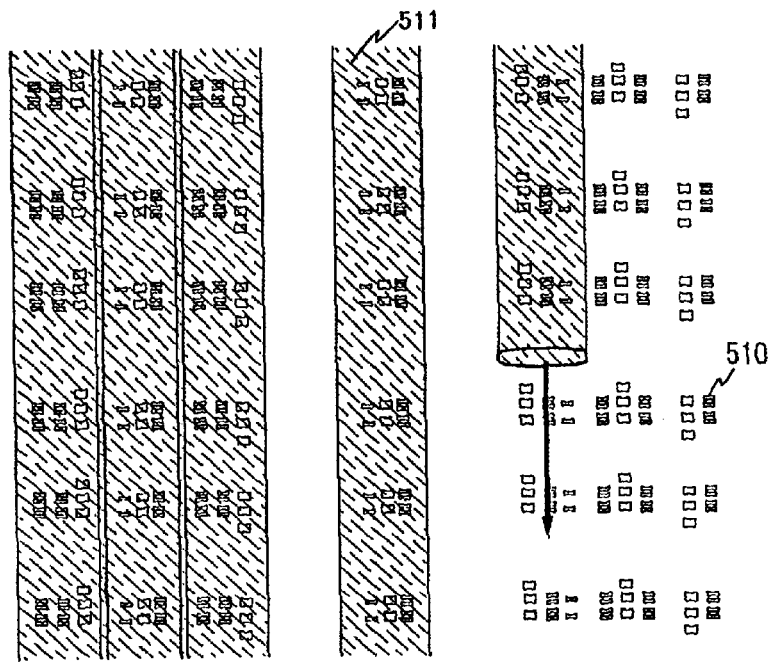
FIGS. 4A and 4B are views showing a moving direction of a laser beam on an object to be processed.

FIG. 4A shows a relation between each portion to be scanned with the laser lights and a mask. Note that the center axis of the beam spots extends almost perpendicular to the scanning direction in FIG. 4A. Reference numeral 510 denotes island-like semiconductor films of the semiconductor film to be obtained by performing patterning, and each portion to be scanned with the laser lights is determined so as to cover these island-like semiconductor films 510. Reference numeral 511 indicates the portions to be scanned with the laser lights that cover the island-like semiconductor films 510. As shown in FIG. 4A, with the present invention, the first laser lights are not irradiated onto the entire surface of the semiconductor film but are scanned so that at least each indispensable portion is crystallized.

Figure 4B:
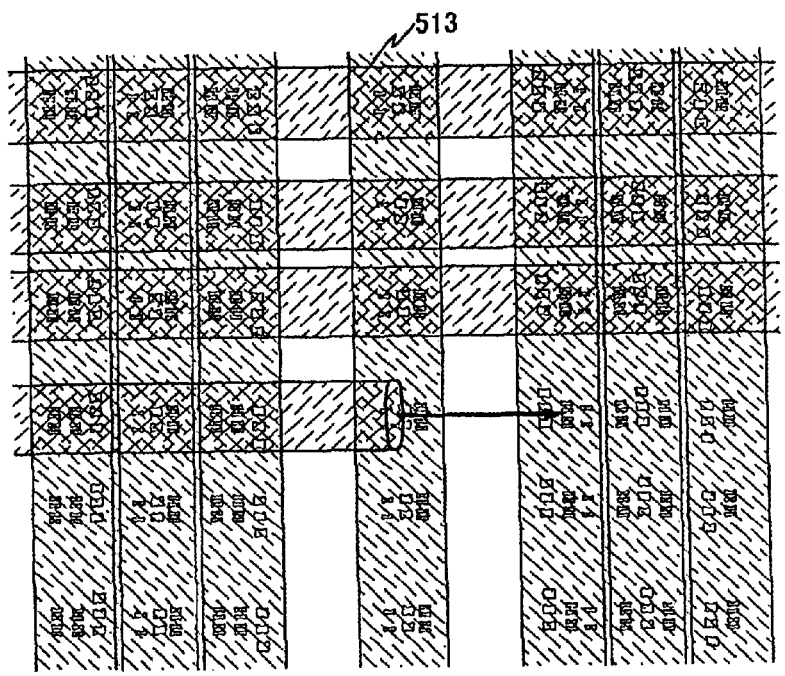

Next, FIG. 4B shows a relation between an area to be scanned with the laser light and a mask when a second laser is irradiated to the semiconductor film shown in FIG. 4A. In FIG. 4B, the scanning direction of the second laser light and that of the first laser light have a difference of 90° therebetween. An area to be scanned with the second laser light is also defined in a manner to cover a portion 510, which becomes an island-like semiconductor film. Reference numeral 513 denotes the area to be scanned with the second laser light, the area covering the island-like semiconductor film 510. As shown in FIG. 4B, the invention is arranged such that the overall surface of the semiconductor film is not irradiated with the second laser light but at least the minimum prerequisite area for crystallization is scanned with the laser light.

Thus, the area to be an island-like semiconductor layer 510 is further enhanced in the crystallinity thereof because it is subjected to the two laser irradiation processes of different scanning directions. In addition, a processing time for one substrate can be decreased because the laser light is irradiated exclusively on the minimum prerequisite area for crystallization that is defined by the mask on the semiconductor film, rather than on the overall surface of the substrate. Thus, the processing efficiency for substrate is increased.

Figure 5A:
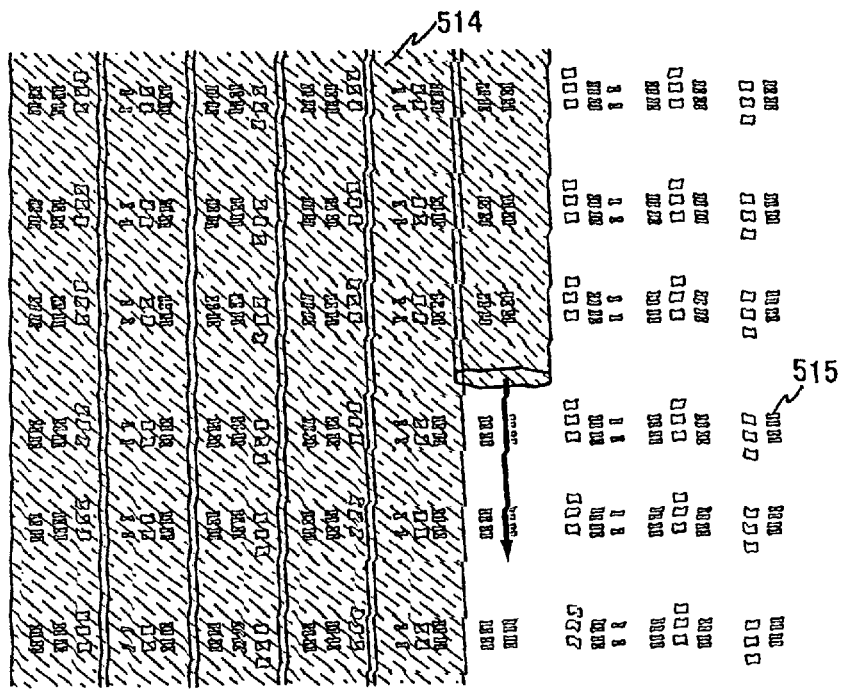
FIGS. 5A and 5B are views showing a moving direction of a laser beam on an object to be processed.
Figure 5B:
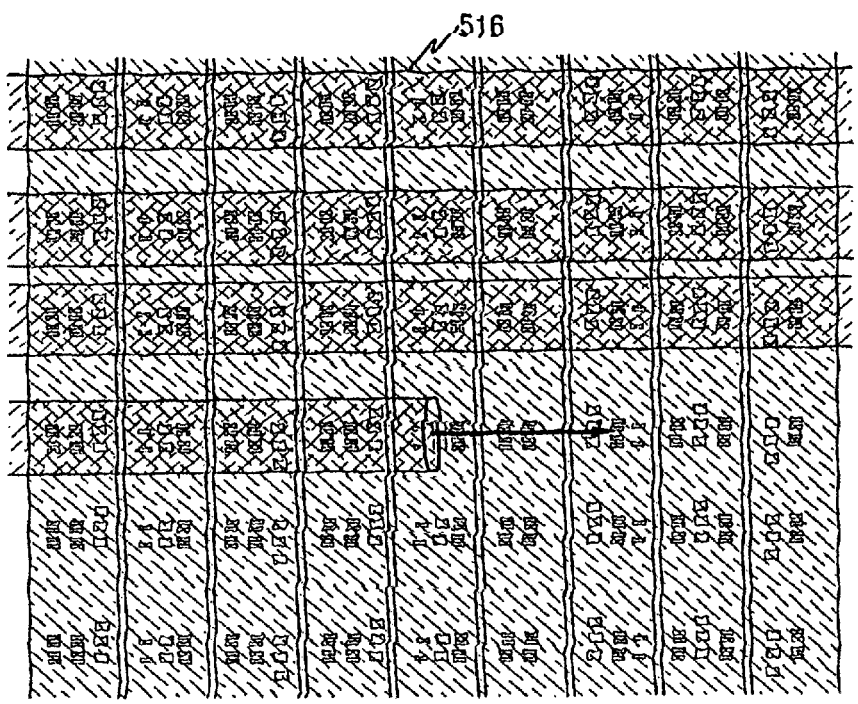

It is noted that FIGS. 4A and 4B illustrate the examples where both the first and second laser lights are locally irradiated on the minimum prerequisite area for crystallization that is defined by the mask on the semiconductor film, rather than irradiated on the overall surface of the semiconductor film. However, the invention is not limited to this arrangement and an alternative arrangement may be made such that the first laser light is irradiated on the overall surface of the semiconductor film whereas the second laser light is locally irradiated. Conversely, the first laser light may be locally irradiated whereas the second laser light may be irradiated on the overall surface of the substrate. FIG. 5A shows a state where the first laser light is irradiated on the overall surface of a semiconductor film, whereas FIG. 5B shows a state where the second laser light is irradiated on the semiconductor film as shown in FIG. 5A. A reference numeral 514 denotes an area to be scanned with the first laser light, the area covering the overall surface of the semiconductor film. A reference numeral 515 denotes an island-like semiconductor film obtained by patterning the semiconductor film. The island-like semiconductor film is so located as not to be overlapped by an edge of a scanning path of the first laser light. A reference numeral 516 denotes an area to be scanned with the second laser light, the area covering the island-like semiconductor film 515 obtained by patterning. The second laser light is not irradiated on the overall surface of the semiconductor film but is locally irradiated for applying the laser light to at least the island-like semiconductor film 515.

In a case where a crystallized semiconductor film is used as an active layer of a TFT, it is desirable that a scanning direction in either one of the two laser irradiation processes is defined to be in parallel with the direction of carrier movement in a channel forming region.

Figure 6A:
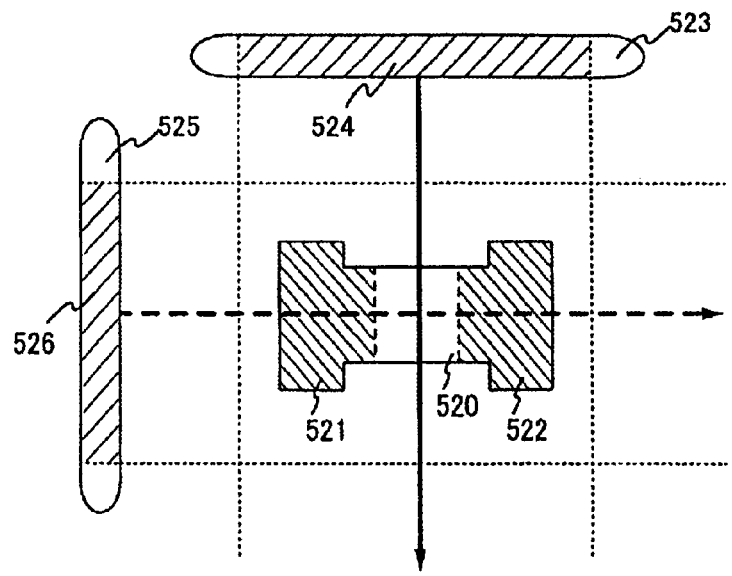
FIGS. 6A and 6B are views showing a moving direction of a laser beam on an active layer in a TFT.
Figure 6B:
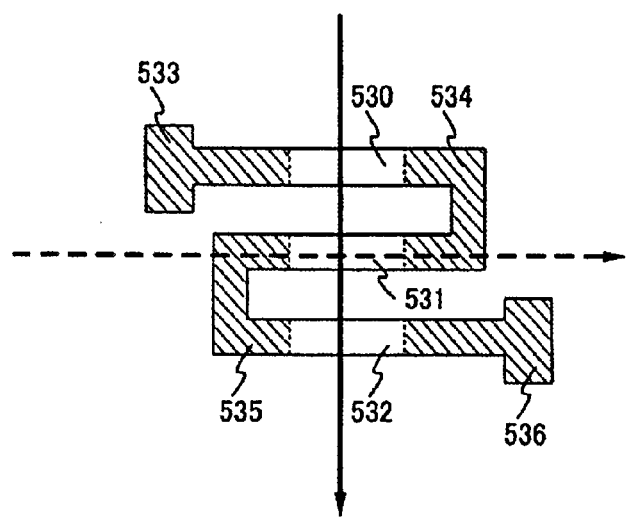

FIGS. 6A and 6B show examples of the active layer of the TFT. FIG. 6A illustrates an active layer including a single channel forming region and having a structure wherein a channel forming region 520 is sandwiched between impurity regions 521, 522 forming a source region and a drain region. When the semiconductor film is crystallized by means of the laser apparatus of the present invention, a scanning direction of the first or second laser light is defined to be in parallel with the direction of carrier movement in the channel forming region, as indicated by an arrow in the figure.

Reference numeral 523 denotes a beam spot of the first laser light which is scanned along a direction indicated by an arrow of solid line in the figure. A hatched area 524 of the beam spot 523 has a sufficient energy density for achieving favorable crystals. The crystallinity of the active layer may be further enhanced by applying the hatched area 524 of the laser light to the whole active layer.

A reference numeral 525 denotes a beam spot of the second laser light which is scanned along a direction indicated by an arrow of broken line in the figure. A scanning direction of the second laser light is different from that of the first laser light as shown in FIG. 6A. A hatched area 526 of the beam spot 525 has a sufficient energy density for achieving favorable crystals. The crystallinity of the active layer may be further enhanced by applying the hatched area 526 of the laser light to the whole active layer.

FIG. 6B illustrates the active layer including three channel forming regions and having a structure wherein a channel forming region 530 is sandwiched between impurity regions 533, 534. In the active layer, another channel forming region 531 is sandwiched between impurity regions 534, 535, and still another channel forming region 532 is sandwiched between impurity regions 535, 536. When the semiconductor film is crystallized by using the laser apparatus of the present invention, the first laser light is scanned along a direction of an arrow indicated by solid line in the figure. The scanning direction of the second laser light is defined to be in parallel with the direction of carrier movement in the channel forming regions as shown in an arrow indicated by broken line.

Although either the first or second laser irradiation process may be arranged such that the scanning direction of the laser light is in parallel with the direction of carrier movement, it is more preferred that the direction is matched with the laser light having the greater energy density because a direction of crystal growth is more influenced by the laser light having the greater energy density.

Figure 30:
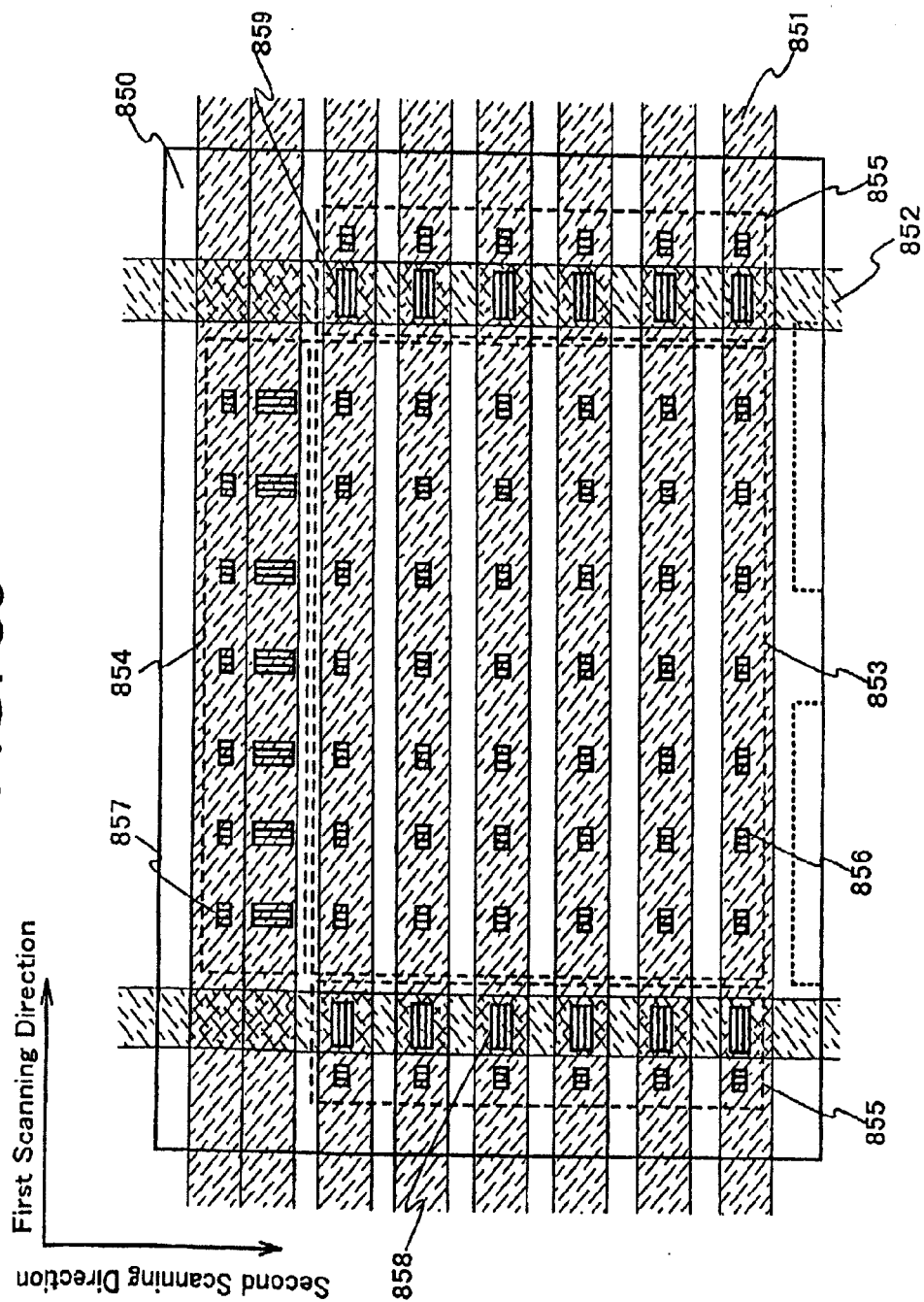
FIG. 30 is a view showing a direction in which a laser beam moves on an object to be processed.

Now, referring to FIG. 30, description is made on a relation between scanning directions of the laser lights on a semiconductor film formed for fabricating an active matrix type semiconductor device and a layout of active layers of circuits.

FIG. 30 shows a semiconductor film 850 formed on a substrate. An area surrounded by a broken line 853 forms a pixel portion, the pixel portion 853 including a plurality of portions 856 forming active layers. An area surrounded by a broken line 854 forms a signal line drive circuit, the signal line drive circuit 854 including a portion 857 forming a plurality of active layers. An area enclosed by a broken line 855 forms a scanning line drive circuit, the scanning line drive circuit 855 including a portion 858 forming a plurality of active layers.

It is noted that the individual portions 856, 857, 858 to be active layers included in the respective circuits are actually of a small size on the order of dozens of $\mu$m. However, FIG. 30 shows these portions in a larger size than the true size in the interest of clarity. The portions 856, 857, 858 to be the active layers of the respective circuits are laid out in a manner that the directions of carrier movements in the channel forming regions are generally divided into two groups (a first direction and a second direction).

Reference numeral 851 denotes an area to be crystallized by the first laser irradiation, the area covering all the portions 856, 857, 858 forming the active layers. A scanning direction of the first laser light is defined to be in parallel with the first direction.

A reference numeral 852 denotes an area to be crystallized by the second laser light. A scanning direction of the second laser light is different from that of the first laser light, extending in parallel with the second direction. The second laser light does not cover all of the portions 856, 857, 858 forming the active layers but selectively covers the active layers wherein the carriers in the channel forming regions move in parallel with the second direction. In FIG. 30, the second laser light is irradiated exclusively on those of the plural active layers 858 that the carriers in the channel forming regions move in parallel with the scanning direction of the second laser light.

Figure 7A:
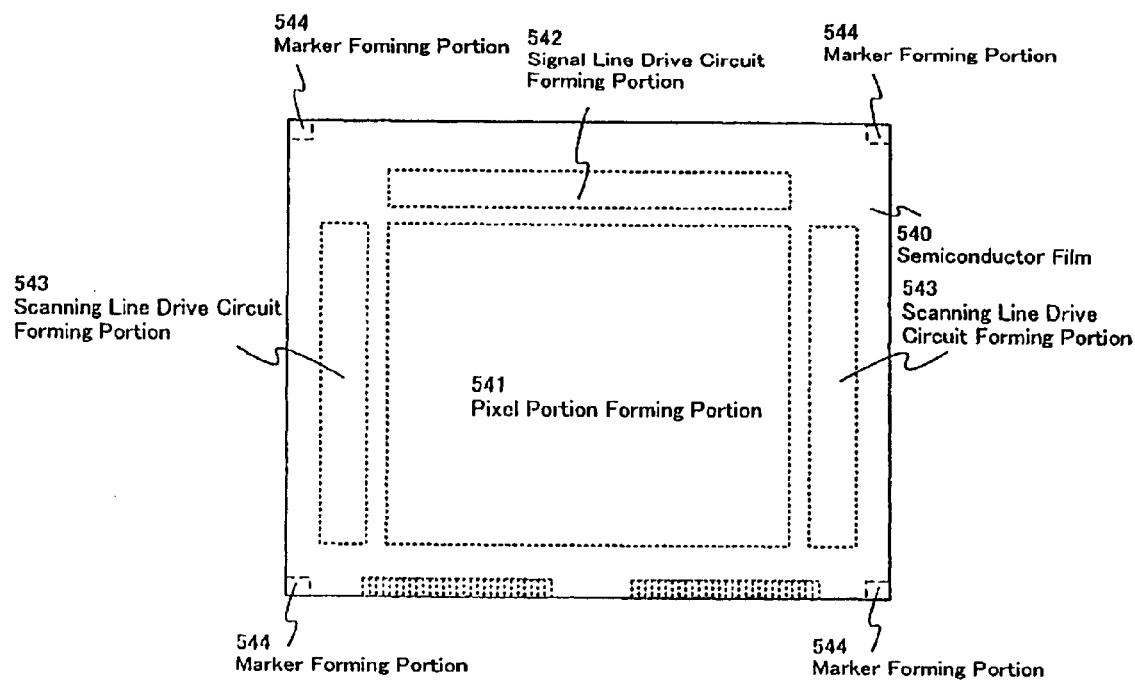
FIGS. 7A and 7B are views showing the positions of markers.
Figure 7B:
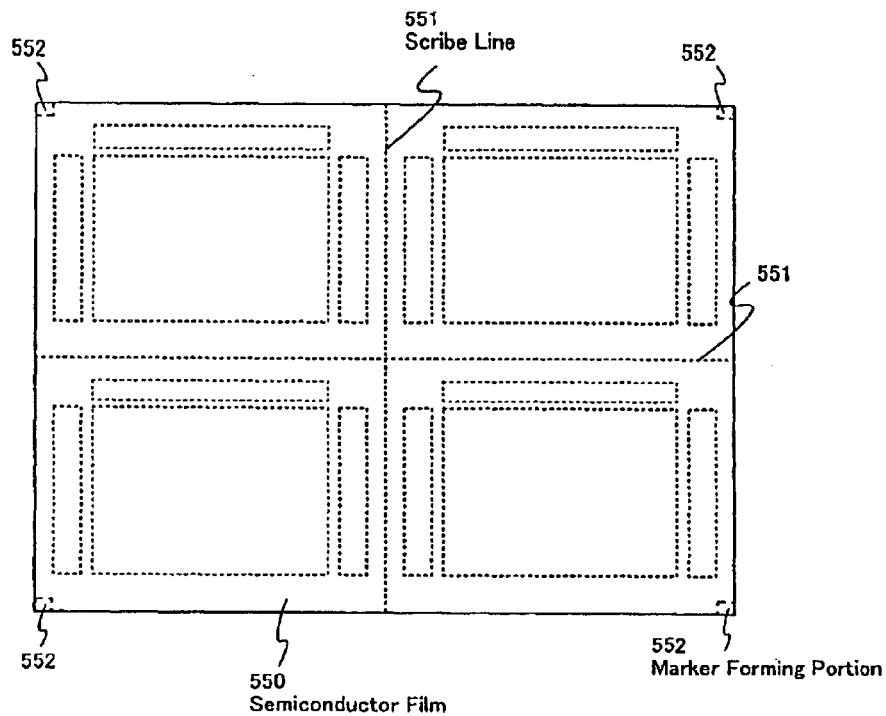

In order to define the area to be scanned by the laser light, a marker used for positioning the mask relative to a semiconductor film need be formed on the semiconductor film. FIGS. 7A and 7B show positions for forming a marker on a semiconductor film formed for the fabrication of an active matrix type semiconductor device. FIG. 7A illustrates an example where a single semiconductor device is formed on a single substrate, whereas FIG. 7B illustrates an example where four semiconductor devices are formed on a single substrate.

Referring to FIG. 7A, reference numeral 540 denotes a semiconductor film formed on a substrate. A broken line 541 defines a pixel portion, a broken line 542 defining a signal line drive circuit, a broken line 543 defining a scanning line drive circuit. Reference numeral 544 denotes a portion where a marker is formed (marker forming portion). The marker forming portions are provided at four corners of the semiconductor film.

Although FIG. 7A shows the four marker forming portions 544 disposed at the four corners, the invention is not limited to this arrangement. The position or number of the marker forming portion is not limited to the above mode, so long as the marker forming portion provides for the alignment between the area of the semiconductor film that is to be scanned with the laser light and the patterning mask on the semiconductor film.

Referring to FIG. 7B, a reference numeral 550 denotes a semiconductor film formed on a substrate. A broken line 551 represents a scribe line along which the substrate is divided in the subsequent step. According to FIG. 7B, four semiconductor devices can be obtained by dividing the substrate along the scribe lines 551. It is noted that the number of semiconductor devices obtained by dividing the substrate is not limited to this.

A reference numeral 552 denotes a portion where the marker is formed (marker forming portion). The marker forming portions are disposed at four corners of the semiconductor film. Although FIG. 7B shows the four marker forming portions 552 disposed at the four corners of the semiconductor film, the invention is not limited to this arrangement. The position or number of the marker forming portion is not limited to the above mode, so long as the marker forming portion provides for the alignment between the area of the semiconductor film that is to be scanned with the laser light and the patterning mask on the semiconductor film.

A typical example of a laser used for forming the marker includes a YAG laser, $CO_2$ laser and the like. It goes without saying that other lasers may be used for forming the marker.

Next, description is made on a flow of a fabrication system of a semiconductor device using the laser apparatus of the present invention.

Figure 8:
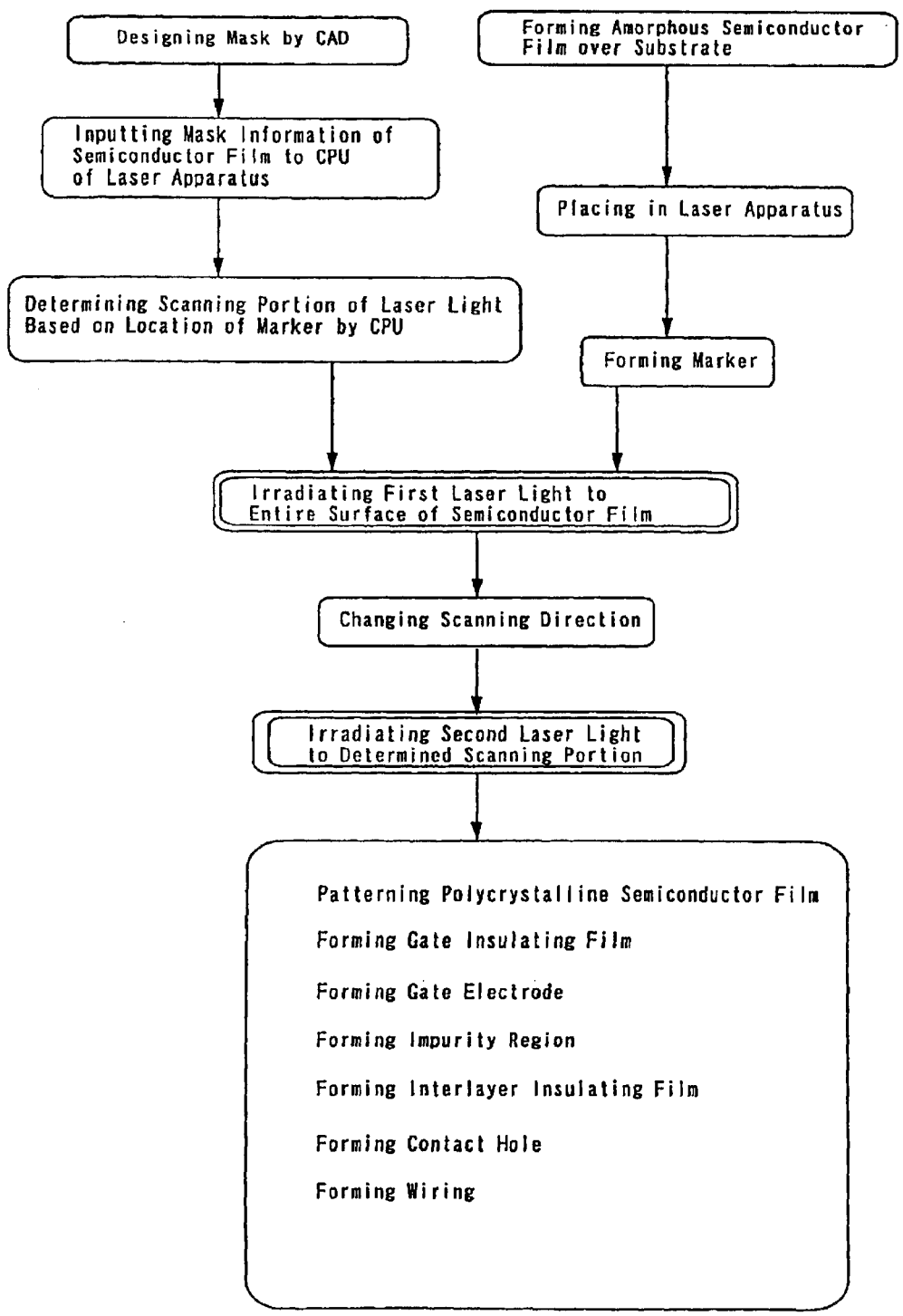
FIG. 8 is a flowchart detailing the flow of a production system of the invention.

FIG. 8 is a flow chart of a fabrication process of the present invention. First, a semiconductor device is designed by means of a CAD. Then, information indicative of a configuration of a patterning mask for the designed semiconductor film is inputted to a CPU of the laser apparatus.

On the other hand, an amorphous semiconductor film is formed on the substrate and then, the substrate formed with the amorphous semiconductor film is loaded in the laser irradiation equipment. A marker is formed on a surface of the semiconductor film by means of a laser.

Based on the mask information inputted to the CPU, areas to be scanned with the first and the second laser lights are determined with reference to the position of the marker. It is noted that the area to be scanned with the second laser light may vary depending upon an angle between the scanning direction of the first laser light and that of the second laser light. The angle between the scanning directions of the first and second laser lights may previously be stored in the memory or the like. Otherwise, the angle may be manually inputted as needed. With reference to the marker, the first laser light is irradiated on the area to be scanned for local crystallization of the semiconductor film.

Next, the first means is used to change the scanning direction of the laser light by a determined value before the second laser irradiation process is performed for locally crystallizing the semiconductor film.

After the irradiation with the laser light, the polycrystalline semiconductor film formed by the laser irradiation is patterned and etched, thereby to obtain island-like semiconductor films. Subsequently, steps for forming TFTs from the island-like semiconductor films are performed. Specific steps for forming the TFTs may vary depending upon the configurations thereof, but may typically include the steps of forming a gate insulating film for forming impurity regions on the island-like semiconductor films; forming an interlayer insulating film in a manner to cover the gate insulating film and gate electrodes; forming contact holes in the interlayer insulating film for partially exposing the impurity regions; and forming a wiring on the interlayer insulating film in a manner to establish contact with the impurity regions via the contact holes.

Figure 9:
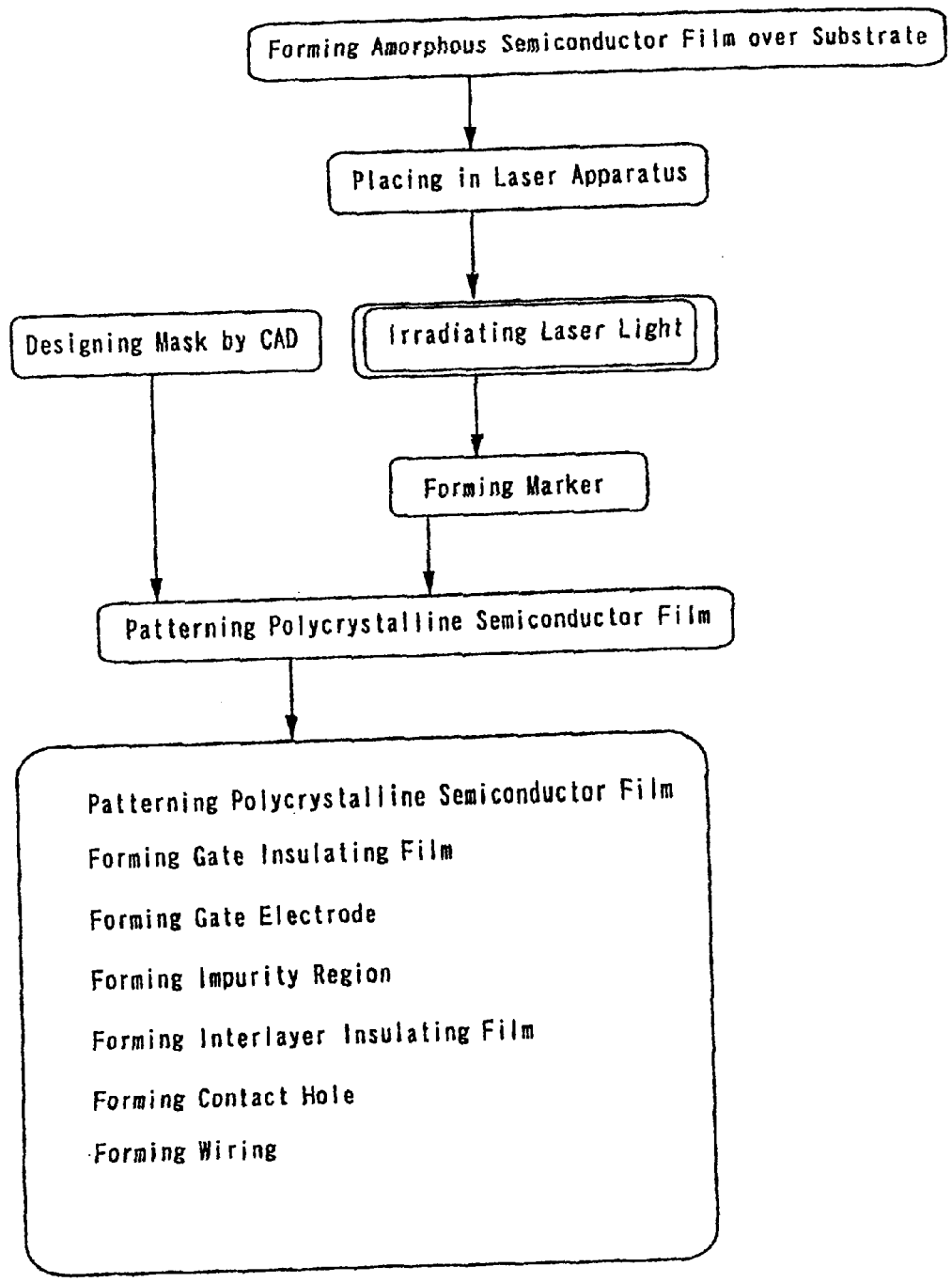
FIG. 9 is a flowchart detailing the flow of a conventional production system.

For comparison purpose, FIG. 9 shows a flow of the conventional fabrication process for semiconductor device. As shown in FIG. 9, a mask for a semiconductor device is designed by means of a CAD. On the other hand, an amorphous semiconductor film is formed on the substrate and then, the substrate formed with the amorphous semiconductor film is loaded in the laser irradiation equipment. Subsequently, the laser light is scanned for laser irradiation on the overall surface of the amorphous semiconductor film thereby crystallizing the whole amorphous semiconductor film. A marker is formed on the polycrystalline semiconductor film thus crystallized, which is patterned with reference to the marker for forming island-like semiconductor films. Then, TFTs are fabricated using the island-like semiconductor films.

In contrast to the conventional fabrication process shown in FIG. 9, the fabrication system of the present invention is arranged such that the marker is formed before the amorphous semiconductor film is crystallized by means of the laser light. Subsequently, the semiconductor film is scanned with the laser light based on the information on the patterning mask for the semiconductor film.

The above arrangement obviates the time spent for irradiating the laser light on a portion to be removed by patterning after the crystallization of the semiconductor film, thus reducing the time required for the laser irradiation as well as increasing the processing speed for the substrate.

Figure 10:
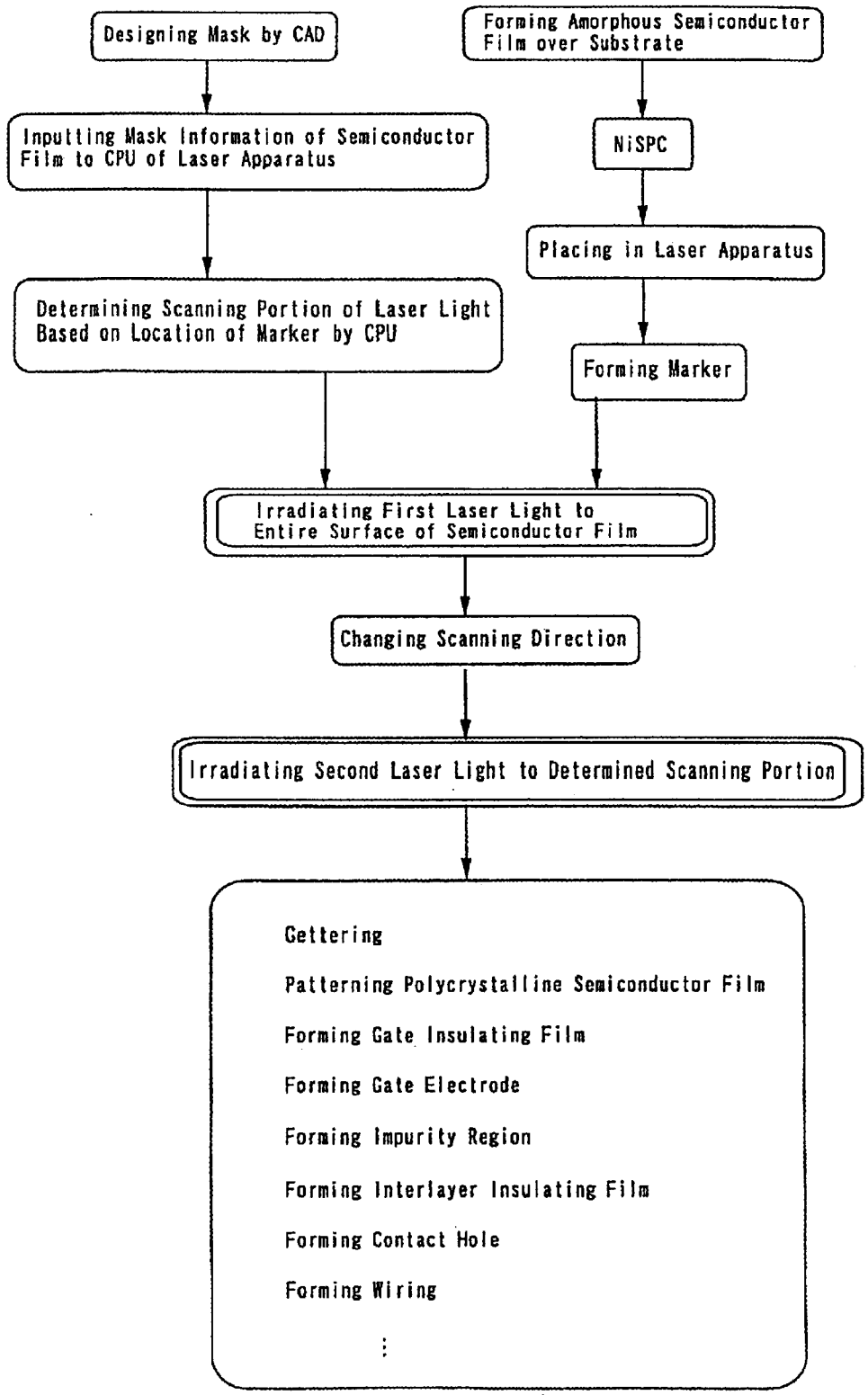
FIG. 10 is a flowchart detailing the flow of a production system of the invention.

It should be noted that referring to FIG. 10, description is made on a flow chart of the fabrication process of the present invention when the fabrication process may include a step of crystallizing the semiconductor film using a catalyst. In a case where a catalyst element is used, techniques disclosed in Japanese Patent Application Laid-open No. Hei 7-130652 and Japanese Patent Application Laid-open No. Hei 8-78329 may preferably be used.

FIG. 10 differs from FIG. 8 in that FIG. 10 includes a step (NiSPC) for crystallizing an amorphous semiconductor film using Ni after the formation of this film. In the case where there is used the technique disclosed in Japanese Patent Application Laid-open No. Hei 7-130652, for instance, a nickel-containing layer is formed by applying a nickel acetate solution containing 10 ppm nickel on a weight basis onto the amorphous semiconductor film. Then, after a dehydrogenation step is performed for one hour at 500° C., crystallization is performed by performing heat treatment for 4 to 12 hours at 500 to 650° C., for 8 hours at 550° C., for instance. Note that as to a usable catalytic element, an element such as germanium (Ge), iron (Fe), palladium (Pd), tin (Sn), lead (Pd), cobalt (Co), platinum (Pt), copper (Cu), or gold (Au) may be used in addition to nickel (Ni).

Subsequently, the laser light is irradiated twice on the semiconductor film thereby further enhancing the crystallinity of the semiconductor film crystallized with NiSPC in FIG. 10. The polycrystalline semiconductor film formed by the laser irradiation contains the catalyst element and hence, the laser irradiation is followed by a step (gettering) for removing the catalyst element from the crystalline semiconductor film. A technique disclosed in Japanese Application Laid-open No. Hei 10-135468 or Japanese Application Laid-open No. Hei 10-135469 may be used for the gettering.

Specifically, the gettering process includes the steps of implanting phosphorus into a part of the polycrystalline semiconductor film formed by laser irradiation, and heat treating the semiconductor film at 550 to 800° C. for 5 to 24 hours, for example 600° C. for 12 hours, in a nitrogen atmosphere. A region of the polycrystalline semiconductor film that is doped with phosphorus acts as a gettering site, in which phosphorus present in the polycrystalline semiconductor film can be segregated. Subsequently, the region added with phosphorus is removed from the polycrystalline semiconductor film by patterning, thereby forming island-like semiconductor films reduced in the concentrations of the catalyst element to $1 \times 10^{17}$ atoms/cm$^3$ or less or preferably to about $1 \times 10^{16}$ atoms/cm$^3$.

Thus, the invention is arranged such that the overall surface of the semiconductor film is not irradiated with the laser light by scanning but at least the minimum prerequisite area thereof is scanned with the laser light for crystallization. The above arrangement obviates the time spent for irradiating the laser light on the area to be removed by patterning after the crystallization of the semiconductor film, thus achieving a remarkable reduction of processing time per substrate.

EXAMPLES

The following description will describe examples of the invention.

Example 1

A crystalline semiconductor film formed through irradiation of a laser beam is composed of a plurality of crystal grains gathered together. The positions and the sizes of these crystal grains are random, and it is difficult to form a crystalline semiconductor film by specifying the positions and the sizes of the crystal grains. For this reason, an interface between crystal grains (grain boundary) may be present in an active layer formed by patterning the crystalline semiconductor film into an insular shape.

Different from the interior of the crystal grains, a myriad of recombination centers and trapping centers due to the amorphous structure and crystal defects are present at the grain boundary. It is known that when carriers are trapped in the trapping centers, the potential of the grain boundary rises, which erects a barrier with respect to the carriers and thereby deteriorates the current transport characteristic of the carriers. In a case where the grain boundary is present in the active layer of the TFT, particularly, in the channel forming region, the mobility of the TFT is reduced markedly or an off current is increased because of the current flowing in the grain boundary, which strongly influences the characteristic of the TFT. Also, the absence or presence of the grain boundary in the active layer causes the characteristic to vary from TFT to TFT, a plurality of which is manufactured on the condition that each attains the identical characteristic.

The reason why the positions and the sizes of the crystal grains become random when obtained through irradiation of a laser beam to the semiconductor film is as follows. That is, it takes a certain time for solid-phase nucleuses to be formed in a liquid semiconductor film completely melted through irradiation of a laser beam. The formation of a myriad of crystal nucleuses starts to occur over time in the completely melted region, and crystals are grown from the respective crystal nucleuses. Because the crystal nucleuses are formed at random positions, the distribution of the crystal nucleuses is non-uniform. The crystal growth ends when the respective crystal grains collide with one another, and the positions and the sizes of the crystal grains thus become random.

On the other hand, there has been proposed a method of forming a crystalline semiconductor film by melting a semiconductor film not entirely but partially. In this case, a portion where the semiconductor film is completely melted and a portion where the solid-phase semiconductor regions remain are formed through irradiation of a laser beam, and crystals are grown from the solid-phase semiconductor regions used as the crystal nucleuses. Because it takes a certain time until the formation of nucleuses starts to occur in the completely melted region, crystals have been grown from the solid-phase semiconductor regions used as the crystal nucleuses in the horizontal direction (hereinafter, referred to as the lateral direction) with respect to the film surface of the semiconductor film by the time the formation of nucleuses starts to occur in the completely melted region. Hence, the crystal grains are grown tens times larger than the film thickness in length. Subsequently, crystallization starts to occur also in the completely melted region over time, and when these crystals collide with the crystals grown from the crystal nucleuses, the aforementioned crystal growth in the lateral direction ends. Hereinafter, this phenomenon is referred to as the superlateral growth.

In the case of the superlateral growth, relatively large crystal grains can be obtained. However, the energy region of a laser beam that can realize the superlateral growth is extremely narrow; moreover, it is difficult to control the positions where large crystal grains are obtained. Further, regions other than the large crystal grains are fine crystal regions where a myriad of nucleuses have been formed or amorphous regions, which makes the sizes of the crystals random.

Hence, it is expected that the growing positions and the growing directions of crystal grains can be controlled if it becomes possible to use a laser beam in an energy region such that can completely melt the semiconductor film and to control the temperature gradient in the lateral direction. Accordingly, many attempts have been made to achieve such a method.

For example, James S. Im et al. of Columbia University presented the Sequential Lateral Solidification method (hereinafter, referred to as the SLS method) that allows the superlateral growth to take place at an arbitrary position. The SLS method is a method of enabling crystallization by shifting a slit-like mask for each shot by a distance (approximately 0.75 µm) nearly as far as the superlateral growth can be achieved.

In the present example, the SLS method will be explained in a case where it is applied to the invention.

Initially, a laser beam is irradiated to the semiconductor film in first irradiation. A laser beam is irradiated only to a portion defined by a mask in the first irradiation. The energy density of a laser beam in the first irradiation varies with the film thickness of the semiconductor film or the like, and the energy density high enough to enhance the crystalline characteristics at the portion defined by the mask is sufficient.

Then, the scanning direction is changed and a laser beam is irradiated to a portion defined by the mask in second irradiation. A laser beam emitted from a pulse-oscillating laser is used in the second irradiation, so that a laser beam is irradiated at the energy density such that melts the semiconductor film locally in the full thickness at the portion defined by the mask.

Figure 11A:
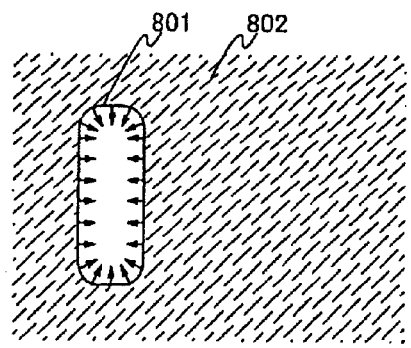
FIGS. 11A, 11B, 11C, 11D and 11E are views explaining the mechanism of crystallization through the SLS method.

FIG. 11(A) is a view schematically showing the state of the semiconductor film immediately after the first shot of a laser beam in the second irradiation is irradiated. A semiconductor film 802 corresponds to a portion where the crystalline characteristics have been enhanced through the first irradiation of a laser beam. Then, the semiconductor film is melted locally in the full thickness thereof through the second irradiation of a laser beam in the semiconductor film 802 at a portion where a beam spot 801 is impinged upon.

In this instance, the semiconductor film is melted completely in the semiconductor film 802 at the portion where the beam spot is impinged upon. However, at the portion where the beam spot is not impinged upon, the semiconductor film is not melted at all or melted at a temperature well below the temperature at the portion where the beam spot is impinged upon. Hence, the edge portion of the beam spot forms seed crystals, and the crystals are grown in the lateral direction toward the center from the edge portion of the beam spot as indicated by arrows.

Figure 11B:
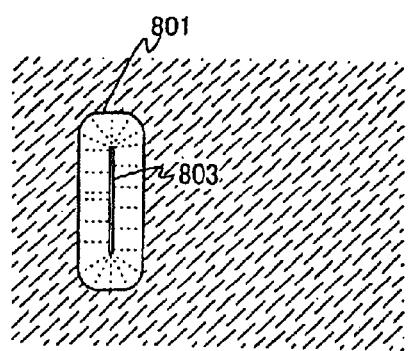

The crystals are grown further with time, and eventually collide with crystal grains grown from seed crystals formed in the completely melted portion or collide with crystal grains grown from the opposite side, whereupon the crystal growth ends at the central portion 803 of the beam spot. FIG. 11(B) is a view schematically showing the state of the semiconductor film when the crystal growth has ended. The surface of the semiconductor film is irregular at the central portion 803 of the beam spot because of the presence of more fine crystals than in the other portions or the collision among crystal grains.

Figure 11C:
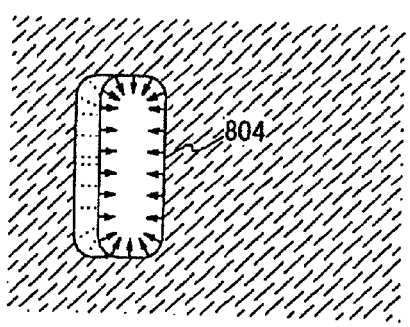

Then, a second shot of a laser beam in the second irradiation is irradiated. The second shot is shifted slightly from the beam spot of the first shot when irradiated. FIG. 11(C) is a view schematically showing the state of the semiconductor film immediately after the second shot is irradiated. The position of the beam spot of the second shot is shifted from the portion 801 where the beam spot of the first shot has been impinged upon. It should be noted that, in the case shown in FIG. 11(C), the beam spot of the second shot is shifted to the extent that it covers the central portion 803 formed by the first shot.

In this instance, the semiconductor film is completely melted at a portion where a beam spot 804 of the second shot is impinged upon. However, at the portion where the beam spot is not impinged upon, the semiconductor film is not melted at all or melted at a temperature well below the temperature at the portion where the beam spot is impinged upon. Hence, the edge portion of the beam spot forms seed crystals, and the crystals are grown in the lateral direction toward the center from the edge portion of the beam spot as indicated by arrows. In this instance, of the entire portion 801 crystallized by the first shot, a portion where the beam spot of the second shot is not impinged upon forms seed crystals, and crystals formed and grown in the lateral direction by the first shot are grown further in the scanning direction.

Figure 11D:
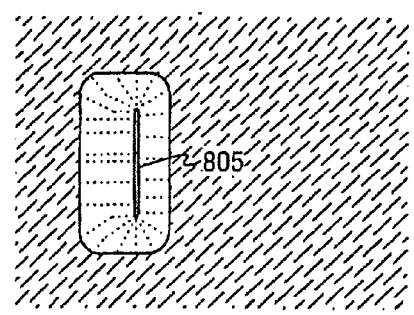

The crystals are grown further with time, and eventually collide with crystal grains grown from seed crystals formed in the completely melted portion or collide with crystal grains grown from the opposite side, whereupon the crystal growth ends at the central portion 805 of the beam spot of the second shot. FIG. 11(D) is a view schematically showing the state of the semiconductor film when the crystal growth has ended. The surface of the semiconductor film is irregular at the central portion 805 of the beam spot because of the presence of more fine crystals than in the other portions or the collision among the crystal grains.

Figure 11E:
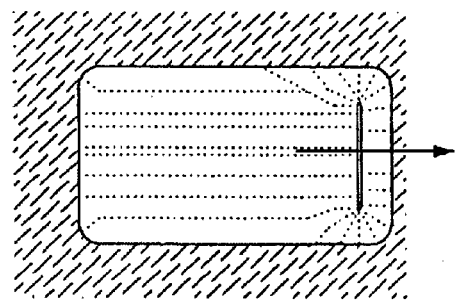

By irradiating a laser beam while slightly shifting the beam spot in the scanning direction in the same manner by a third shot and onwards, crystals are grown in parallel with the scanning direction as shown in FIG. 11(E).

According to the above arrangement, partial crystallization is enabled while the positions and sizes of the crystal grains are controlled.

Another example of the SLS method applied to the invention different from that shown in FIG. 11 will now be explained.

Initially, a laser beam is irradiated to the semiconductor film in first irradiation. A laser beam is irradiated only to a portion defined by a mask in the first irradiation. The energy density of a laser beam in the first irradiation varies with the film thickness of the semiconductor film or the like, and energy density high enough to enhance the crystalline characteristics at the portion defined by the mask is sufficient.

Then, the scanning direction is changed and a laser beam is irradiated in second irradiation to a portion defined by the mask. A laser beam emitted from a pulse-oscillating laser is used in the second irradiation, so that a laser beam is irradiated at the energy density such that melts the semiconductor film locally in the full thickness at the portion defined by the mask.

Figure 12A:
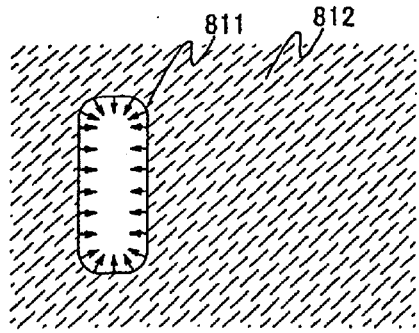
FIGS. 12A, 12B, 12C, 12D and 12E are views explaining the mechanism of crystallization through the SLS method.

FIG. 12(A) is a view schematically showing the state of the semiconductor film immediately after the first shot of a laser beam in the second irradiation is irradiated. A semiconductor film 812 corresponds to a portion where the crystalline characteristics have been enhanced through the first irradiation of a laser beam. Then, the semiconductor film is melted locally in the full thickness thereof through the second irradiation of a laser beam in the semiconductor film 812 at a portion where a beam spot 811 is impinged upon. Hence, the edge portion of the beam spot forms seed crystals, and the crystals are grown in the lateral direction toward the center from the edge portion of the beam spot as indicated by arrows.

Figure 12B:
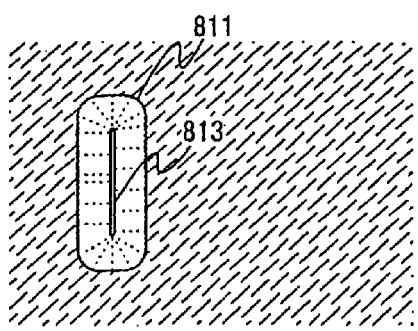

The crystals are grown further with time, and eventually collide with crystal grains grown from seed crystals formed in the completely melted portion or collide with crystal grains grown from the opposite side, whereupon the crystal growth ends at the central portion 813 of the beam spot. FIG. 12(B) is a view schematically showing the state of the semiconductor film when the crystal growth has ended. The surface of the semiconductor film is irregular at the central portion 813 of the beam spot because of the presence of more fine crystals than in the other portions or the collision among crystal grains.

Figure 12C:
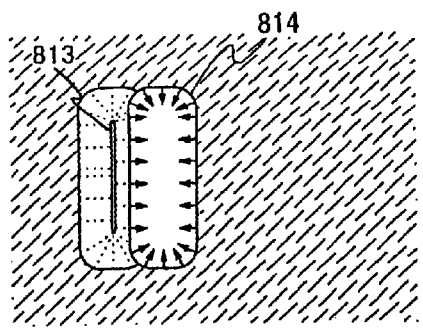

Then, a second shot of a laser beam in the second irradiation is irradiated. The second shot is shifted slightly from the beam spot of the first shot when irradiated. FIG. 12(C) is a view schematically showing the state of the semiconductor film immediately after the second shot is irradiated. The position of the beam spot of the second shot is shifted from the portion 811 where the beam spot of the first shot has been impinged upon. It should be noted that, in the case shown in FIG. 12(C), the beam spot of the second shot is shifted to the extent that it does not cover the central portion 813 formed by the first shot, but overlaps part of the portion where the beam spot of the first shot has been impinged upon.

Subsequently, the edge portion of the beam spot of the second shot forms seed crystals, and crystals are grown in the lateral direction toward the center from the edge portion of the beam spot as indicated by arrows. In this instance, of the entire portion 811 crystallized by the first shot, a portion where the beam spot of the second shot is not impinged upon forms seed crystals, and the crystals formed and grown in the lateral direction by the first shot are grown further in the scanning direction.

Figure 12D:
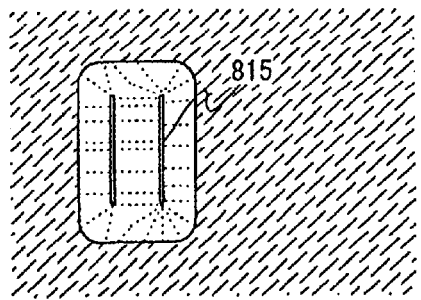

The crystals are grown further with time, and eventually collide with crystal grains grown from seed crystals formed in the completely melted portion or collide with crystal grains grown from the opposite side, whereupon the crystal growth ends at the central portion 815 of the beam spot of the second shot. FIG. 12(D) is a view schematically showing the state of the semiconductor film when the crystal growth has ended. The surface of the semiconductor film is irregular at the central portion 815 of the beam spot because of the presence of more fine crystals than in the other portions or the collision among crystal grains.

Figure 12E:
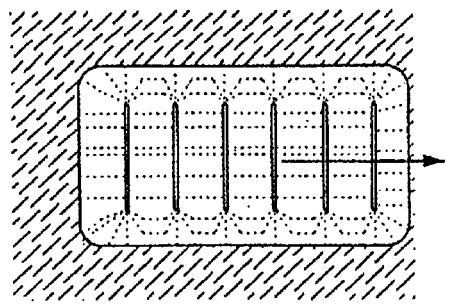

By irradiating a laser beam while slightly shifting the beam spot in the scanning direction in the same manner by a third shot and onwards, crystals are grown in parallel with the scanning direction as shown in FIG. 12(E). According to the above arrangement, partial crystallization is enabled while the positions and sizes of the crystal grains are controlled.

The central portions of the beam spots are left in the crystals obtained through the irradiation method shown in FIG. 12. Because the crystalline characteristics are poor at these central portions, it is preferable to lay out the channel forming region, or more preferably, the active layer to exclude the central portions.

When the active layer is laid out in such a manner that the growing direction of the crystal grains is parallel to the direction in which carriers move in the channel forming region in both the irradiation methods shown in FIG. 11 and FIG. 12, fewer grain boundaries are contained in the channel forming region. Consequently, the mobility is raised and the off current can be suppressed. On the contrary, when the active layer is laid out with an angle in such a manner that the direction in which the carriers move in the channel forming region is not parallel to the growing direction of the crystal grains, more grain boundaries are contained in the channel forming region. However, when a plurality of active layers are compared with one another, a ratio of differences in quantity of grain boundaries between the active layers with respect to the total grain boundaries contained in the channel forming regions in the respective active layers is lessened, and so is the variance of the mobility and the off current value of the manufactured TFTs.

In the present example, the SLS method is used for the second irradiation of a laser beam. It should be appreciated however, that the present example is not limited to the foregoing arrangement. For example, after the semiconductor film is crystallized through the SLS method in the first irradiation, a laser beam from a pulse-oscillating laser may be used for the second irradiation of a laser beam. Consequently, defects within the crystal grains formed through the first irradiation of a laser beam are eliminated, and the crystalline characteristics can be enhanced further. A pulse-oscillating laser generally has higher energy density than a continuous-oscillating laser, and therefore, is able to expand the area of a beam spot relatively large. Consequently, the processing time per substrate can be shorter, and the processing efficiency can be thus improved.

Example 2

In the present example, an explanation will be given to the shape of a beam spot formed by a plurality of laser oscillating apparatuses of the invention.

Figure 13A:
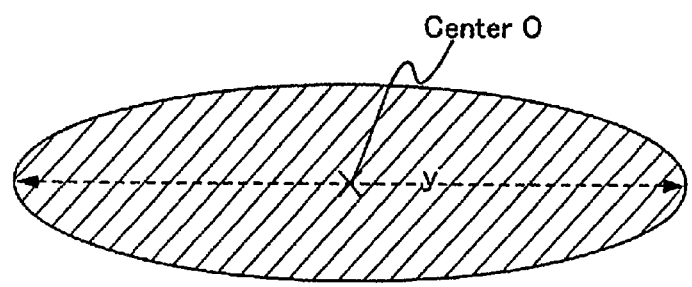
FIGS. 13A and 13B are views showing the shape and the distribution of the energy density of a laser beam.

FIG. 13(A) is a view showing one example of the shape of a beam spot of a laser beam oscillated from each of a plurality of laser oscillating apparatuses, formed on an object to be processed. The beam spot shown in FIG. 13(A) is of an elliptical shape. It should be appreciated, however, that in the laser apparatus of the invention, the shape of a beam spot of a laser beam oscillated from the laser oscillating apparatus is not limited to an elliptical shape. The shape of a beam spot varies with types of the laser, and can be formed by an optical system. For example, a laser beam emitted from a XeCl excimer laser (wavelength: 308 nm, pulse width: 30 ns) L3308 of Lambda Physik AG has a rectangular shape of 10 mm×30 mm (both being the half bandwidth in the beam profile). Also, a laser beam emitted from a YAG laser has a circular shape when the rod is of a cylindrical shape, and a rectangular shape when the rod is of the slab type. By further shaping such a laser beam by an optical system, it is possible to form a laser beam of a desired size.

Figure 13B:
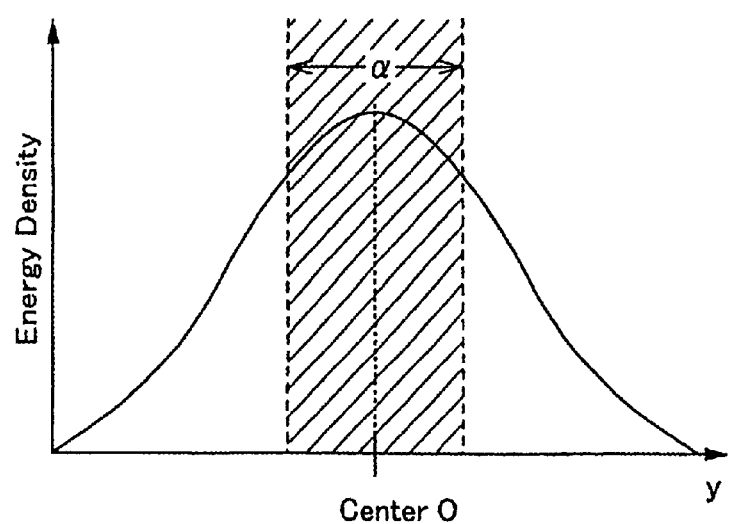

FIG. 13(B) shows the distribution of the energy density of a laser beam in the major axis y direction of the beam spot shown in FIG. 13(A). The distribution of the energy density of a laser beam having a beam spot of an elliptical shape increases toward the center O of the ellipse. α corresponds to a width in the major axis y direction in which the energy density exceeds a value needed to obtain desired crystals.

Figure 14A:
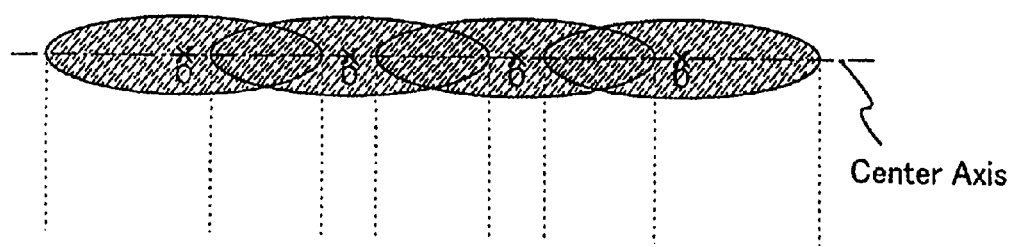
FIGS. 14A and 14B are views showing the shapes and the distribution of the energy densities of laser beams.

Next, FIG. 14(A) shows the shape of a beam spot when laser beams each having the beam spot shown in FIG. 13 are synthesized. FIG. 14(A) shows a case when beam spots of four laser beams are superimposed to form a single beam spot. It should be appreciated, however, that the number of beam spots to be superimposed is not limited to four.

As shown in FIG. 14(A), the beam spots of the respective laser beams are synthesized by matching the major axes of the respective ellipses and superimposing the beam spots partially with one another, and a single beam spot is thereby formed. Hereinafter, a straight line obtained by linking the centers O of the respective ellipses is referred to as the central axis.

Figure 14B:
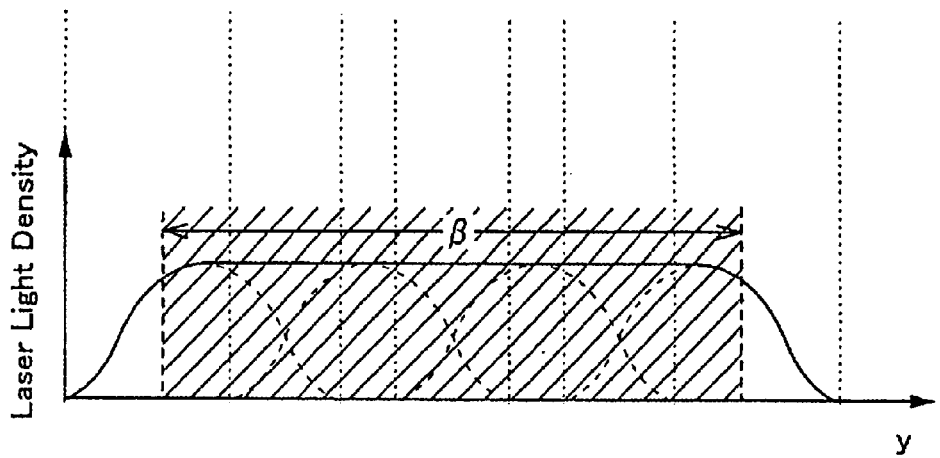

FIG. 14(B) shows the distribution of the energy density of a laser beam in the central axis direction in the synthesized beam spot shown in FIG. 14(A). Because the energy densities are added at the portions where the respective beam spots before being synthesized are superimposed with one another, the energy density is flattened between the centers O of the respective ellipses.

It is understood from FIG. 14(B) that by superimposing a plurality of laser beams to compensate for the portions having the lower energy densities, the crystalline characteristics of the semiconductor film can be enhanced efficiently than in the case of using a plurality of laser beams separately without being superimposed. For example, suppose that the energy density exceeds a value needed to obtain desired crystals only in the region hatched by diagonal lines in FIG. 14(B), and the energy density is low in the other regions. Then, in this case, unless the four beam spots are superimposed, desired crystals can be obtained only in a region hatched by diagonal lines whose width in the central axis direction is indicated by α. However, by superimposing the beam spots as shown in FIG. 14(B), it is possible to obtain desired crystals in a region whose width in the central axis direction is indicated by β (β>4α), and the semiconductor film can be thus crystallized more efficiently.

It should be noted that the energy density at the portions where the beam spots are superimposed is not necessarily as high as the maximum value of the energy density of each beam spot. For example, the energy density in these portions may be within ±10% and more preferably within ±5% of the energy density of each beam spot.

Also, because the width of the trace of laser beams can be changed while maintaining the energy density at a constant level, it is possible to prevent the edge of the trace of laser beams from overlapping the semiconductor film obtained through patterning. Also, it is possible to reduce damage given to the substrate when laser beams are irradiated to a portion that needs not to be irradiated.

The arrangement of the present example can be implemented optionally in a combination with Example 1 above.

Example 3

In the present example, an explanation will be given to an optical system used to obtain the beam spot shown in Example 2 above.

Figure 15A:
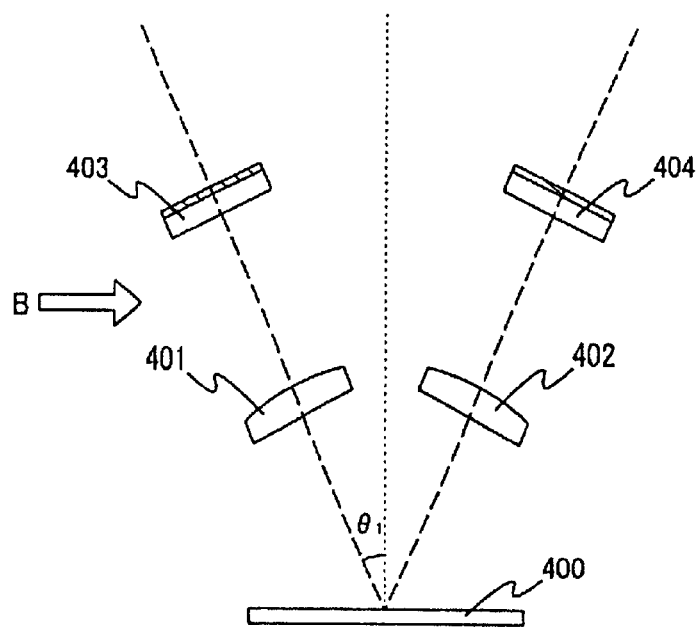
FIGS. 15A and 15B are views of an optical system in a laser apparatus.
Figure 15B:
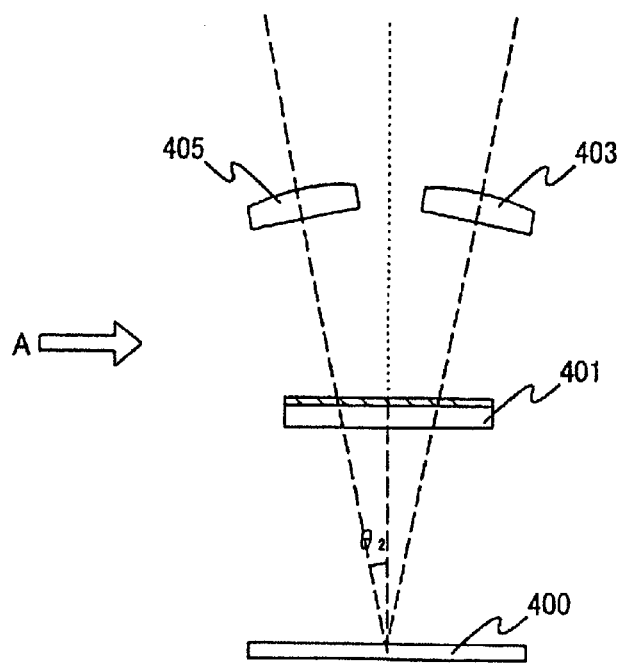

FIG. 15 shows a concrete arrangement of an optical system of the present example. FIG. 15(A) is a side view of the optical system in the laser apparatus of the invention, and a side view when viewed from the direction indicated by an arrow B of FIG. 15(A) is shown in FIG. 15(B). A side view when viewed in the direction indicated by an arrow A of FIG. 15(B) corresponds to FIG. 15(A).

FIG. 15 shows the optical system when four beam spots are synthesized into a single beam spot. It should be appreciated, however, that the number of beam spots to be synthesized in the present example is not limited to four, and the number of beam spots to be synthesized can be two to eight.

Figure 16:
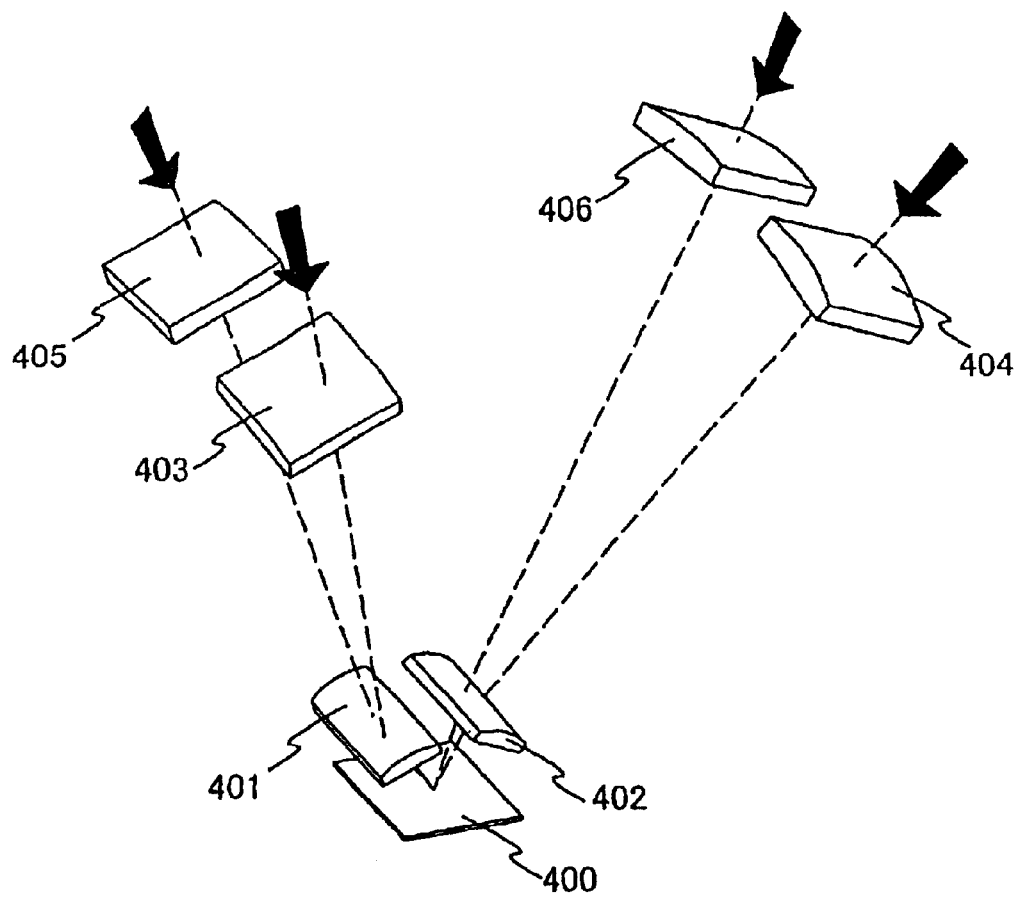
FIG. 16 is a view of the optical system in the laser apparatus.

Numerals 401, 402, 403, 404, and 405 denote cylindrical lenses, and although it is not shown in FIG. 15, the optical system of the present example employs six cylindrical lenses. FIG. 16 is a perspective view of the optical system shown in FIG. 15. Laser beams are incident on the respective cylindrical lenses 403, 404, 405 and 406 from their respective laser oscillating apparatuses.

After the shapes of beam spots are processed by the cylindrical lenses 403 and 405, respectively, the laser beams are incident on the cylindrical lens 401. After the shapes of beam spots are processed by the cylindrical lens, the incident laser beams are irradiated to an object 400 to be processed. Meanwhile, after the shapes of beam spots are processed by the cylindrical lenses 404 and 406, respectively, the laser beams are incident on the cylindrical lens 402. After the shapes of beam spots are processed by the cylindrical lens, the incident laser beams are irradiated to the object 400 to be processed.

The beam spots of the laser beams are synthesized by being superimposed partially with one another and form a single beam spot on the object 400 to be processed.

In the present example, 20 mm is given as the focal lengths of the cylindrical lenses 401 and 402 at the nearest position to the object 400 to be processed, and 150 mm is given as the focal lengths of the cylindrical lenses 403 through 406. In the present example, the respective lenses are set in such a manner that 25° is given as the incident angle $\theta_1$ of the laser beams on the object 400 to be processed from the cylindrical lenses 401 and 402, and 10° is given as the incident angle $\theta_2$ of the laser beams on the cylindrical lenses 401 and 402 from the cylindrical lenses 403 through 406.

The designer can set the focal length and the incident angle of each lens as needed. Further, the number of the cylindrical lenses is not limited to the above-specified number, and the optical system used is not limited to cylindrical lenses, either. The invention only has to have an optical system that is able to process a beam spot of a laser beam oscillated from each laser oscillating apparatus in a shape at the energy density suitable to crystallization of the semiconductor film and to synthesize the beam spots of all the laser beams into a single laser beam spot by superimposing one beam spot with another.

The present example shows a case where four beam spots are synthesized, and four cylindrical lenses respectively corresponding to four laser oscillating apparatuses, and two cylindrical lenses corresponding to the four cylindrical lenses are included. In a case where n (n=2, 4, 6, 8) beam spots are synthesized, n cylindrical lenses respectively corresponding to n laser oscillating apparatuses and n/2 cylindrical lenses corresponding to the n cylindrical lenses are included. In a case where n (n=3, 5, 7) beam spots are synthesized, n cylindrical lenses respectively corresponding to n laser oscillating apparatuses and (n+1)/2 cylindrical lenses corresponding to the n cylindrical lenses are included.

In order to prevent return light from returning in a back optical path, it is preferable to keep the incident angle with respect to the substrate greater than 0 and smaller than 90°.

Also, in order to achieve uniform irradiation of a laser beam, assume that the incident surface is defined as a plane vertical with respect to the irradiation surface and including either the short side or the long side of each beam before being synthesized by deeming the shape thereof is an oblong, then it is preferable that the incident angle θ of the laser beam satisfies $\theta \geq \arctan(W/2d)$, where W is the length of the short side or the long side included in the incident surface, and d is the thickness of the substrate placed on the irradiation surface and having a light transmitting property with respect to the laser beam. This discussion needs to be established for the individual laser beams before being synthesized. When the trace of the laser beam is out of the incident surface, the incident angle when the trace is projected onto the incident surface is deemed as the incident angle θ. By allowing a laser beam to be incident at the incident angle θ, reflection light on the surface of the substrate and reflection light from the back surface of the substrate do not interfere with each other, thereby achieving uniform irradiation of a laser beam. In the discussion above, 1 is given as the refractive index of the substrate. In practice, however, the substrate often has the refractive index of approximately 1.5, and a greater calculation value than the angle calculated in the above discussion is obtained when consideration is given to the above-specified numerical value. However, because the energy attenuates at either side in the longitudinal direction of a beam spot, the interference occurring in these portions is negligible, and the above calculated value can satisfactorily attain an advantage for interference attenuation.

Example 4

In the present example, an explanation will be given to a case where the size of a beam spot of laser beams is changed during irradiation of the laser beams when a plurality of laser oscillating apparatuses are used.

The laser apparatus of the invention identifies a portion where laser beams are scanned based on input information of the mask using a CPU. Further, in the present example, the length of a beam spot is changed in response to the shape of the mask.

Figure 17:
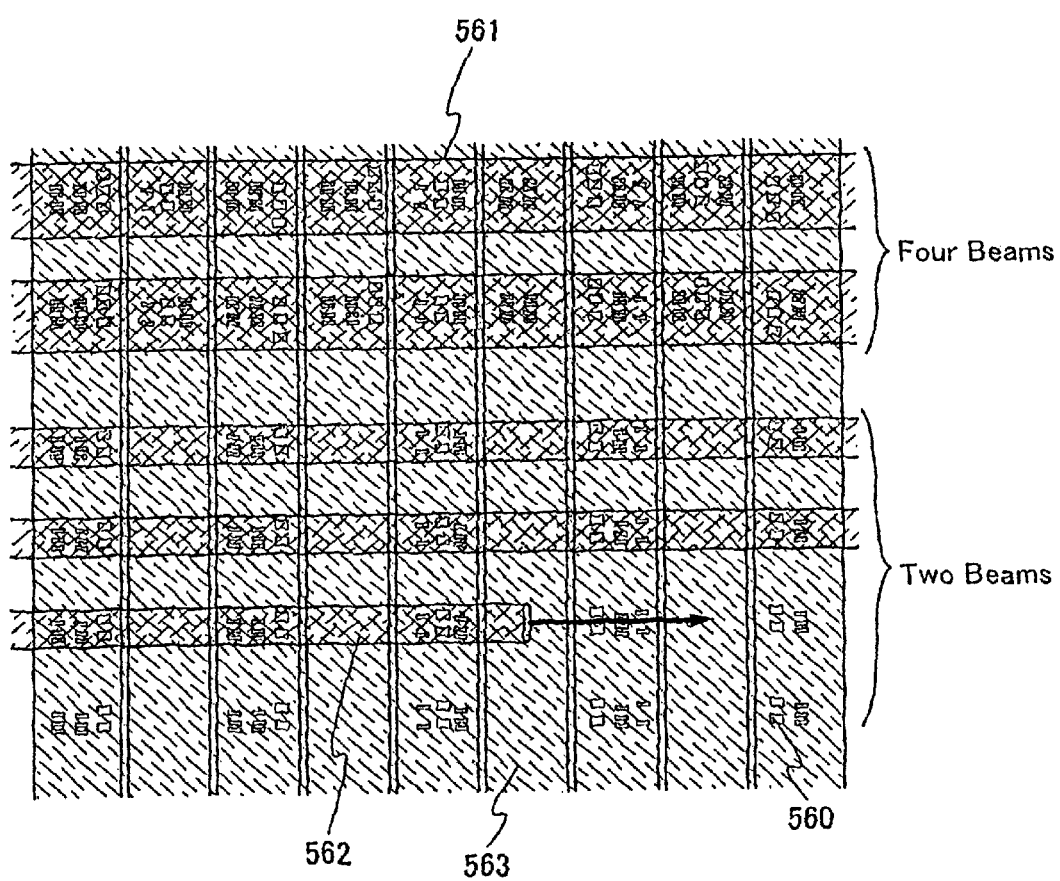
FIG. 17 is a view showing a moving direction of laser beams on an object to be processed.

FIG. 17 shows an example of a relation between the shape of a mask used in patterning the semiconductor film and the length of a beam spot. Numeral 560 denotes the shape of the mask used in patterning the semiconductor film, and the semiconductor film is patterned according to the mask after it is crystallized through the second irradiation of laser beams.

Numeral 563 denotes a portion where laser beams were irradiated in the first irradiation. In the present example, laser beams are irradiated across the entire surface of the semiconductor film in the first irradiation. However, it may be arranged in such a manner that laser beams are irradiated partially so as to at least crystallize a portion where the active layer will be obtained after the patterning. In addition, it is important to prevent the portion where the active layer will be obtained after the patterning from overlapping the edge.

Numerals 561 and 562 denote portions where laser beams are irradiated in the second irradiation. Numeral 561 denotes a portion that has been scanned by a beam spot obtained by superimposing and thereby synthesizing beam spots of laser beams respectively outputted from four laser oscillating apparatuses. On the other hand, numeral 562 denotes a portion that has been scanned by a beam spot obtained by superimposing and thereby synthesizing beam spots of laser beams respectively outputted from two laser oscillating apparatuses.

A beam spot obtained by synthesizing laser beams outputted from two laser oscillating apparatuses can be obtained by stopping oscillation of two laser oscillating apparatuses out of four laser oscillating apparatuses. In this case, however, it is important that two beam spots outputted from the two laser oscillating apparatuses continuing to operate are superimposed with each other.

When the length of a beam spot is changed while laser beams are being scanned like in the present embodiment, it is more preferable to change a longer beam spot to a shorter beam spot than to change a shorter beam spot to a longer beam spot because outputs from the laser oscillating apparatuses are stabilized. Hence, it is preferable to take the scanning order of laser beams into account in the CPU based on the information of the shape of the mask, so that a longer beam spot is changed to a shorter beam spot. Further, when the mask is designed, the mask may be designed by taking the scanning order of laser beams into account.

According to the above arrangement, the width of a trace of laser beams can be changed, and it is thus possible to prevent the edge of the trace of laser beams from overlapping the semiconductor film obtained through patterning. Also, it is possible to further reduce damage given to the substrate when laser beams are irradiated to a portion that needs not to be irradiated.

Also, laser beams may be irradiated partially in the first irradiation and entirely in the second irradiation.

The present example can be implemented in a combination with Examples 1 through 3 above.

Example 5

In the present example, an explanation will be given to a case where laser beams are irradiated to a specific portion alone by blocking the laser beams with a shutter provided to the optical system while the laser beams are being irradiated when a plurality of laser oscillating apparatus are used.

The laser apparatus of the invention identifies a portion where laser beams are scanned based on input information of the mask using a CPU. Further, in the present example, laser beams are blocked by the shutter so that the laser beams are irradiated only to a portion where scanning is needed. In this instance, it is preferable that the shutter is made of a material that is able to block laser beams and is neither deformed nor damaged by the laser beams.

Figure 18:
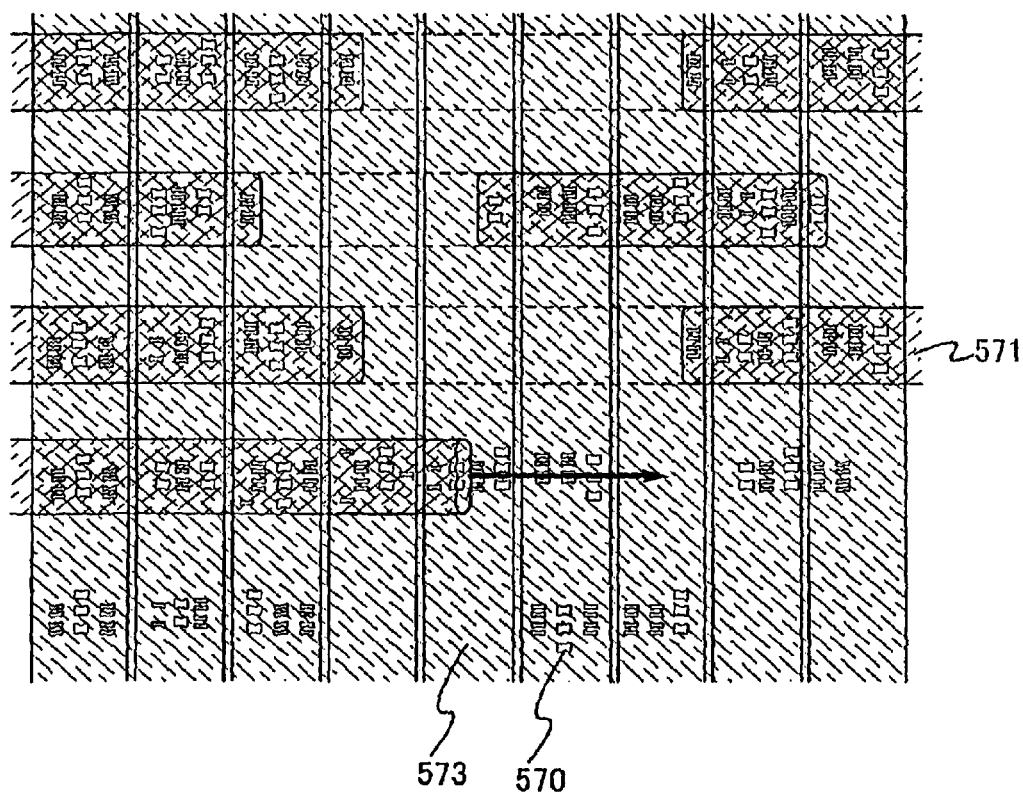
FIG. 18 is a view showing a moving direction of laser beams on an object to be processed.

FIG. 18 shows an example of a relation between the shape of a mask used in patterning the semiconductor film and a portion where laser beam are irradiated. Numeral 570 denotes the shape of the mask used in patterning the semiconductor film, and the semiconductor film is patterned according to the mask after it is crystallized through irradiation of laser beams.

Numeral 573 denotes a portion where laser beams are irradiated in the first irradiation. In the present example, laser beams are irradiated across the entire surface of the semiconductor film in the first irradiation. However, laser beams may be irradiated partially in such a manner that a portion where the active layer will be obtained after the patterning is crystallized at least. Also, it is important to prevent the portion where the active layer will be obtained after the patterning from overlapping the edge.

Numeral 571 denotes a portion where laser beams are irradiated in the second irradiation. A broken line indicates a portion where laser beams are blocked by the shutter. Hence, in the present example, a portion that needs not to be crystallized is not irradiated by laser beams or irradiated at a lower energy density. It is thus possible to further reduce damage given to the substrate when laser beams are irradiated to a portion that need not be irradiated.

Laser beams may be irradiated partially in the first irradiation and entirely in the second irradiation.

The present example can be implemented in a combination with Examples 1 through 4 above.

Example 6

In the present example, an example of markers provided in a marker forming portion 423 will be shown.

Figure 19A:
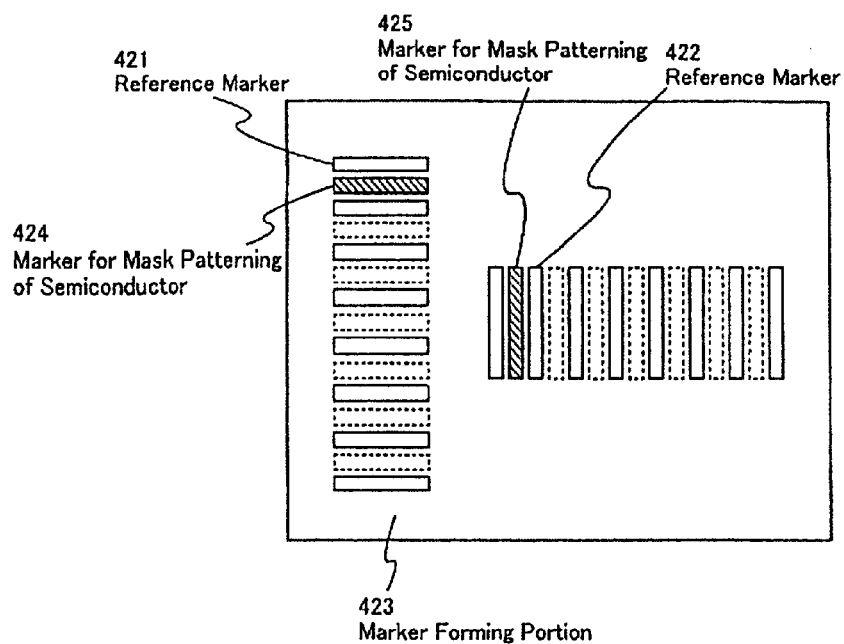
FIGS. 19A and 19B are views showing a structure of makers.

FIG. 19(A) shows a top view of markers used in the present example. Numerals 421 and 422 denote markers (hereinafter, referred to as the reference makers) formed in the semiconductor film to be used as the reference, and each has a rectangular shape. All the reference makers 421 are placed in such a manner that the long sides of the rectangles are aligned in the horizontal direction, and the respective reference markers 421 are aligned in the vertical direction while keeping a certain space in between. All the reference markers 422 are placed in such a manner that the long sides of the rectangles are aligned in the vertical direction, and the respective reference markers 422 are placed in the horizontal direction while keeping a certain space in between.

The reference markers 421 are the markers used when the position of the mask in the vertical direction is determined, and the reference markers 422 are the markers used when the position of the mask in the horizontal direction is determined. Numerals 424 and 425 denote markers for the mask used in patterning the semiconductor film and each has a rectangular shape. The position of the mask used in patterning the semiconductor film is determined in such a manner that the markers 424 are placed so that the long sides of the rectangles are aligned in the horizontal direction and the makers 425 are placed so that the long sides of the rectangles are aligned in the vertical direction. Also, the mask used in patterning the semiconductor film is determined in such a manner that each maker 424 is positioned exactly at the center between the two determined adjacent reference makers 421, and each marker 425 is positioned exactly at the center between the two determined adjacent reference markers 422.

Figure 19B:
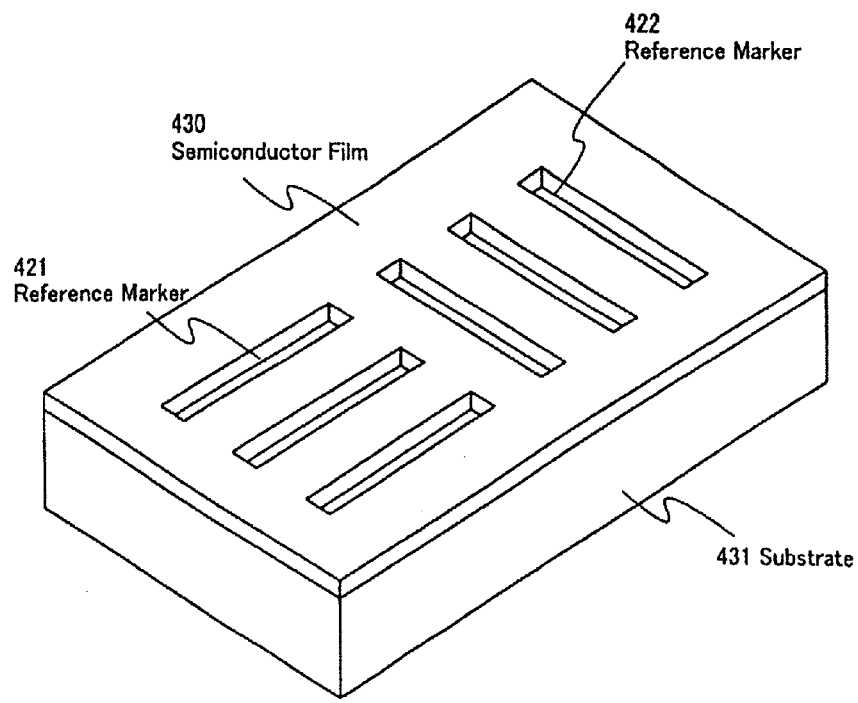

FIG. 19(B) is a perspective view of the reference markers formed in the semiconductor film. Part of a semiconductor film 430 formed on a substrate 431 is cut out by a laser beam in a rectangular shape, and the cut-out portions function as the reference makers 421 and 422.

The markers shown in the present example are only one example, and the markers of the invention are not limited to these markers. Markers used in the invention only have to be formed before the semiconductor film is crystallized by a laser beam and remain usable after the semiconductor film is crystallized through irradiation of a laser beam.

The present example can be implemented in a combination with Examples 1 through 5 above.

Example 7

In the present example, an explanation will be given to an optical system in a laser apparatus of the invention using eight laser oscillating apparatuses.

Figure 20:
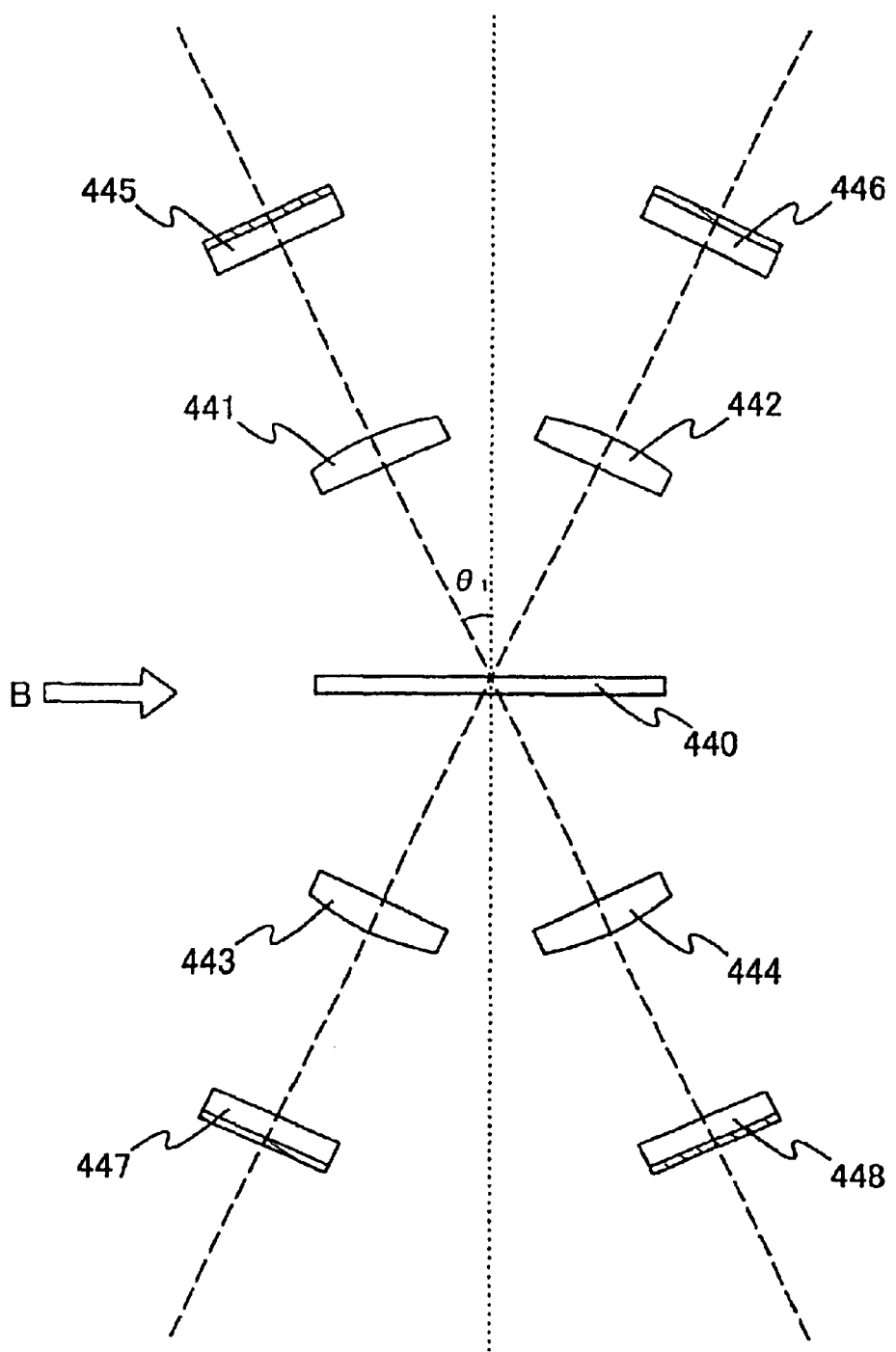
FIG. 20 is a view of an optical system in a laser apparatus of the invention.
Figure 21:
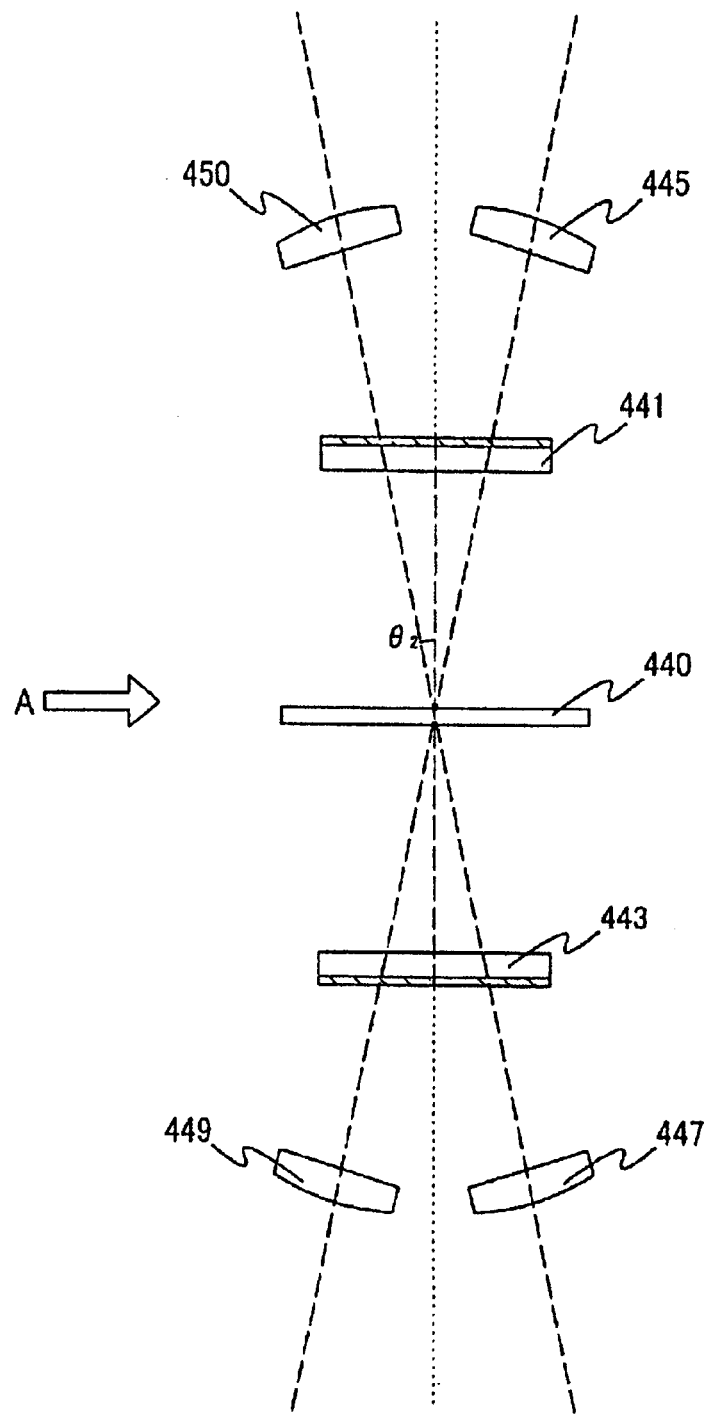
FIG. 21 is a view of the optical system in the laser apparatus of the invention.

FIG. 20 and FIG. 21 show concrete arrangements of an optical system employed in the laser apparatus of the present example. FIG. 20 is a side view of the optical system in the laser apparatus of the invention, and a side view when viewed from the direction indicated by an arrow B of FIG. 20 is shown in FIG. 21. A side view when viewed in the direction indicated by an arrow A of FIG. 21 corresponds to FIG. 20.

The present example shows the optical system when eight beam spots are synthesized into a single beam spot. It should be appreciated, however, that the number of beam spots to be synthesized in the invention is not limited to eight, and the number of beam spots to be synthesized can be two to eight.

Figure 22:
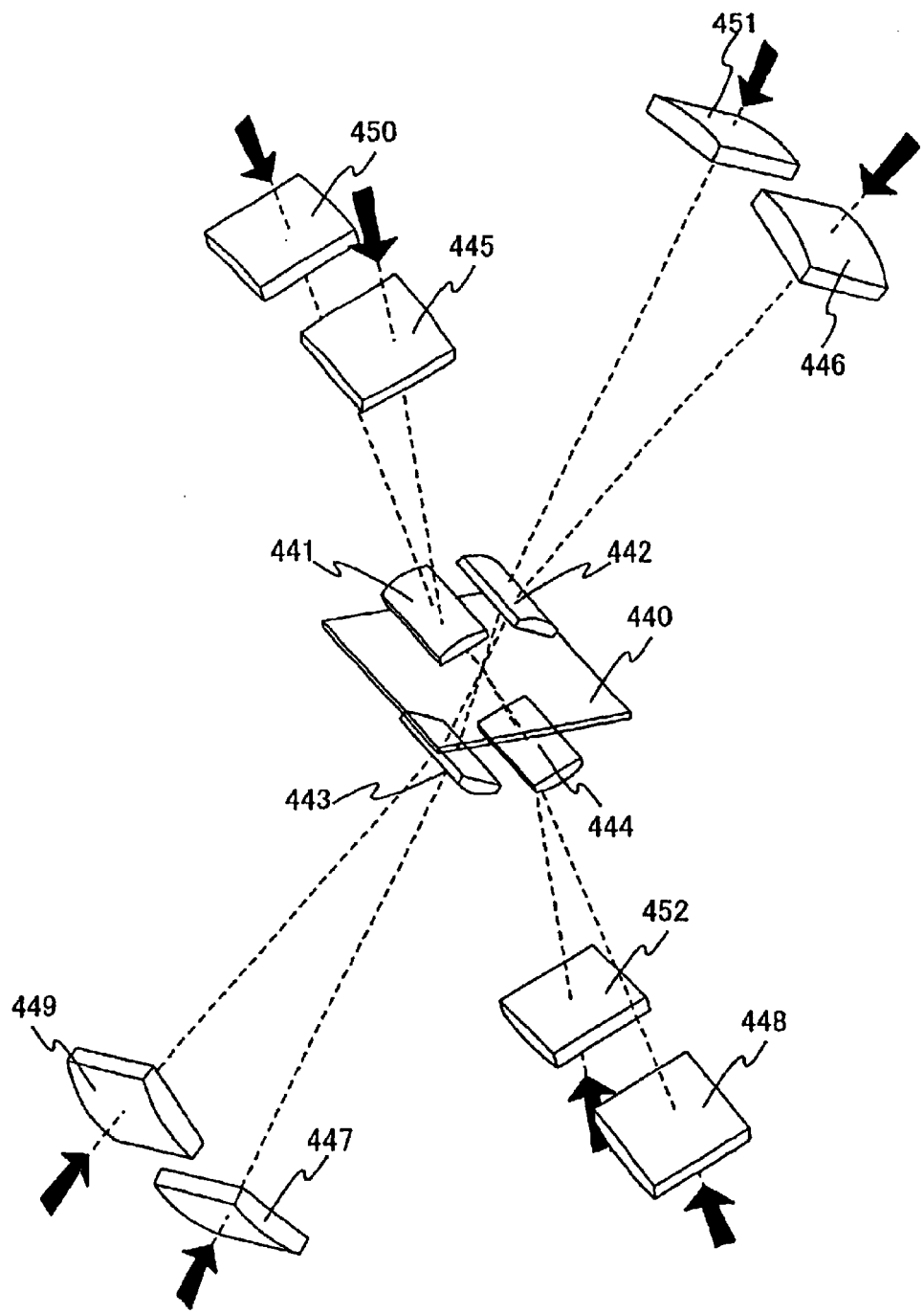
FIG. 22 is a view of the optical system in the laser apparatus of the invention.

Numerals 441 through 450 denote cylindrical lenses, and although it is not shown in FIG. 20 and FIG. 21, the optical system of the present example employs 12 cylindrical lenses 441 through 452. FIG. 22 is a perspective view of the optical system shown in FIG. 20 and FIG. 21. Laser beams are incident on the respective cylindrical lenses 441 through 444 from their respective laser oscillating apparatuses.

After the shapes of beam spots are processed by the cylindrical lenses 450 and 445, respectively, the laser beams are incident on the cylindrical lens 441. After the shapes of beam spots are processed by the cylindrical lens 441, the incident laser beams are irradiated to an object 440 to be processed. After the shapes of beam spots are processed by the cylindrical lenses 451 and 446, respectively, the laser beams are incident on the cylindrical lens 442. After the shapes of beam spots are processed by the cylindrical lens 442, the incident laser beams are irradiated to the object 440 to be processed. Also, after the shapes of beam spots are processed by the cylindrical lenses 449 and 447, respectively, the laser beams are incident on the cylindrical lens 443. After the shapes of beam spots are processed by the cylindrical lens 443, the incident laser beams are irradiated to the object 440 to be processed. After the shapes of beam spots are processed by the cylindrical lenses 452 and 448, respectively, the laser beams are incident on the cylindrical lens 444. After the shapes of beam spots are processed by the cylindrical lens 444, the incident laser beams are irradiated to the object 440 to be processed.

The beam spots of the laser beams are synthesized by being superimposed partially with one another and form a single beam spot on the object 440 to be processed.

In the present example, 20 mm is given as the focal lengths of the cylindrical lenses 441 through 444 at the nearest position to the object 440 to be processed, and 150 mm is given as the focal lengths of the cylindrical lenses 445 through 452. In the present example, the respective lenses are set in such a manner that 25° is given as the incident angles $\theta_1$ of the laser beams on the object 440 to be processed from the cylindrical lenses 441 through 444, and 10° is given as the incident angles $\theta_2$ of the laser beams on the cylindrical lenses 441 through 444 from the cylindrical lenses 445 through 452.

The designer can set the focal length and the incident angle of each lens as needed. Further, the number of the cylindrical lenses is not limited to the above-specified number, and the optical system used is not limited to cylindrical lenses, either. The invention only has to have an optical system that is able to process a beam spot of a laser beam oscillated from each laser oscillating apparatus in a shape at the energy density suitable to crystallization of the semiconductor film and to synthesize the beam spots of all the laser beams into a single laser beam spot by superimposing one beam spot with another.

The present example shows a case where eight beam spots are synthesized, and eight cylindrical lenses respectively corresponding to eight laser oscillating apparatuses, and four cylindrical lenses respectively corresponding to the eight cylindrical lenses are included.

The present example can be implemented in a combination with Examples 1 through 6 above.

Example 8

In this example, a method of manufacturing an active matrix substrate will be described with reference to FIGS. 23 through 26. A substrate on which a CMOS circuit, a driver circuit, and a pixel portion having a pixel TFT and a holding capacity are formed together is called active matrix substrate for convenience.

First of all, a substrate 600 formed of glass such as barium borosilicate glass and aluminum borosilicate glass is used in this example. The substrate 600 may be a quartz substrate, a silicon substrate, a metal substrate or stainless substrate, which has an insulating film on the surface. The substrate 600 may be a plastic substrate having heat resistance, which withstands a processing temperature in this example.

Figure 23A:
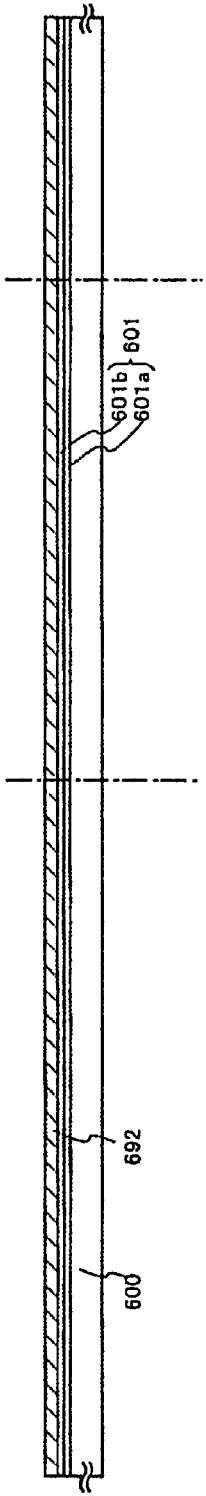
FIGS. 23A, 23B and 23C are views showing a method of manufacturing a semiconductor device using the laser apparatus of the invention.

Next, a base film 601 having an insulating film such as silicon oxide film, silicon nitride film, and a silicon oxynitride film is formed on the substrate 600 by publicly known method (such as the sputtering method, LPCVD method and plasma CVD method). In this example, a two-layer structure of a base film 601a and a base film 601b is used as the base film 601. However, a structure may be used where a single layer film, which is the insulating film itself, or at least two layers are stacked (FIG. 23A).

Figure 23B:
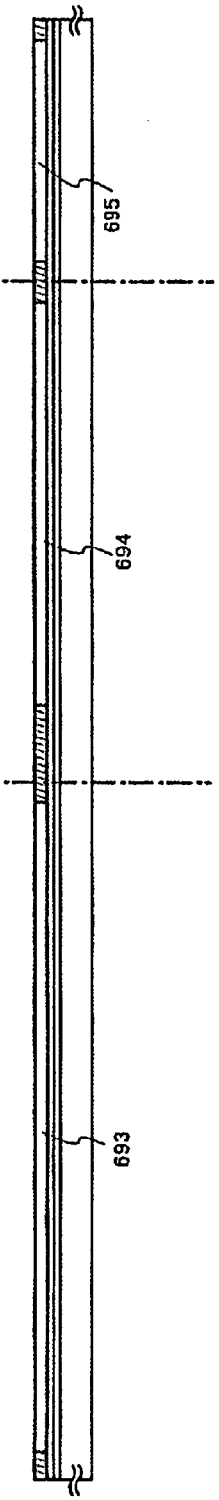

Next, an amorphous semiconductor film 692 is formed on the base film 601 with a thickness of 25 to 80 nm (preferably 30 to 60 nm) by publicly known method (such as the sputtering method, LPCVD method, and plasma CVD method) (FIG. 23B). Note that although the amorphous semiconductor film is formed in this example, a microcrystalline semiconductor film or a crystalline semiconductor film may also be formed. Further, a chemical compound semiconductor film having an amorphous structure such as an amorphous silicon germanium film may also be used.

Next, the semiconductor film is crystallized by a laser crystallization method. The laser crystallization method is performed by using the laser irradiation method of the present invention. Specifically, the laser crystallization method is performed by irradiating laser lights having different scanning directions to the amorphous semiconductor film two times in accordance with information of a mask inputted into a CPU of the laser apparatus. Then, a portion in which the laser light is irradiated twice are used as an active layer. Of course, in addition to the laser crystallization method, the semiconductor film may be crystallized by combining other publicly known crystallization method (such as thermal crystallization method using RTA or a furnace annealing and thermal crystallization method using a metal element facilitating the crystallization).

When a crystallization of an amorphous semiconductor film is conducted, it is preferable that the second harmonic through the fourth harmonic of basic waves is applied by using the solid state laser which is capable of continuous oscillation in order to obtain a crystal in large grain size. Typically, it is preferable that the second harmonic (with a thickness of 532 nm) or the third harmonic (with a thickness of 355 nm) of an Nd: $YVO_4$ laser (basic wave of 1064 nm) is applied. Specifically, laser beams emitted from the continuous oscillation type $YVO_4$ laser with 10 W output is converted into a harmonic by using the non-linear optical elements. Also, a method of emitting a harmonic by applying crystal of $YVO_4$ and the non-linear optical elements into a resonator. Then, more preferably, the laser beams are formed so as to have a rectangular shape or an elliptical shape by an optical system, thereby irradiating a substance to be treated. At this time, the energy density of approximately 0.01 to 100 MW/cm$^2$ (preferably 0.1 to 10 MW/cm$^2$) is required. The semiconductor film is moved at approximately 10 to 2000 cm/s rate relatively corresponding to the laser beams so as to irradiate the semiconductor film.

Note that, a gas laser or solid-state laser of continuous oscillation type or pulse oscillation type can be used for the two times laser irradiations. The gas laser such as an excimer laser, Ar laser, Kr laser and the solid-state laser such as YAG laser, $YVO_4$ laser, YLF laser, $YAlO_3$ laser, glass laser, ruby laser, alexandrite laser, Ti: sapphire laser, $Y_2O_3$ laser can be used as the laser light. Also, crystals such as YAG laser, $YVO_4$ laser, YLF laser, $YAlO_3$ laser wherein Cr, Nd, Er, Ho, Ce, Co, Ti, Yb or Tm is doped can be used as the solid-state laser. A basic wave of the lasers is different depending on the materials of doping, therefore a laser light having a basic wave of approximately 1 $\mu$m is obtained. A harmonic corresponding to the basic wave can be obtained by the using non-linear optical elements.

Regions 693, 694, and 695 in which the amorphous semiconductor film is irradiated with the laser light twice to improve the crystallinity by above-mentioned laser crystallization (FIG. 23B).

Figure 23C:
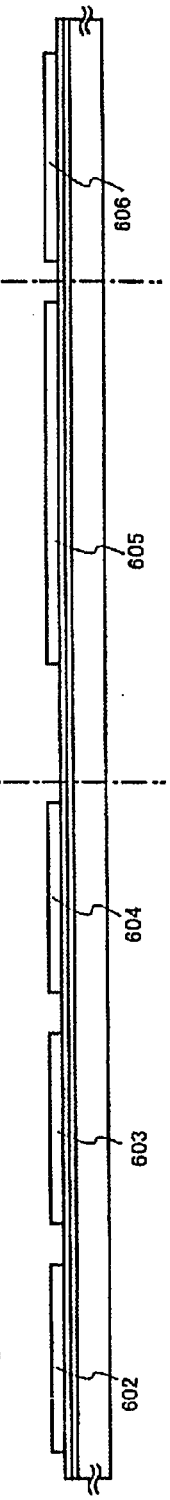

Next, the crystalline semiconductor film in which partially increased the crystallinity is patterned to form island-like semiconductor films from the crystallized regions 693, 694 and 695 (FIG. 23C).

After the island-like semiconductor layers 602 to 606 are formed, a small amount of impurity element (boron or phosphorus) may be doped in order to control a threshold value of the TFT.

Next, a gate insulating film 607 covering the island-like semiconductor layers 602 to 606 is formed. The gate insulating film 607 is formed by using an insulating film containing silicon with a thickness of 40 to 150 nm by using plasma CVD method or sputtering method. In this example, a silicon oxynitride film (compositional ratio: Si=32%, O=59%, N=7% and H=2%) with a thickness of 110 nm is formed by the plasma CVD method. Notably, the gate insulating film is not limited to the silicon oxynitride film but an insulating film containing other silicon may be used as a single layer or as a laminated pad.

When a silicon oxide film is used, it is formed by mixing Tetraethyl Orthosilicate (TEOS) and $O_2$ by plasma CVD method, which is discharged under a condition with reaction pressure of 40 Pa, a substrate temperature of 300 to 400° C. and high frequency (13.56 MHz) power density of 0.5 to 0.8 W/cm². Thermal annealing at 400 to 500° C. thereafter can give good characteristics to the silicon oxide film produced in this way as a gate insulating film.

Next, a first conductive film 608, which is 20 to 100 nm in thickness, and a second conductive film 609, which is 100 to 400 nm in thickness, is stacked on the gate insulating film 607. In this example, the first conductive film 608 formed by a TaN film with a thickness of 30 nm and the second conductive film 609 formed by a W film with a thickness of 370 nm are stacked. The TaN film is formed by using Ta target to perform sputtering in an atmosphere containing nitrogen. The W film is formed by using W target to perform sputtering. Alternatively, it can be formed by thermal CVD method using tungsten hexafluoride ($WF_6$). In both cases, the use of the gate electrode needs low resistance. Therefore, the resistivity of the W film is desirably 20 $\mu\Omega$cm or less. The low resistance of the W film can be achieved by increasing the size of the crystal grains. However, when the W film contains a large amount of impurity element such as oxygen, the crystallization is inhibited, which raises the resistance. Accordingly, in this example, the W film is formed by the sputtering method using high purity (purity of 99.9999%) W target and by taking the prevention of intrusion of impurity from a vapor phase during the film forming into special consideration. Thus, the resistivity of 9 to 20 $\mu\Omega$cm can be achieved.

While, in this example, the first conductive film 608 is TaN and the second conductive film 609 is W, they are not limited in particular. Both of them can be formed by an element selected from Ta, W, Ti, Mo, Al, Cu, Cr and Nd or an alloy material or a compound material mainly containing the element. Alternatively, a semiconductor film, such as a polycrystalline silicon film to which an impurity element such as phosphorus is doped, can be used. An AgPdCu alloy may be used. A combination of the first conductive film formed by a tantalum (Ta) film and the second conductive film formed by a W film, a combination of the first conductive film formed by a titan nitride (TiN) film and the second conductive film formed by a W film, a combination of the first conductive film formed by a tantalum nitride (TaN) film and the second conductive film formed by a W film, a combination of the first conductive film formed by a tantalum nitride (TaN) film and the second conductive film formed by an Al film, or a combination of the first conductive film formed by a tantalum nitride (TaN) film and the second conductive film formed by a Cu film is possible.

Further, the present invention is not limited to a two-layer structure. For example, a three-layer structure may be adopted in which a tungsten film, an alloy film of aluminum and silicon (Al—Si), and a titanium nitride film are sequentially laminated. Moreover, in case of a three-layer structure, tungsten nitride may be used in place of tungsten, an alloy film of aluminum and titanium (Al—Ti) may be used in place of the alloy film of aluminum and silicon (Al—Si), and a titanium film may be used in place of the titanium nitride film.

Note that, it is important that appropriate etching method or kinds of etchant is properly selected depending on the materials of a conductive film.

Figure 24A:
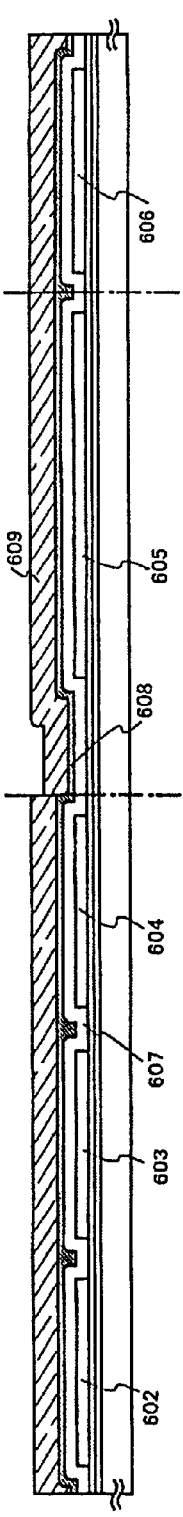
FIGS. 24A, 24B and 24C are views showing the method of manufacturing the semiconductor device using the laser apparatus of the invention.
Figure 24B:
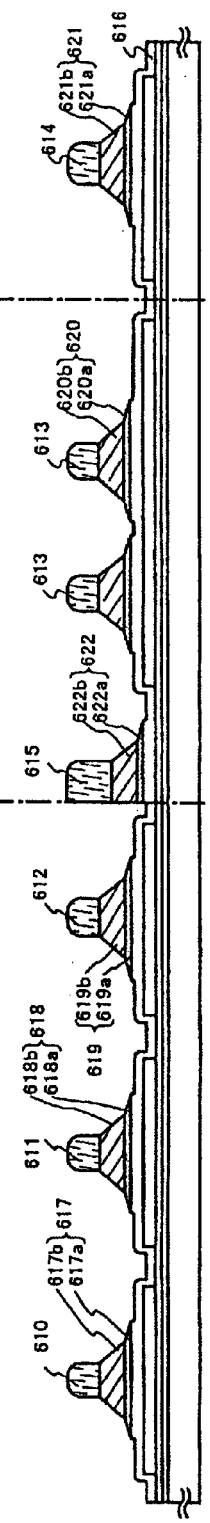

Next, masks 610 to 615 made of resist using photolithography method are formed, and first etching processing is performed thereon in order to form electrodes and wires. The first etching processing is performed under first and second etching conditions (FIG. 24B). The first etching condition in this example is to use Inductively Coupled Plasma (ICP) etching method and to use $CF_4$, $Cl_2$ and $O_2$ as an etching gas, whose amount of gas flow rate is 25/25/10 (sccm), respectively. 500 W of RF (13.56 MHz) power was supplied to a coil type electrode by 1 Pa pressure in order to generate plasma and then to perform etching for about 30 seconds. 150 W of RF (13.56 MHz) power was also supplied to a substrate side (test sample stage) and substantially negative self-bias voltage was applied. The W film was etched under the first etching condition so as to obtain the end of the first conductive layer in a tapered form.

After that, the first etching condition is shifted to the second etching condition without removing the masks 610 to 615 made of resist. Then, $CF_4$ and $Cl_2$ are used as etching gases. The ratio of the amounts of flowing gasses is 30/30 (sccm). 500 W of RF (13.56 MHz) power is supplied to a coil type electrode by 1 Pa pressure in order to generate plasma and then to perform etching for about 30 seconds. 20 W of RF (13.56 MHz) power is also supplied to a substrate side (test sample stage) and substantially negative self-bias voltage is applied. Under the second etching condition where $CF_4$ and $Cl_2$ are mixed, both W film and TaN film were etched to the same degree. In order to etch without leaving a residue on the gate insulating film, the etching time may be increased 10 to 20% more.

In the first etching processing, when the shape of the mask made of resist is appropriate, the shape of the ends of the first and the second conductive layers are in the tapered form due to the effect of the bias voltage applied to the substrate side. The angle of the tapered portion is 15 to 45°. Thus, conductive layers 617 to 622 in a first form are formed which include the first conductive layers and the second conductive layers (first conductive layers 617a to 622a and second conductive layers 617b to 622b) through the first etching processing. In a gate insulating film 616, an area not covered by the conductive layers 617 to 622 in the first form is etched by about 20 to 50 nm so as to form a thinner area.

Figure 24C:
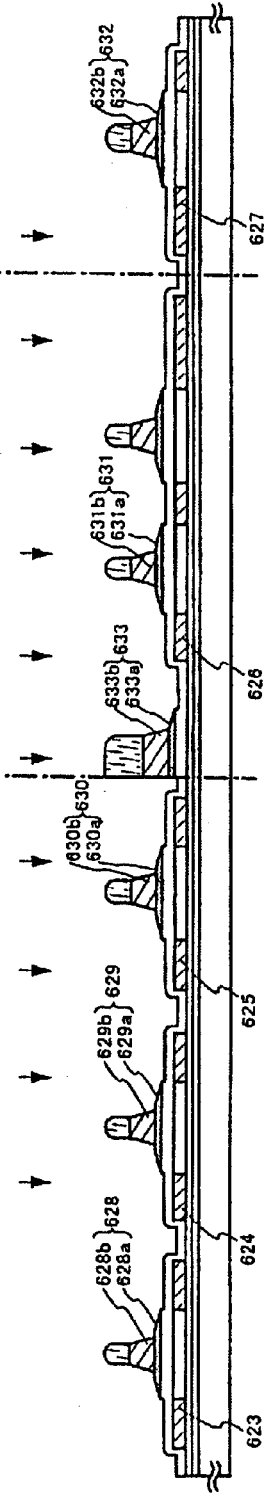

Next, second etching processing is performed without removing masks made of resist (FIG. 24C). Here, $CF_4$, $Cl_2$ and $O_2$ are used as an etching gas to etch the W film selectively. Then, second conductive layers 628b to 633b are formed by the second etching processing. On the other hand, the first conductive layers 617a to 622a are not etched very much, and conductive layers 628 to 633 in the second form are formed.

First doping processing is performed without removing masks made of resist and low density of impurity element, which gives n-type to a island-like semiconductor layer, is added. The doping processing may be performed by the ion-doping method or the ion-implanting method. The ion doping method is performed under a condition in the dose of $1\times10^{13}$ to $5\times10^{14}$ atoms/cm² and the accelerating voltage of 40 to 80 kV. In this example, the ion doping method is performed under a condition in the dose of $1.5\times10^{13}$ atoms/cm² and the accelerating voltage of 60 kV. The n-type doping impurity element may be Group 15 elements, typically phosphorus (P) or arsenic (As). Here, phosphorus (P) is used. In this case, the conductive layers 628 to 633 function as masks for the n-type doping impurity element. Therefore, impurity areas 623 to 627 are formed in the self-alignment manner. An n-type doping impurity element in the density range of $1\times10^{18}$ to $1\times10^{20}$ atoms/cm³ are added to the impurity areas 623 to 627.

When masks made of resist are removed, new masks 634a to 634c made from resist are formed. Then, second doping processing is performed by using higher accelerating voltage than that used in the first doping processing. The ion doping method is performed under a condition in the dose of $1\times10^{13}$ to $1\times10^{15}$ atoms/cm$^2$ and the accelerating voltage of 60 to 120 kV. In the doping processing, the second conductive layers 628b, 630b and 632b are used as masks against the impurity element. Doping is performed such that the impurity element can be added to the island-like semiconductor layer at the bottom of the tapered portion of the first conductive layer. Then, third doping processing is performed by having lower accelerating voltage than that in the second doping processing to obtain a condition shown in FIG. 25A. The ion doping method is performed under a condition in the dose of $1\times10^{15}$ to $1\times10^{17}$ atoms/cm$^2$ and the accelerating voltage of 50 to 100 kV. Through the second doping processing and the third doping processing, an n-type doping impurity element in the density range of $1\times10^{18}$ to $5\times10^{19}$ atoms/cm$^3$ is added to the low density impurity areas 636, 642 and 648, which overlap with the first conductive layer. An n-type doping impurity element in the density range of $1\times10^{19}$ to $5\times10^{21}$ atoms/cm$^3$ is added to the high density impurity areas 635, 641, 644 and 647.

With proper accelerating voltage, of course, the low density impurity area and the high density impurity area can be formed by performing the second doping processing and the third doping processing once.

Next, after removing masks made of resist, new masks 650a to 650c made of resist are formed to perform the fourth doping processing. Through the fourth doping processing, impurity areas 653, 654, 659 and 660, to which an impurity element doping a conductive type opposite to the one conductive type is added, in an island-like semiconductor layer, which is an active layer of a p-channel type TFT. Second conductive layers 629b to 632b are used as mask against the impurity element, and the impurity element giving p-type is added so as to form impurity areas in the self-alignment manner. In this example, the impurity areas 653, 654, 659 and 660 are formed by applying ion-doping method using diborane (B$_2$H$_6$) (FIG. 25B). During the fourth doping processing, the island-like semiconductor layer forming the n-channel TFT is covered by masks 650a to 650c made of resist. Through the first to the third doping processing, phosphorus of different densities is added to each of the impurity areas 653, 659, and 660. Doping processing is performed such that the density of p-type doping impurity element can be $1\times10^{19}$ to $5\times10^{21}$ atoms/cm$^3$ in both areas. Thus, no problems are caused when they function as the source region and the drain region of the p-channel TFT.

Impurity areas are formed in the island-like semiconductor layers, respectively, through the processes above.

Next, the masks 650a to 650c made from resist are removed and a first interlayer insulating film 661 is formed thereon. The first interlayer insulating film 661 may be an insulating film with a thickness of 100 to 200 nm containing silicon, which is formed by plasma CVD method or sputtering method. In this example, silicon oxynitride film with a thickness of 150 nm is formed by plasma CVD method. The first interlayer insulating film 661 is not limited to the silicon oxynitride film but may be the other insulating film containing silicon in a single layer or in a laminated pad.

Next, as shown in FIG. 25C, activation processing is performed by using laser irradiation method. When a laser annealing method is used, the laser used in the crystallization can be used. When the activation processing is performed, the moving speed is same as the crystallization, and an energy density of about 0.01 to 100 MW/cm$^2$ (preferably, 0.01 to 10 MW/cm$^2$) is required. Also, a continuous oscillation laser may be used in the case the crystallization is performed and a pulse oscillation laser may be used in the case the activation is performed.

Also, the activation processing may be conducted before the first interlayer insulating film is formed.

After the heating processing (thermal processing at 300 to 550° C. for 1 to 12 hours) is performed, hydrogenation can be performed. This process terminates the dangling bond of the island-like semiconductor layer with hydrogen contained in the first interlayer insulating film 661. Alternatively, the hydrogenation may be plasma hydrogenation (using hydrogen excited by plasma) or heating processing in an atmosphere containing 3 to 100% of hydrogen at 300 to 650° C. for 1 to 12 hours. In this case, the semiconductor layer can be hydrogenated regardless of the existence of the first interlayer insulating film.

Next, a second interlayer insulating film 662 formed by an inorganic insulating material or an organic insulator material is formed on the first interlayer insulating film 661. In this example, an acrylic resin film with a thickness of 1.6 μm is formed. However, an acrylic resin having viscosity of 10 to 1000 cp, preferably 40 to 200 cp, may be used. Moreover, an acrylic resin film on which depressions and projections are formed may also be used.

In this example, in order to prevent mirror reflection, a second interlayer insulating film having projections and depressions on the surface is formed. Thus, the projections and depressions are formed on the surface of the pixel electrode. In order to obtain an effect of light dispersion by forming the depressions and projections on the surface of the pixel electrode, a projecting portion may be formed under the pixel electrode. In this case, the projecting portion can be formed by using the same photomask for forming a TFT. Thus, the projecting portion can be formed without any increase in the number of steps. The projecting portion may be provided as necessary on the substrate in the pixel area except for wirings and the TFT portion. Accordingly, projections and depressions can be formed on the surface of the pixel electrode along the projections and depressions formed on the surface of an insulating film covering the projecting portion.

Alternatively, the second interlayer insulating film 662 may be a film having a flattened surface. In this case, after the pixel electrode is formed, projections and depressions are formed on the surface by performing an added process such as publicly known sand-blast method and etching method or the like. Preferably, by preventing mirror reflection and by dispersing reflected light, the whiteness is increased.

Next, after formation of the second interlayer insulating film 662, a third interlayer insulating film 672 is formed so as to connect with the second interlayer insulating film 662.

Figure 26:
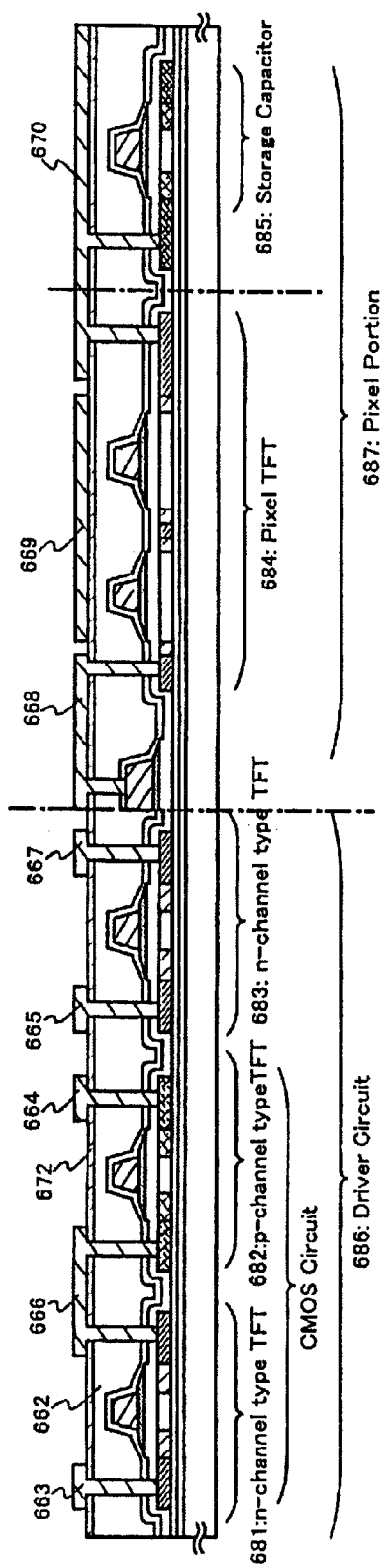
FIG. 26 is a view showing the method of manufacturing the semiconductor device using the laser apparatus of the invention.

Wirings 663 to 667 electrically connecting to impurity areas, respectively, are formed in a driver circuit 686. These wirings are formed by patterning a film laminating a Ti film with a thickness of 50 nm and an alloy film (alloy film of Al and Ti) with a thickness of 500 nm. It is not limited to the two-layer structure but may be a one-layer structure or a laminate pad including three or more layers. The materials of the wirings are not limited to Al and Ti. For example, the wiring can be formed by forming Al or Cu on a TaN film and then by patterning the laminate film in which a Ti film is formed (FIG. 26).

In a pixel portion 687, a pixel electrode 670, a gate wiring 669 and a connecting electrode 668 are formed. Source wirings (a laminate of layers 633a and 633b) are electrically connected with a pixel TFT by the connecting electrode 668. The gate wiring 669 is electrically connected with a gate electrode of the TFT pixel. A pixel electrode 670 is electrically connected with a drain region 690 of the pixel TFT. Furthermore, the pixel electrode 670 is electrically connected with an island-like semiconductor layer 685 functioning as one electrode forming a storage capacitor. In the present invention, the pixel electrode and the connecting electrode are made by same material. However, a material having excellent reflectivity such as a film mainly containing Al or Ag or the laminate film may be used for the pixel electrode 670.

In this way, a CMOS circuit including an n-channel TFT 681 and a p-channel TFT 682, the driver circuit 686 including a n-channel TFT 683, and the pixel portion 687 having the pixel TFT 684 and the storage capacitor 685 can be formed on the same substrate. Thus, an active matrix substrate is completed.

The n-channel TFT 681 of the driver circuit 686 has a channel forming region 637, a low density impurity area 636 overlapping with the first conductive layer 628a, which constructs a part of the gate electrode (gate overlapped LDD (GOLD) area), and a high density impurity area 652 functioning as the source region or the drain region. The p-type channel TFT 682 forming a CMOS circuit together with the n-channel TFT 681, which are connected by an electrode 666, has a channel forming region 640, a high density impurity area 653 functioning as the source region or the drain region, and an impurity area 654 to which p-type doping impurity elements are implanted. The n-channel TFT 683 has a channel forming region 643, a low density impurity area 642 overlapping with the first conductive layer 630a, which constructs a part of the gate electrode, (GOLD area), and a high density impurity area 656 functioning as the source region or the drain region.

The pixel TFT 684 of the pixel portion has a channel forming region 646, a low density impurity area 645 formed outside of the gate electrode (LDD region) and a high density impurity area 658 functioning as the source region or the drain region. An n-type doping impurity element and a p-type doping impurity element are added to an island-like semiconductor layer functioning as one electrode of the storage capacitor 685. The storage capacitor 685 is formed by an electrode (a laminate of layers 632a and 632b) and an island-like semiconductor layer by using the insulating film 616 as a dielectric.

The pixel structure in this example is arranged such that light can be blocked in a space between pixel electrodes and the ends of the pixel electrodes can overlap with the source wiring without using the black matrix.

This example can be implemented by combining with Examples 1 to 7.

Example 9

Figure 27:
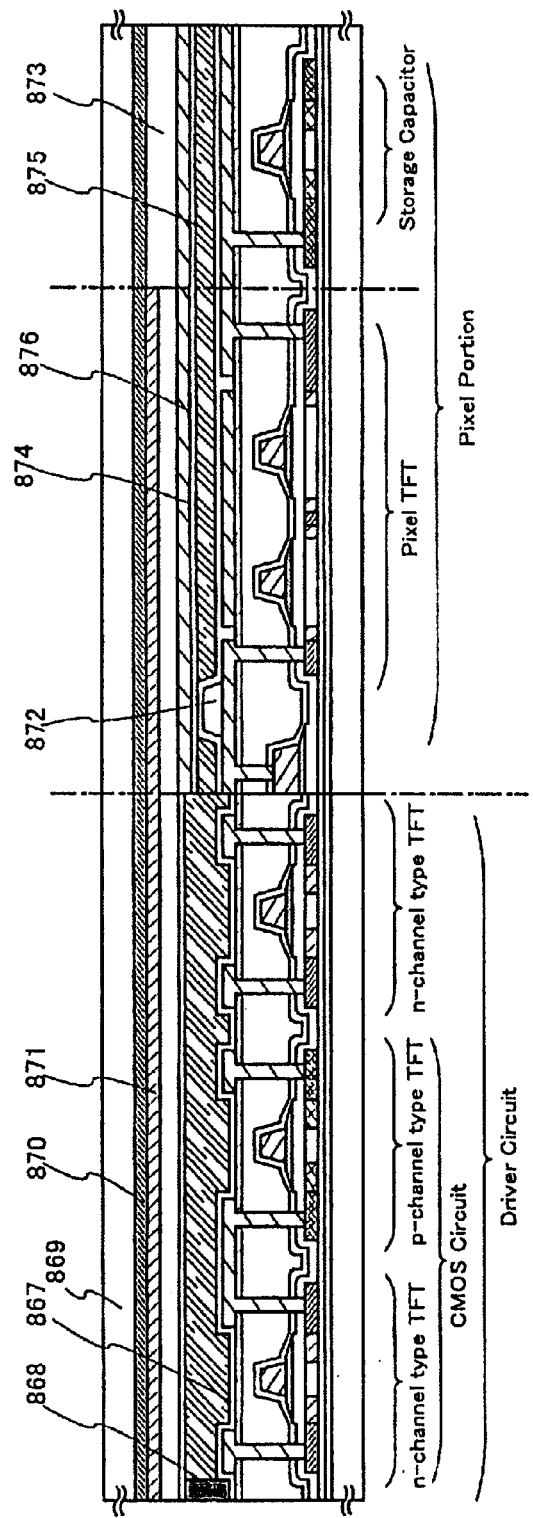
FIG. 27 is a view of a liquid crystal display manufactured using the laser apparatus of the invention.

This example explains, below, a process to manufacture a reflection type liquid crystal display device from the active matrix substrate formed in Example 8 with reference to FIG. 27.

First, after obtaining an active matrix substrate in the state of FIG. 26 according to Example 8, an orientation film 867 is formed at least on the pixel electrodes 670 on the active matrix substrate of FIG. 26 and subjected to a rubbing process. Incidentally, in this example, prior to forming an orientation film 867, an organic resin film such as an acryl resin film is patterned to form columnar spacers 872 in a desired position to support the substrates with spacing. Meanwhile, spherical spacers, in place of the columnar spacers, may be distributed over the entire surface of the substrate.

Then, a counter substrate 869 is prepared. Then, coloring layers 870, 871 and a planarizing film 873 are formed on a counter substrate 869. A shade portion is formed by overlapping a red coloring layer 870 and a blue coloring layer 871 together. Meanwhile, the shade portion may be formed by partly overlapping a red coloring layer and a green coloring layer.

In this example is used a substrate shown in Example 7. There is a need to shade at least the gap between the gate wiring 669 and the pixel electrode 670, the gap between the gate wiring 669 and the connecting electrode 668 and the gap between the connecting electrode 668 and the pixel electrode 670. In this example were bonded together the substrates by arranging the coloring layers so that the shading portion having a lamination of coloring layers is overlapped with the to-be-shading portion.

In this manner, the gaps between the pixels are shaded by the shading portion having a lamination of coloring layers without forming a shading layer such as a black mask, thereby enabling to reduce the number of processes.

Then, a counter electrode 876 of a transparent conductive film is formed on the planarizing film 873 at least in the pixel portion. An orientation film 874 is formed over the entire surface of the counter substrate and subjected to a rubbing process.

Then, the active matrix substrate formed with the pixel portion and driver circuit and the counter substrate are bonded together by a seal member 868. The seal member 868 is mixed with filler so that the filler and the columnar spacers bond together the two substrates through an even spacing. Thereafter, a liquid crystal material 875 is poured between the substrates, and completely sealed by a sealant (not shown). The liquid crystal material 875 may be a known liquid crystal material. In this manner, completed is a reflection type liquid crystal display device shown in FIG. 27. If necessary, the active matrix substrate or counter substrate is divided into a desired shape. Furthermore, a polarizing plate (not shown) is bonded only on the counter substrate. Then, an FPC is bonded by a known technique.

The liquid crystal display device manufactured as above comprises TFT manufactured by a semiconductor film, wherein a laser light having a periodic or uniform energy distribution is irradiated and a crystal grain with a large grain size is formed. Thus, the liquid crystal display device ensures a good operational characteristic and high reliability. The liquid crystal display device can be used as a display portion for an electronic appliance in various kinds.

Incidentally, this example can be implemented by combining with Examples 1 to 8.

Example 10

This example explains an example of manufacturing a light emitting device by using a method of manufacturing TFTs which is used in manufacturing the active matrix substrate described in Example 8. In this specification, the light emitting device refers, generally, to the display panel having light emitting elements formed on a substrate sealed between the substrate and a cover member, and the display module having TFTs or the like mounted on the display panel. Incidentally, the light emitting element has a layer including an organic compound that electroluminescence caused is obtained by applying an electric field (light emitting layer), an anode layer and a cathode layer. Meanwhile, the electroluminescence in compound includes the light emission upon returning from the singlet-excited state to the ground state (fluorescent light) and the light emission upon returning from the triplet-excited state to the ground state (phosphorous light), including any or both of light emission.

Note that, all the layers that are provided between an anode and a cathode in a light emitting element are defined as an organic light emitting layer in this specification. Specifically, the organic light emitting layer includes a light emitting layer, a hole injection layer, an electron injection layer, a hole transporting layer, an electron transporting layer, etc. A basic structure of a light emitting element is a laminate of an anode layer, a light emitting layer, and a cathode layer layered in this order. The basic structure can be modified into a laminate of an anode layer, a hole injection layer, a light emitting layer, and a cathode layer layered in this order, or a laminate of an anode layer, a hole injection layer, a light emitting layer, an electron transporting layer, and a cathode layered in this order.

Figure 28A:
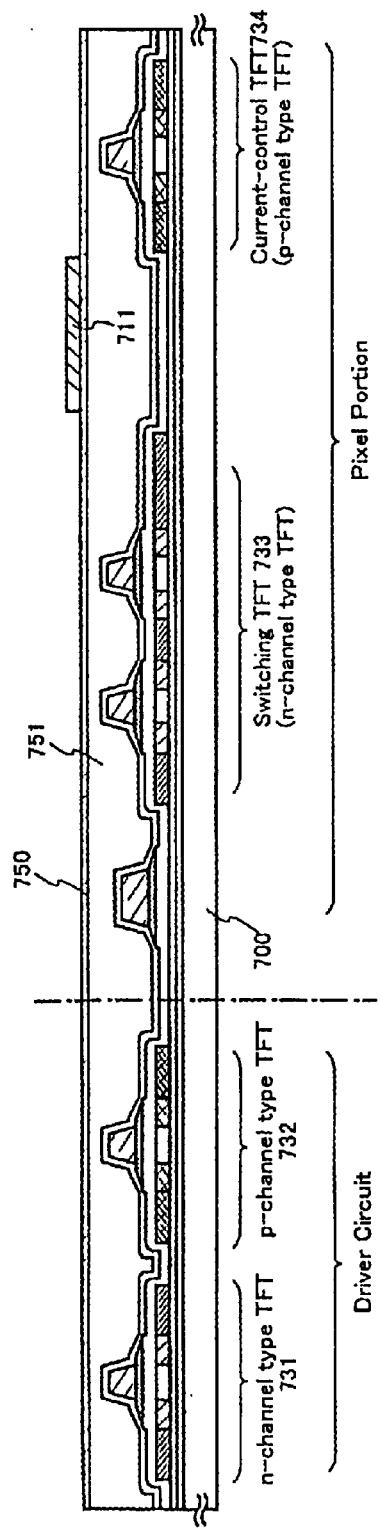
FIGS. 28A and 28B are views showing a method of manufacturing a light emitting apparatus using the laser apparatus of the invention.

FIG. 28A is a sectional view of a light emitting device of the example manufactured at the point of forming a third interlayer insulating film 750. In FIG. 28A, the switching TFT 733 and the current control TFT 734 provided on the substrate 700 are formed by using the manufacturing method of Example 8. Incidentally, although this example is of a double gate structure formed with two channel forming regions, it is possible to use a single gate structure formed with one channel forming region or a triple gate structure formed with three channel forming regions. Further, although this example is of a single gate structure formed with one channel forming region, it is possible to use a structure formed with two or more channel forming regions.

The n-channel TFT 731 and the p-channel TFT 732 included in the driver circuit formed on the substrate 700 are formed by using the manufacturing method of Example 8. Incidentally, although this example is of a single gate structure, it is possible to use a double gate structure or a triple gate structure.

In a case of the light emitting device, the third interlayer insulating film 750 is effective in preventing moisture contained in the second interlayer insulating film 751 from intrusion into the organic light emitting layer. When the second interlayer insulating film 751 includes an organic resin material, it is particularly effective to form the third interlayer insulating film 750 since the third interlayer insulating film 750 has a lot of moisture.

A pixel electrode 711 is formed on the third interlayer insulating film 750 in this example when ending up to the process of making the third interlayer insulating film described in Example 8.

Meanwhile, the pixel electrode 711 is a pixel electrode (anode of a light emitting element) formed by a transparent conductive film. As the transparent conductive film can be used a compound of indium oxide and tin oxide, a compound of indium oxide and zinc oxide, zinc oxide, tin oxide or indium oxide. A transparent conductive film added with gallium may also be used. The pixel electrode 711 is formed on the planer third interlayer insulating film 750 prior to forming the wirings. In this example, it is very important to planarize the step due to the TFT by using the second interlayer insulating film 751 made from resin. A light emitting layer to be formed later, because being extremely thin, possibly causes poor light emission due to the presence of a step. Accordingly, it is desired to provide planarization prior to forming a pixel electrode so that a light emitting layer can be formed as planar as possible.

Next, after formation of the pixel electrode 711, contact holes are formed in the gate insulating film 752, the first interlayer insulating film 753, the second interlayer insulating film 751, and the third interlayer insulating film 750, respectively. The pixel electrode 711 is covered to form a conductive film on the third interlayer insulating film 750, thereby forming a resist 760. The conductive film is etched by using the resist 760, and then wirings 701 to 707 electrically connecting to impurity regions of TFTs, respectively, are formed. These wirings are formed by patterning a film laminating a Ti film with a thickness of 50 nm and an alloy film (alloy film of Al and Ti) with a thickness of 500 nm. It is not limited to the two-layer structure but may be a single layer structure or a laminate layers including three or more layers. The materials of the wirings are not limited to Al and Ti. For example, the wiring can be formed by forming Al or Cu on a TaN film and then by patterning the laminate film in which a Ti film is formed (FIG. 28A).

Meanwhile, the wiring 707 is a source wiring of the current control TFT (corresponding to a current supply line) while the wiring 706 is an electrode to be electrically connected with the drain region and the pixel electrode 711 of the current control TFT.

Figure 28B:
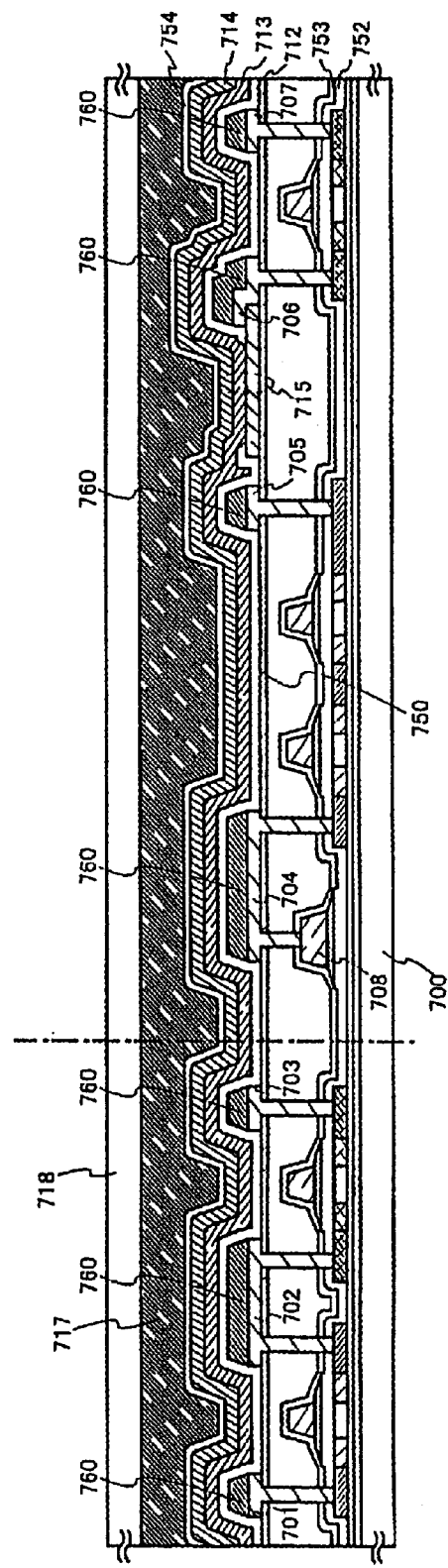

After forming the wirings 701 to 707, a passivation film 712 is formed without removing the resist 760 as described in FIG. 28B. The passivation film 712 is formed so as to cover the wirings 701 to 707, the third interlayer insulating film 750 and the resist 760. The passivation film 712 is formed from an insulating film including a silicon nitride film, silicon oxynitride film, aluminum nitride or aluminum oxynitride. A single layer of one of these films or a lamination of these films is used. Then, the passivation film 712 is etched to expose a part of the pixel electrode 711.

A light emitting layer 713 is formed on the pixel electrode 711. Incidentally, although FIG. 28B shows only one pixel, this example separately forms light emitting layers correspondingly to the respective colors of R (red), G (green) and B (blue). Meanwhile, in this example is formed a low molecular weight organic light emitting material by the deposition method. Specifically, this is a lamination structure having a copper phthalocyanine (CuPc) film provided with a thickness of 20 nm as a hole injecting layer and a tris-8-qyuinolinolato aluminum complex ($Alq_3$) film provided thereon with a thickness of 70 nm as a light emitting layer. The color of emission light can be controlled by adding a fluorescent pigment, such as quinacridone, perylene or DCM1, to $Alq_3$.

However, the foregoing example is an example of organic light emitting material to be used for a light emitting layer and not necessarily limited to this. It is satisfactory to form a light emitting layer (layer for light emission and carrier movement therefore) by freely combining a light emitting layer, a charge transporting layer and a charge injection layer. For example, although in this example was shown the example in which a low molecular weight organic light emitting material is used for a light emitting layer, it is possible to use an intermediate molecular weight organic light emitting material or polymeric organic light emitting material. Note that, in this specification, an intermediate molecular weight organic light emitting material indicates an organic light emitting material having no sublimation property but having molecules in the number of 20 or less or chained molecules having a length of 10 μm or less. As an example of using high molecular organic light emitting material, the laminated pad can be made polythiophene (PEDOT) films with a thickness of 20 nm is provided by spin coating method as a hole injection layer, and paraphenylene-vinylene (PPV) films with a thickness of 100 nm is provided thereon as a light emitting layer. The light emitting wave length can be selected from red through blue by using π-conjugated system polymer of PPV. The inorganic material such as a silicon carbide can be used as a charge transporting layer and a charge injection layer. These organic light emitting material and inorganic light emitting material are formed by using known materials.

Next, a cathode 714 made from a conductive film is provided on the light emitting layer 713. In this example, an alloy film of aluminum and lithium is used as the conductive film. Of course, a known MgAg film (alloy film of magnesium and silver) may be used. As the cathode material may be used a conductive film made from an element belonging to the periodic-table group 1 or 2, or a conductive film added with such an element.

A light emitting element 715 is completed at a time having formed up to the cathode 714. Incidentally, the light emitting element 715 herein refers to a diode formed with a pixel electrode (anode) 711, a light emitting layer 713 and a cathode 714.

A protective film 754 can be provided in such a manner to completely cover the light emitting element 715. The protective film 754 is formed by an insulating film including a carbon film, a silicon nitride film or a silicon oxynitride film, and used is an insulating film in a single layer or a combined lamination.

In such a case, it is preferred to use a film favorable in coverage as a protective film 754. It is effective to use a carbon film, particularly a DLC (diamond-like carbon) film. The DLC film, capable of being deposited in a temperature range of from room temperature to 100° C. or less, can be easily deposited over the light emitting layer 713 low in heat resistance. Meanwhile, the DLC film, having a high blocking effect to oxygen, can suppress the light emitting layer 713 from oxidizing. Consequently, prevented is the problem of oxidation in the light emitting layer 713 during the following seal process.

In this example, the light emitting layer 713 is overlapped completely with a inorganic insulating film having high barrier property such as a carbon film, a silicon nitride, a silicon oxynitride, aluminum nitride, or aluminum oxynitride, so that it can prevent effectively the deterioration of the light emitting layer due to moisture and oxygen from penetrating thereof into the light emitting layer.

Furthermore, it is preferable to use the silicon nitride film formed by sputtering method using silicon as a target for the third interlayer insulating film 750, the passivation film 712, the protective film 754 that the penetration of impurities into the light emitting layer is prevented effectively. The deposition condition may be appropriately selected, preferably, nitride ($N_2$) or a mixed gas of nitride and argon are used for sputtering gas, and sputtering is performed by applying a high frequency electric. The substrate temperature may be set as room temperature, and heating means may be unnecessary to be used. If the organic insulating film and the organic compound layer are formed already, it is preferable that the deposition is conducted without heating the substrate. However, to remove completely absorbed water or occluded water, it is preferable to perform dehydration by heating for several minutes to hours in vacuum at about 50 to 100° C.

The silicon nitride film formed by sputtering method at the condition: at room temperature using silicon as a target; applying 13.56 MHz high frequency electric; and only using nitride gas is characterized in that not only the absorption peak of N—H association and Si—H association are not observed but also the absorption peak of Si—O in the infrared absorption spectrum. The oxide density and the hydrogen density is not more than 1 atomic %. Thus, it can prevent more effectively impurities such as oxygen and water more effectively from penetrating into the light emitting layer.

Furthermore, a seal member 717 is provided to overlap the light emitting layer 715 to bond a cover member 718. For the seal member 717 used may be an ultraviolet curable resin. It is effective to provide therein a substance having a hygroscopic effect or an antioxidant effect. Meanwhile, in this example, for the cover member 718 used is a glass substrate, quartz substrate or plastic substrate (including a plastic film) having carbon films (preferably diamond-like carbon films) formed on the both surfaces thereof.

Thus, completed is a light emitting device having a structure as shown in FIG. 28B. Incidentally, it is effective to continuously carry out, without release to the air, the process to form a protective film after forming a passivation film 712 by using a deposition apparatus of a multi-chamber scheme (or in-line scheme). In addition, with further development it is possible to continuously carry out the process up to bonding a cover member 718, without release to the air.

In this manner, n-channel TFT 731, p-channel TFT 732, a switching TFT (n-channel TFT) 733 and a current control TFT (p-channel TFT) 734 are formed on the substrate 700.

Furthermore, as was explained using FIG. 28, by providing an impurity region overlapped with the gate electrode through an insulating film, it is possible to form an n-channel TFT resistive to the deterioration resulting from hot-carrier effect. Consequently, a reliable light emitting device can be realized.

Meanwhile, this example shows only the configuration of the pixel portion and the driver circuit. However, according to the manufacturing process in this example, besides there, it is possible to form logic circuits such as a signal division circuit, a D/A converter, an operation amplifier, a γ-correction circuit on a same insulator. Furthermore, a memory or microprocessor can be formed.

The light emitting device manufactured as above comprises TFT manufactured by a semiconductor film, wherein a laser light having a periodic or uniform energy distribution is irradiated and a crystal grain with a large grain size is formed. Thus, the light emitting device ensures a good operational characteristic and high reliability. Thus, the light emitting device can be used as a display portion for an electronic appliance in various kinds.

Note that, the light emitting element may take a form formed by a material in which a hole injection layer, an electron injection layer, a hole transportation layer or an electron transportation layer is formed as an inorganic compound or as an inorganic compound is mixed with an organic compound. Further, a part of these layers may be mixed each other.

Incidentally, this example can be implemented by combining with any one of Examples 1 to 8.

Example 11

Given as embodiments of electric equipment employing a semiconductor device formed by the laser apparatus of the present invention is applied are: a video camera; a digital camera; a goggle type display (head mounted display); a navigation system; an audio reproducing device (car audio, an audio component, and the like); a laptop computer; a game machine; a portable information terminal (a mobile computer, a cellular phone, a portable game machine, an electronic book, etc.); and an image reproducing device equipped with a recording medium (specifically, a device equipped with a display device which can reproduce a recording medium such as a digital versatile disk (DVD), and can display the image). Specific examples of the electric equipment are shown in FIGS. 29A to 29H.

Figure 29A:
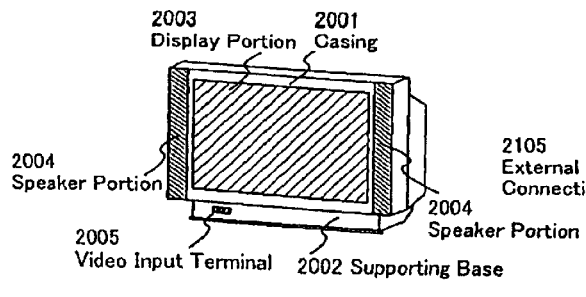
FIGS. 29A, 29B, 29C, 29D, 29E, 29F, 29G and 29H are views of electronic equipment employing the semiconductor device of the invention.

FIG. 29A shows a display device, which comprises a casing 2001, a supporting base 2002, a display portion 2003, speaker portions 2004, a video input terminal 2005, etc. The semiconductor device formed by the present invention is applied can be used for the display portion 2003. The semiconductor device is self-luminous and does not need a backlight, so that it can make a thinner display portion than liquid display devices can. The term display device includes every display device for displaying information such as one for a personal computer, one for receiving TV broadcasting, and one for advertisement.

Figure 29B:
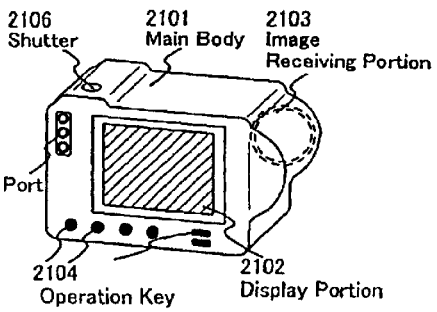

FIG. 29B shows a digital still camera, which comprises a main body 2101, a display portion 2102, an image receiving portion 2103, operation keys 2104, an external connection port 2105, a shutter 2106, etc. The semiconductor device formed by the present invention is applied can be used for the display portion 2102, and other circuits.

Figure 29C:
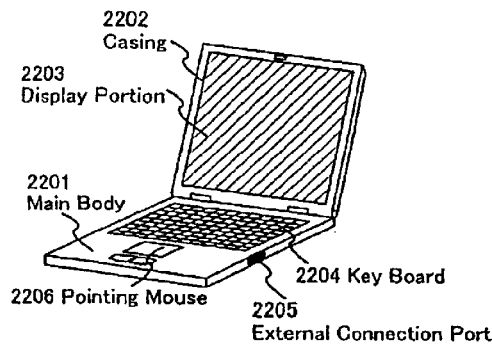

FIG. 29C shows a laptop computer, which comprises a main body 2201, a casing 2202, a display portion 2203, a keyboard 2204, an external connection port 2205, a pointing mouse 2206, etc. The semiconductor device formed by the present invention is applied can be used for the display portion 2203, and other circuits.

Figure 29D:
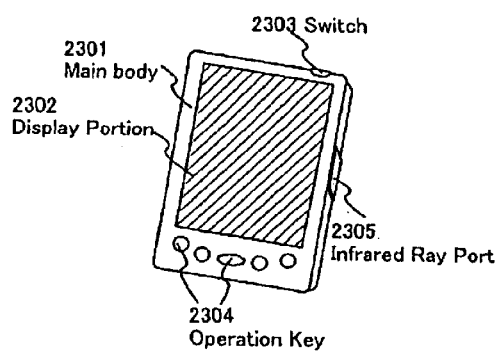

FIG. 29D shows a mobile computer, which comprises a main body 2301, a display portion 2302, a switch 2303, operation keys 2304, an infrared ray port 2305, etc. The semiconductor device formed by the present invention is applied can be used for the display portion 2302, and other circuits.

Figure 29E:
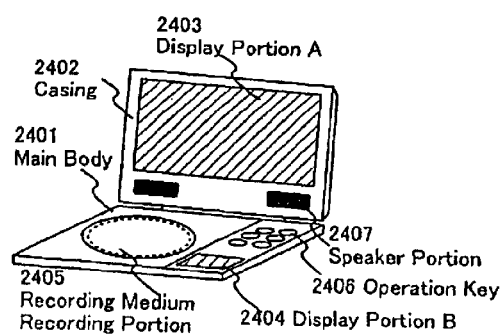

FIG. 29E shows a portable image reproducing device equipped with a recording medium (a DVD player, to be specific). The device comprises a main body 2401, a casing 2402, a display portion A 2403, a display portion B 2404, a recording medium (DVD or the like) reading portion 2405, operation keys 2406, speaker portions 2407, etc. The display portion A 2403 mainly displays image information whereas the display portion B 2404 mainly displays text information. The semiconductor device formed by the present invention is applied can be used for the display portions A 2403 and B 2404, and other circuits. The term image reproducing device equipped with a recording medium includes domestic game machines.

Figure 29F:
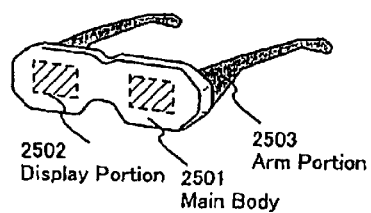

FIG. 29F shows a goggle type display (head mounted display), which comprises a main body 2501, display portions 2502, and arm portions 2503. The semiconductor device formed by the present invention is applied can be used for the display portions 2502, and other circuits.

Figure 29G:
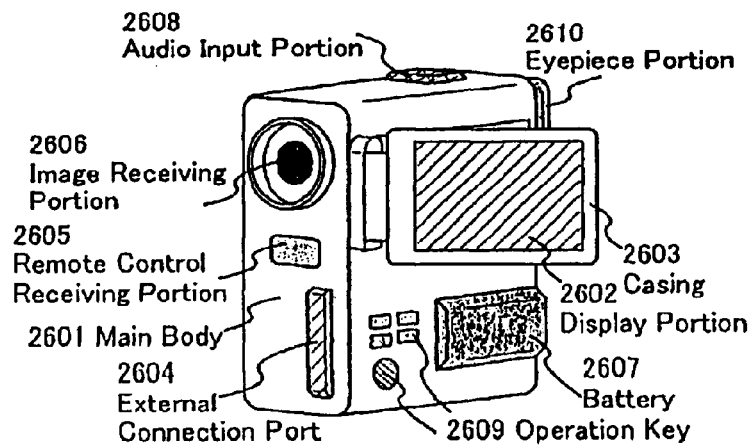

FIG. 29G shows a video camera, which comprises a main body 2601, a display portion 2602, a casing 2603, an external connection port 2604, a remote control receiving portion 2605, an image receiving portion 2606, a battery 2607, an audio input portion 2608, operation keys 2609, eyepiece portion 2610 etc. The semiconductor device formed by the present invention is applied can be used for the display portion 2602, and other circuits.

Figure 29H:
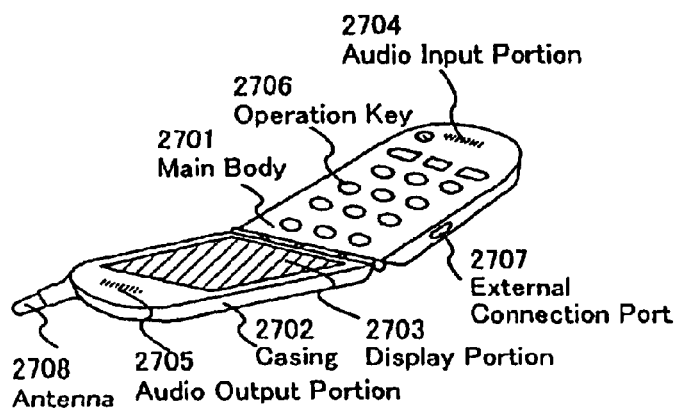

FIG. 29H shows a cellular phone, which comprises a main body 2701, a casing 2702, a display portion 2703, an audio input portion 2704, an audio output portion 2705, operation keys 2706, an external connection port 2707, an antenna 2708, etc. The semiconductor device formed by the present invention is applied can be used for the display portion 2703, and other circuits. If the display portion 2703 displays white characters on a black background, power consumption of the cellular phone can be reduced.

The light emitting device can be used also in a front or rear projector besides above-mentioned electronic apparatuses.

As described above, the application range of the present invention is very wide and the present invention can be used for electric equipments in various fields. The electric equipments in this example may use any configuration of semiconductor devices shown in Examples 1 to 10.

Example 12

In the present example, an explanation will be given to an arrangement of a laser apparatus capable of changing the scanning direction of a laser beam universally in the first and second irradiation in accordance with the direction in which carriers move in the channel forming region of the active layer.

Figure 31A:
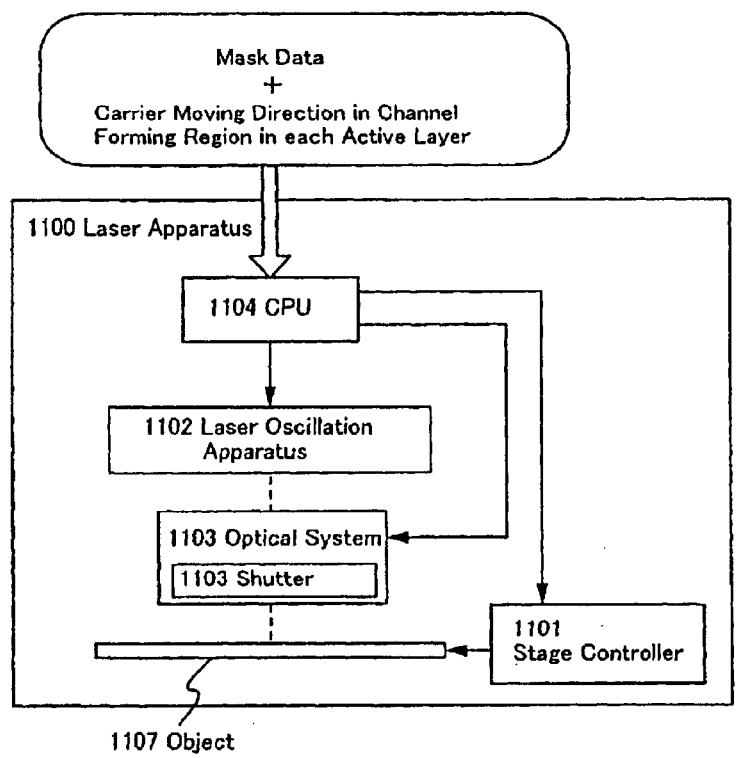
FIGS. 31A and 31B are views showing a structure of the laser apparatus of the invention and a view showing a direction in which a laser beam moves on an object to be processed.

FIG. 31 shows an arrangement of a laser apparatus 1100 of the present example. The laser apparatus 1100 includes a stage controller 1101 that corresponds to first means for controlling the irradiation position of a laser beam on an object to be processed. In FIG. 31, it is possible to move (scan) the irradiation position of a laser beam or change the scanning direction of a laser beam by changing the position of the substrate using the stage controller 1101. It should be appreciated, however, that the invention is not limited to the foregoing arrangement. A laser beam may be scanned or the scanning direction of a laser beam may be changed through the use of an optical system.

Also, the laser apparatus 1100 includes a laser oscillating apparatus 1102 that corresponds to second means for oscillating a laser beam. FIG. 31 shows a case where a single laser oscillating apparatus 1102 is provided. It should be appreciated, however, that the number of the laser oscillating apparatus 1102 included in the laser apparatus 1100 of the invention is not limited to one. Beam spots of laser beams respectively outputted from the laser oscillating apparatuses may be superimposed with one another so as to be used as a single beam spot.

Also, the laser apparatus 1100 of the invention includes an optical system 1103 that corresponds to third means for processing a beam spot of a laser beam oscillated from the laser oscillating apparatus 1102 on an object to be processed. Further, the optical system 1103 is provided with a shutter 1105 that can temporarily block a laser beam outputted from the laser oscillating apparatus 1102. By using the shutter 1105, irradiation of a laser beam to an object 1107 to be processed can be suspended without stopping an output of a laser beam from the laser oscillating apparatus 1102, thereby making it possible to maintain the output of a laser beam at a constant level.

In a case where more than one laser oscillating apparatus is used, beam spots of laser beams outputted from the respective laser oscillating apparatuses may be superimposed with one another so as to form a single beam spot through the use of the optical system.

Further, the laser apparatus 1100 includes a CPU 1104 that corresponds to fourth means. The CPU 1104 is able to control oscillation of the laser oscillating apparatus 1102, while controlling the stage controller 1101 that corresponds to the first means in such a manner that a beam spot of a laser beam covers a portion defined by the data of a mask. Further, the CPU 1104 controls an operation of the shutter 1105 and is thus able to suspend irradiation of a laser beam to the object 1107 to be processed.

Further, in the present example, besides the data of the mask, the direction in which the carriers move in the channel forming regions of the respective active layers is inputted into the CPU 1104. Accordingly, the scanning direction a laser beam and an portion to be irradiated are determined in such a manner that the direction in which the carriers move and the scanning direction of a laser beam in the first or second irradiation are parallel to each other in the respective active layers.

Figure 31B:
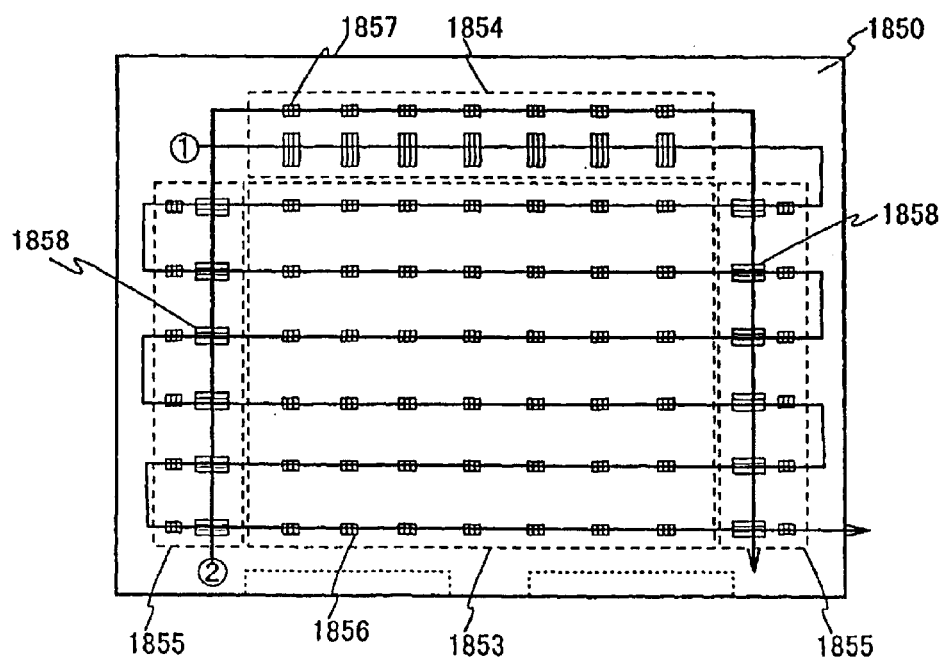

With reference to FIG. 31(B), an explanation will be given to a relation between the scanning direction of a laser beam on the semiconductor film and the layout of the active layers in the respective circuits when the object 1107 to be processed is an active matrix type semiconductor device.

Referring to FIG. 31(B), a semiconductor film 1850 is formed on a substrate. A portion enclosed by a broken line 1853 is a portion where a pixel portion is formed, and the pixel portion 1853 is provided with a plurality of portions 1856 to be used as active layers. A portion enclosed by a broken line 1854 is a portion where a signal line driving circuit is formed, and the signal line driving circuit 1854 is provided with a plurality of portions 1857 to be used as active layers. A portion enclosed by a broken line 1855 is a portion where a scanning line driving circuit is formed and the scanning line driving circuit 1855 is provided with a plurality of portions 1858 to be used as active layers.

An arrow indicated by <1> denotes the scanning direction of a laser beam in the first irradiation, and a laser beam is irradiated to the portions 1856, 1857, and 1858 to be used as the active layers. An arrow indicated by <2> denotes the scanning direction of a laser beam in the second irradiation, and a laser beam is irradiated to the portions 1857 and 1858 to be used as the active layers.

In the present example, the scanning direction of a laser beam in the second irradiation of a laser beam is changed in the signal line driving circuit 1854 from that in the scanning line driving circuit 1855, and the scanning directions cross with each other. Of a plurality of the portions 1856, 1857, and 1858 to be used as the active layers in the respective circuits, only the portions, in which the scanning direction of a laser beam in the first irradiation is not parallel to the direction in which the carriers move in the channel forming region, are irradiated by a laser beam in the second irradiation, whose scanning direction is parallel to the direction in which the carriers move. Further, as to the portions in which the moving direction of the carrier is matched with the scanning direction of a laser beam in the first irradiation but is not matched with the scanning direction of a laser beam in the second irradiation, it is possible to prevent a laser beam from being irradiated in the second irradiation through the use of the shutter 1105 even when these portions are laid out in the scanning path of a laser beam in the second irradiation. According to the above arrangement, restrictions on the layout of the active layers imposed by the scanning direction of a laser beam can be mitigated, which makes it easier to design the mask.

The present example can be implanted in a combination with any one of Examples 1 through 11 above.

Example 13

In the present example, an explanation will be given to an example of a laser oscillating apparatus that does not superimpose beam spots of laser beams respectively outputted from a plurality of laser oscillating apparatuses with one another.

Figure 32:
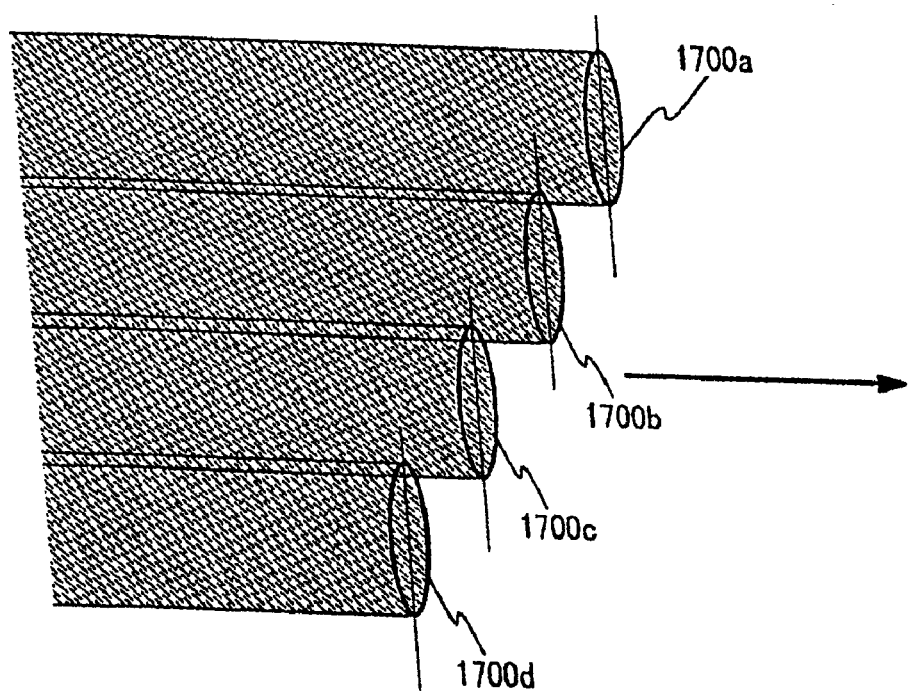
FIG. 32 is a view showing the shapes of laser beams.

FIG. 32 shows the shapes of beam spots of a laser apparatus of the present example. Referring to FIG. 32, a plurality of beam spots 1700 are formed on an object to be processed. The present example shows a case where four beam spots 1700a through 1700d are used. It should be appreciated, however, that the number of beam spots is not limited to four.

In the present example, the shape of the beam spot is an elliptical shape. It should be appreciated, however, that the invention is not limited to the foregoing arrangement. The respective beam spots are scanned in the direction indicated by an arrow. Also, the respective beam spots keep a certain space in between in the direction indicated by the arrow.

When the beam spots are scanned in the direction indicated by the arrow, the respective beam spots are superimposed so that their respective traces are superimposed with one another.

Hence, in FIG. 32, the beam spot 1700b is superimposed on a portion (trace) irradiated by the beam spot 1700a, and crystallization takes place at the portion irradiated by the beam spot 1700b using the portion irradiated by the beam spot 1700a as the seed crystals. Likewise, the beam spot 1700c is superimposed on a portion irradiated by the beam spot 1700b, and crystallization takes place at the portion irradiated by the beam spot 1700c using the portion irradiated by the beam spot 1700b as the seed crystals. Likewise, the beam spot 1700d is superimposed on a portion irradiated by the beam spot 1700c, and crystallization takes place at the portion irradiated by the beam spot 1700d using the portion irradiated by the beam spot 1700c as the seed crystals.

According to the above arrangement, it is possible to control the orientations and the sizes of crystal grain at the portions where laser beams are irradiated.

The present example can be implemented in a combination with any one of Examples 1 through 12 above.

Example 14

Figure 33:
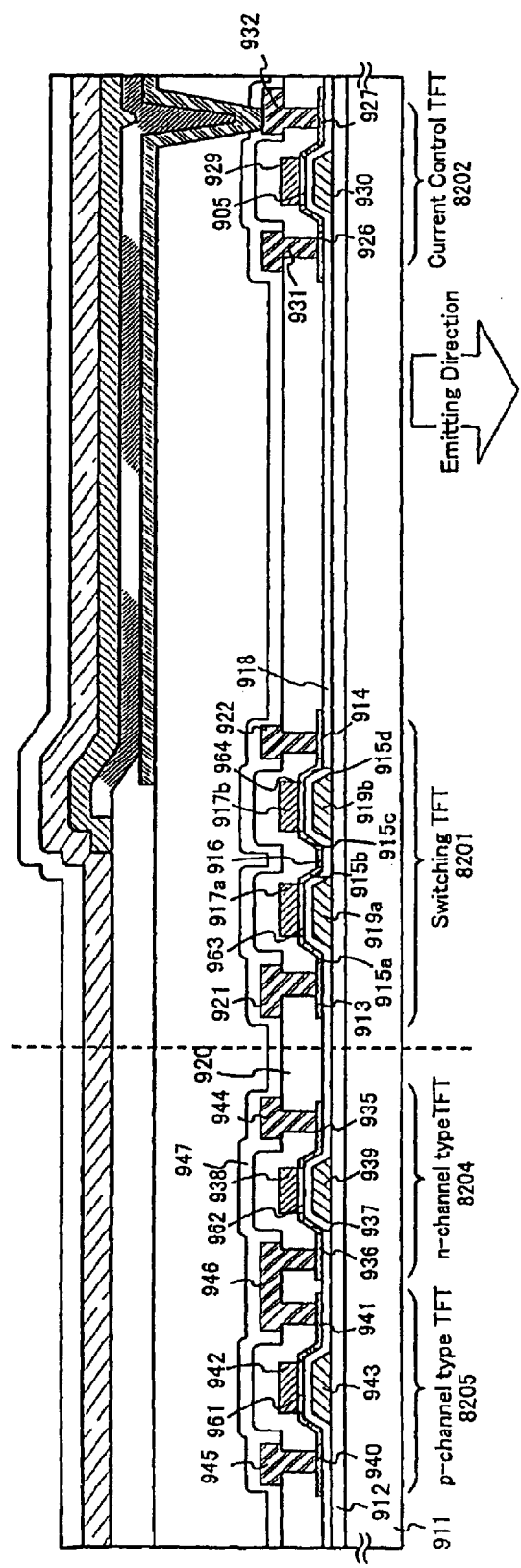
FIG. 33 is a cross section of a light emitting apparatus using the laser apparatus of the invention.

This example describes a pixel configuration of a light emitting device that is one of a semiconductor device of the present invention. FIG. 33 shows a cross-sectional view of a pixel of the light emitting device of this example.

Reference numeral 911 denotes a substrate and reference numeral 912 denotes an insulating film which becomes a base (hereafter referred to as a base film) in FIG. 33. A light transmitting substrate, typically a glass substrate, a quartz substrate, a glass ceramic substrate, or a crystalline glass substrate can be used as the substrate 911. However, the substrate used must be one able to withstand the highest process temperature during the manufacturing processes.

Reference numeral 8201 denotes a switching TFT, reference numeral 8202 denotes a current controlling TFT, and both are formed by n-channel TFT and p-channel TFTs respectively. When the direction of light emitted from the light emitting layer is toward bottom of the substrate (surface where TFTs and the organic light emitting layer are not formed), the above structure is preferable. However, the switching TFT and the current controlling TFT may be either n-channel TFTs or p-channel TFTs.

The switching TFT 8201 has: an active layer containing a source region 913, a drain region 914, LDD regions 915a to 915d, a separation region 916, and channel forming regions 963 and 964; a gate insulating film 918; gate electrodes 919a and 919b; a first interlayer insulating film 920; a source signal line 921; and a drain wiring 922. Note that the gate insulating film 918 or the first interlayer insulating film 920 may be common among all TFTs on the substrate, or may differ depending upon the circuit or the element.

Furthermore, the switching TFT 8201 shown in FIG. 33 is electrically connected to the gate electrodes 919a and 919b, becoming namely a double gate structure. Not only the double gate structure, but also a multi gate structure (a structure containing an active layer having two or more channel forming regions connected in series) such as a triple gate structure, may of course also be used.

The multi gate structure is extremely effective in reducing the off current, and provided that the off current of the switching TFT is sufficiently lowered, a storage capacitor connected to the gate electrode of the current controlling TFT 8202 can have its capacitance reduced to the minimum necessary. Namely, the surface area of the storage capacitor can be made smaller, and therefore using the multi gate structure is effective in expanding the effective light emitting surface area of the light emitting elements.

In addition, the LDD regions 915a to 915d are formed so as not to overlap the gate electrodes 919a and 919b through the gate insulating film 918 in the switching TFT 8201. This type of structure is extremely effective in reducing the off current. Furthermore, the length (width) of the LDD regions 915a to 915d may be set from 0.5 to 3.5 μm, typically between 2.0 and 2.5 μm. Further, when using a multi gate structure having two or more gate electrodes, the separation region 916 (a region to which the same impurity element, at the same concentration, as that added to the source region or the drain region, is added) is effective in reducing the off current.

Next, the current controlling TFT 8202 is formed having an active layer containing a source region 926, a drain region 927, and a channel forming region 905; the gate insulating film 918; a gate electrode 930, the first interlayer insulating film 920; a source signal line 931; and a drain wiring 932. The current controlling TFT 8202 is a p-channel TFT in this example.

Further, the drain region 914 of the switching TFT 8201 is connected to the gate electrode 930 of the current controlling TFT 8202. Although not shown in the figure, specifically the gate electrode 930 of the current controlling TFT 8202 is electrically connected to the drain region 914 of the switching TFT 8201 through the drain wiring (also referred to as a connection wiring) 922. The gate electrode 930 is a single gate structure in this example, however, the multi gate structure can be also applied. The source wiring 931 of the current controlling TFT 8202 is connected to a power source supply line (not shown in the figure).

The structures of the TFTs formed within the pixel are explained above, but a driver circuit is also formed simultaneously at this point. A CMOS circuit, which becomes a basic unit for forming the driver circuit, is shown in FIG. 33.

A TFT having a structure in which hot carrier injection is reduced without an excessive drop in the operating speed is used as an n-channel TFT 8204 of the CMOS circuit in FIG. 33. Note that the term driver circuit indicates a source signal line driving circuit and a gate signal line driving circuit here. It is also possible to form other logic circuit (such as a level shifter, an A/D converter, and a signal division circuit).

An active layer of the n-channel TFT 8204 of the CMOS circuit contains a source region 935, a drain region 936, an LDD region 937, and a channel forming region 962. The LDD region 937 overlaps with a gate electrode 939 through the gate insulating film 918.

Formation of the LDD region 937 on only the drain region 936 side is so as not to have dropped the operating speed. Further, it is not necessary to be very concerned about the off current with the n-channel TFT 8204, and it is good to place more importance on the operating speed. Thus, it is desirable that the LDD region 937 is made to completely overlap the gate electrode to decrease a resistance component to a minimum. It is therefore preferable to eliminate so-called offset.

Furthermore, there is almost no need to be concerned with degradation of a p-channel TFT 8205 of the CMOS circuit, due to hot carrier injection, and therefore no LDD region need be formed in particular. Its active layer therefore contains a source region 940, a drain region 941, and a channel forming region 961, and a gate insulating film 918 and a gate electrode 943 are formed on the active layer. It is also possible, of course, to take measures against hot carrier injection by forming an LDD region similar to that of the n-channel TFT 8204.

Reference numerals 942, 938, 917a, 917b and 929 are masks to form the channel forming regions 961 to 964 and 905.

Further, the n-channel TFT 8204 and the p-channel TFT 8205 have source wirings 944 and 945, respectively, on their respective source regions, through the first interlayer insulating film 920. In addition, the drain regions of the n-channel TFT 8204 and the p-channel TFT 8205 are mutually connected electrically by a drain wiring 946.

The laser apparatus of the present invention can be employed for the crystallization of the active layer, the activation, or other processes using laser annealing.

Incidentally, the structure of this example may be implemented by freely combining with Examples 1 to 13.

Example 15

In the present example, an explanation will be given to a relation of a distance between the centers of the respective beam spots versus the energy density when beam spots are superimposed.

Figure 34:
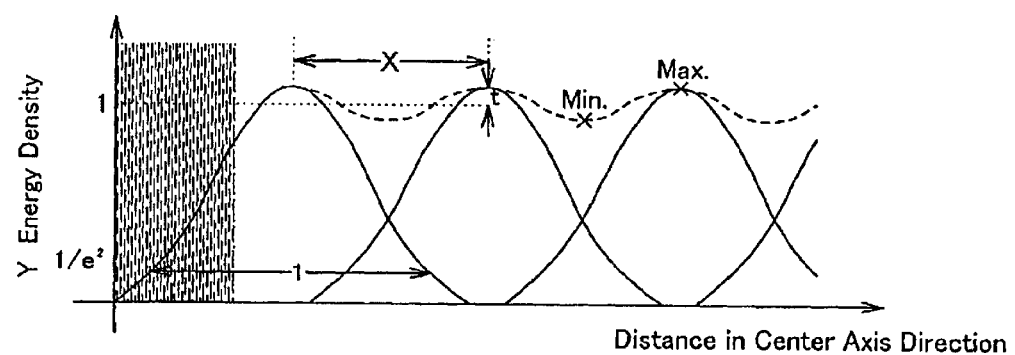
FIG. 34 is a view showing the distribution of the energy density in the central axis direction of superimposed beam spots.

In FIG. 34, the distributions of the energy densities in the central axis direction of the respective beam spots are indicated by a solid line, and the distribution of the energy density of a synthesized beam spot is indicated by a broken line. The value of the energy density in the central axis direction of a beam spot generally follows the Gaussian distribution.

Figure 35:
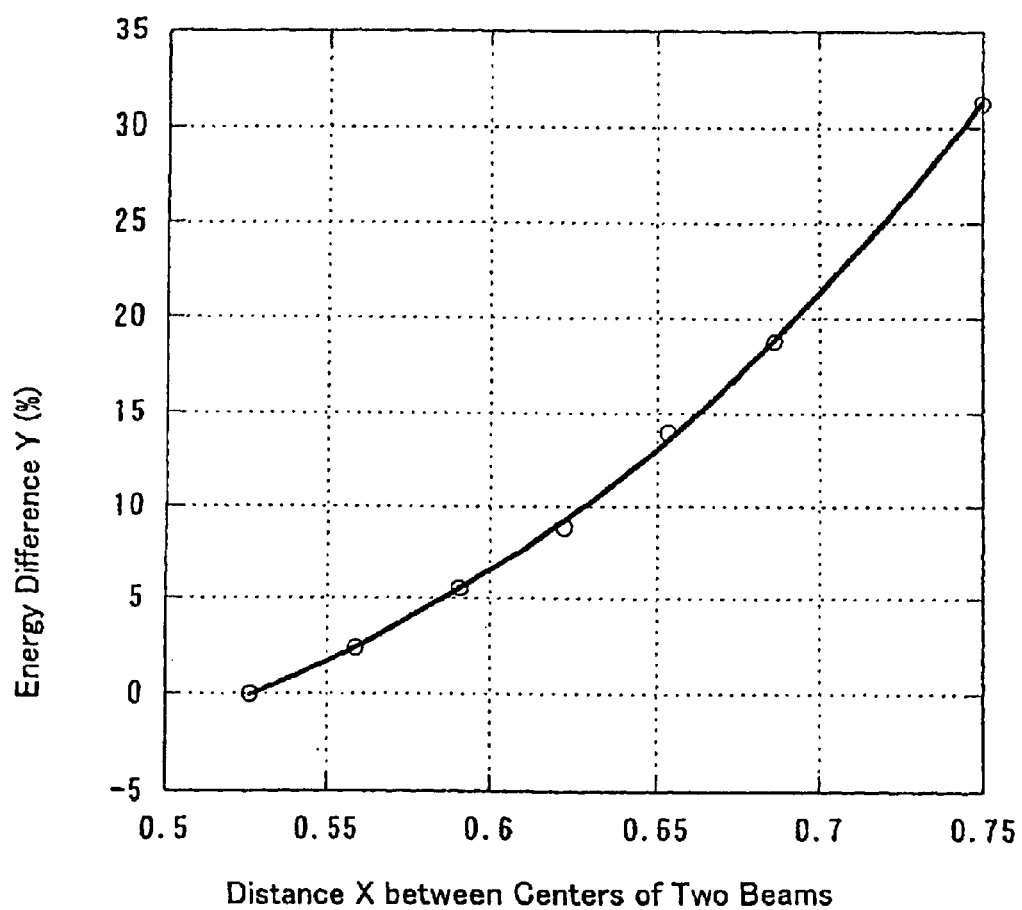
FIG. 35 is a view showing a relation of the distance between the centers of beam spots versus an energy difference.

Let X be the distance between the respective peaks when 1 is given as the distance in the central axis direction such that satisfies the energy density of $1/e^2$ or greater of the peak value in the beam spots before being synthesized. Also, let Y be an increment of the peak value in the peak value after the synthesis from the average value of the valley values in the synthesized beam spot. Then, a relation between X and Y found through simulations is set forth in FIG. 35. In FIG. 35, Y is expressed as a percentage.

In FIG. 35, the energy difference Y is expressed by Equation 1 below, which is an approximate expression.

$$Y = 60 - 293X + 340X^2 \qquad \text{[Equation 1]}$$

where X is one of two solutions whichever is the greater.

According to Equation 1, it is understood that when the energy density of approximately 5% is desired, the arrangement is made such that X.0.584. It is ideal that Y=0, which, however, shortens the length of a beam spot, and therefore, it is preferable to determine X by taking the balance with the throughput into consideration.

Figure 36:
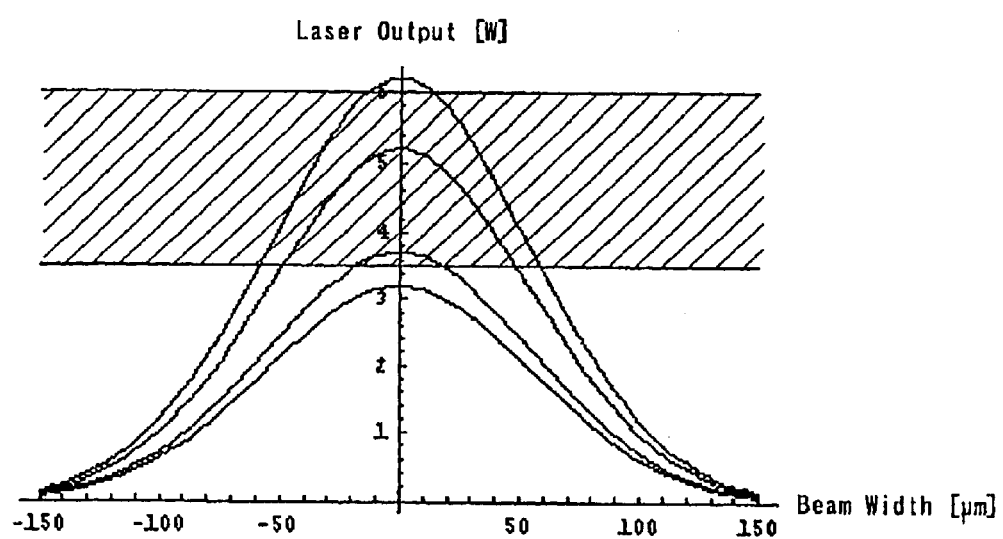
FIG. 36 is a view showing the distribution of output energy in the central axis direction of a beam spot.

An allowable range of Y will now be explained. FIG. 36 shows the distribution of an output (W) from a YVO$_4$ laser with respect to a beam width in the central axis direction when a beam spot is of an elliptical shape. The region hatched by diagonal lines is the range of output energy needed to obtain satisfactory crystalline characteristics, and it is understood that the output energy of the synthesized laser beam has to fall within the range from 3.5 to 6 W.

When the maximum value and the minimum value of the output energy of the synthesized beam spot narrowly fall within the output energy range needed to obtain the satisfactory crystalline characteristics, the energy difference Y such that attains the satisfactory crystalline characteristics reaches the maximum. Hence, in the case of FIG. 36, the energy difference Y is ±26.3%, and it is understood that the satisfactory crystalline characteristics can be obtained when the energy difference Y falls within the above-specified range.

The range of output energy needed to obtain the satisfactory crystalline characteristics varies with to which extent the crystalline characteristics are judged as satisfactory, and the distribution of the output energy varies with the shape of the beam spot. For these reasons, the allowable range of the-energy difference Y is not necessarily limited to the above-specified values. The designer has to set a range of output energy needed to obtain the satisfactory crystalline characteristics as occasion demands and set the allowable range of the energy difference Y from the distribution of the output energy of the laser used.

The present example can be implemented in a combination with Examples 1 through 14 above.

Example 16

An arrangement of a pixel in a light emitting apparatus of the invention will now be explained with reference to FIG. 37.

Figure 37:
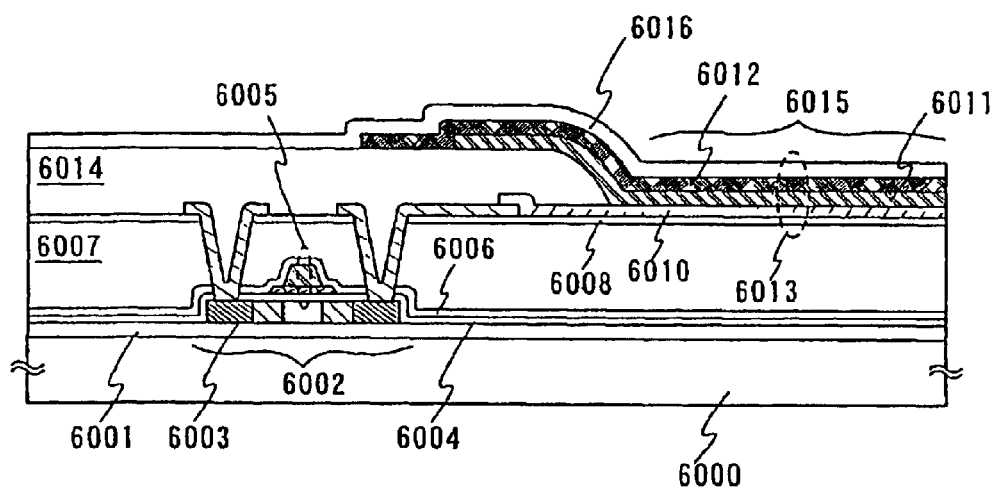
FIG. 37 is a cross section of a light emitting apparatus manufactured using the laser apparatus of the invention.

Referring to FIG. 37, a base film 6001 is formed on a substrate 6000, and a transistor 6002 is formed on the base film 6001. The transistor 6002 includes an active layer 6003, a gate electrode 6005, and a gate insulation film 6004 sandwiched between the active layer 6003 and the gate electrode 6005.

It is preferable to use a polycrystalline semiconductor film as the active layer 6003, and the polycrystalline semiconductor film can be formed by crystallizing an amorphous silicon film through prior-art techniques. As a prior-art crystallizing method, a heat crystallizing method using an electric heating furnace, a laser anneal crystallizing method using a laser beam, a lamp anneal crystallizing method using infrared rays have been known. In the present example, the semiconductor film is crystallized by an excimer laser beam through the use of an XeCl gas. Herein, a pulse-oscillating excimer laser beam processed in a linear shape is used. However, the excimer laser beam may have a rectangular shape or a continuous-oscillating argon laser beam or a continuous oscillating excimer laser beam may be used. Alternatively, a polycrystalline semiconductor film may be formed through the crystallizing method using a catalytic element according to the technique disclosed in JP-A-7-130652.

Also, a polycrystalline film formed through the sputtering method, the plasma CVD method, or the heat CVD method may be used.

In addition, besides silicon, silicon germanium may be used for the active layer. In the case of using silicon germanium, it is preferable that the concentration of germanium is approximately 0.01 to 4.5 atomic %. Further, silicon added with carbon nitride may be used.

In regard to the gate insulation film 6004, silicon dioxide, silicon nitride, or silicon nitride oxide may be used. Alternatively, a film made by depositing the foregoing, for example, a film made by depositing SiN on SiO$_2$ may be used as the gate insulation film. Also, in regard to SiO$_2$, TEOS (Tetraethyl Orthosilicate) is mixed with O$_2$ through the plasma CVD method, and a silicon dioxide film is formed through discharge at a high frequency (13.56 MHz) at power density of 0.5 to 0.8 W/cm$^2$, while a reaction pressure is set to 40 Pa and the substrate temperature is set to 300 to 400° C. The silicon dioxide film manufactured in this manner can attain satisfactory characteristic as the gate insulation film through the following heat annealing at 400 to 500° C. Also, aluminum nitride may be used for the gate insulation film. Aluminum nitride has relatively high heat conductivity, and is thereby able to disperse heat generated in the TFT effectively. Also, a film made by forming silicon dioxide, silicon nitride oxide, etc. excluding aluminum and then deposing aluminum nitride thereon may be used as the gate insulation film. Also, SiO$_2$ made through the RF sputtering method using Si as the target may be used as the gate insulation film.

Also, the gate electrode 6005 is made of an alloy material or a compound material composed of an element selected from Ta, W, Ti, Mo, Al, and Cu or chiefly composed of the foregoing elements. A semiconductor film represented by a polycrystalline film doped with an impurity element, such as phosphorous, may be used. The gate electrode 6005 may be a multi-layer conductive film made by depositing a plurality of layers instead of a single-layer conductive film.

For example, the multi-layer conductive film is preferably composed of a combination of a first conductive film made of tantalum nitride (TaN) and a second conductive film made of W, a combination of a first conductive film made of tantalum nitride (TaN) and a second conductive film made of Ti, a combination of a first conductive film made of tantalum nitride (TaN) and a second conductive film made of Al, or a combination of a first conductive film made of tantalum nitride (TaN) and a second conductive film made of Cu. Alternatively, a semiconductor film represented by a polycrystalline film doped with an impurity element, such as phosphorous, or AgPdCu alloy may be used as the first conductive film and the second conductive film.

The multi-layer conductive film is not limited to those of a double-layer structure, and for example, it may be of a triple-layer structure in which a tungsten film, an alloy (Al—Si) film of aluminum and silicon, and a titanium nitride film are deposited sequentially. In the case of the triple-layer structure, tungsten nitride may be used instead of tungsten, an alloy (Al—Ti) film of aluminum and titanium may be used instead of the alloy (Al—Si) film of aluminum and silicon, or a titanium film may be used instead of the titanium nitride film.

It is important to select an etching method and the type of etchant that best suit the material of the conductive film.

Also, the transistor 6002 is covered with a first inter-layer insulation film 6006, and a second inter-layer insulation film 6007 and a third inter-layer insulation film 6008 are deposited sequentially on the first inter-layer insulation film 6006.

Silicon dioxide, silicon nitride, or a silicon nitride oxide film made through the plasma CVD method or the sputtering method in the form of a single layer or deposited layers may be used as the first inter-layer insulation film 6006. Alternatively, a film made by depositing a silicon nitride oxide film in which oxygen has a higher mole fraction than nitrogen on another silicon nitride oxide film in which nitrogen has a higher mole fraction than oxygen may be used as the first inter-layer insulation film 6006.

It should be noted that when heat treatment (thermal treatment for 1–12 hours at 300 to 550° C.) is applied after the first inter-layer insulation film 6006 is formed, it is possible to terminate (hydrogenate) a dangling bond of the semiconductor contained in the active layer 6003 by hydrogen contained in the first inter-layer insulation film 6006.

Also, non-photosensitive acrylic may be used for the second inter-layer insulation film 6007.

A film used as the third inter-layer insulation film 6008 allows substances, such as moisture and oxygen, that accelerate deterioration of the light emitting element to pass through less easily than other insulation films. It is preferable to use representative examples including a DLC film, a carbon nitride film, a silicon nitride film made through the RF sputtering method, etc.

Referring to FIG. 37, numeral 6010 denotes an anode, numeral 6011 denotes an electroluminescence layer, numeral 6012 denotes a cathode, and a portion where the anode 6010, the electroluminescence layer 6011, and the cathode 6012 are superimposed on top of one another corresponds to a light emitting element 6013. The transistor 6002 is a driving transistor that controls a current to be supplied to the light emitting element 6013, and is connected to the light emitting element 6013 directly or in series through another circuit element.

The electroluminescence layer 6011 has a structure in which a light emitting layer alone or a plurality of layers including the light emitting layer are deposited.

The anode 6010 is formed on the third inter-layer insulation film 6008. Also, an organic resin film 6014 to be used as a partition wall is formed on the third inter-layer insulation film 6008. The organic resin film 6014 is provided with an opening 6015, and the light emitting element 6013 is formed as the anode 6010, the electroluminescence layer 6011, and the cathode 6012 are superimposed on top of one another in the opening portion.

A protection film 6016 is formed on the organic resin film 6014 and the cathode 6012. As with the third inter-layer insulation film 6008, a film used as the protection film 6016 allows substances, such as moisture and oxygen, that accelerate deterioration of a light emitting element to pass through less easily than other insulation films. It is preferable to use representative examples including a DLC film, a carbon nitride film, a silicon nitride film made through the RF sputtering method, etc. Also, a film made by depositing the aforementioned film that allows the substances, such as moisture and oxygen, to pass through less easily, and a film that allows the substances, such as moisture and oxygen, to pass through more easily than the aforementioned film may be used as the protection film.

The organic resin film 6014 is heated under vacuum atmosphere in order to remove moisture, oxygen, etc. adhering thereto before the electroluminescence layer 6011 is formed. To be more specific, the heat treatment is applied under vacuum atmosphere for 0.5 to 1 hour at 100° C. to 200° C. The atmosphere at $3 \times 10^{-7}$ Torr or below is preferable, and if possible, the atmosphere at $3 \times 10^{-8}$ Torr or below is most preferable. In a case where the electroluminescence layer is formed after the heat treatment is applied to the organic resin film under vacuum atmosphere, the reliability can be enhanced further by keeping the organic resin film under vacuum atmosphere immediately before the film formation of the electroluminescence layer.

Also, it is preferable that the end portion of the opening portion 6015 in the organic resin film 6014 is rounded, so that a hole is not made in the electroluminescence layer 6011 that partially overlaps the organic resin film 6014, at the edge portion. To be more specific, it is preferable that the curvature radius of the curve drawn by the cross section of the organic resin film at the opening portion is 0.2 to 2 $\mu$m approximately.

According to the above arrangement, the coverage of the electroluminescence layer and the cathode to be formed later can be satisfactory, and it is possible to prevent a shorting of the anode 6010 and the cathode 6012 through a hole made in the electroluminescence layer 6011. Also, by releasing the stress of the electroluminescence layer 6011, the occurrence of a defect called shrinking that the light emitting region is diminished can be reduced, and the reliability can be thus enhanced.

FIG. 37 shows a case where photosensitive acrylic resin of a positive type is used as the organic resin film 6014. The photosensitive organic resin includes a positive type in which a portion exposed by an energy line, such as light, electrons, and ions, is removed, and a negative type in which the exposed portion remains. In the invention, an organic resin film of the negative type may be used. Alternatively, the organic resin film 6014 may be made of photosensitive polyimide.

In a case where the organic resin film 6014 is made of acrylic of the negative type, the edge portion of the opening portion 6015 has an S-shaped cross section. It is preferable that the curvature radius at the top edge and the bottom edge of the opening portion is set to 0.2 to 2 $\mu$m.

A transparent conductive film may be used for the anode 6010. Besides ITO, a transparent conductive film in which indium oxide is mixed with 2 to 20% of zinc oxide (ZnO) may be used. In FIG. 37, ITO is used for the anode 6010. The anode 6010 may be polished through the CMP method, or wiping (Bellclean® rinsing) with a porous member based on polyvinyl alcohol in order to flatten the surface thereof. Alternatively, after the polishing through the CMP method, UV rays may be irradiated or the oxygen plasma treatment may be applied onto the surface of the anode 6010.

Any known material as long as it is a conductive film having a small work function may be used for the cathode 6012. For example, Ca, Al, CaF, MgAg, AlLi, etc. are preferable.

FIG. 37 shows an arrangement that light emitted from the light emitting element is irradiated toward the substrate 6000. It should be appreciated that a light emitting element of a structure such that light is directed to the opposite side of the substrate may be used.

In FIG. 37, the transistor 6002 is connected to the anode 6010 in the light emitting element. It should be appreciated, however, that the invention is not limited to the foregoing arrangement, and the transistor 6002 may be connected to the cathode 6012 in the light emitting element. In this case, the cathode is formed on the third inter-layer insulation film 6008, and is made of TiN, etc.

In practice, when the sequence up to FIG. 37 is completed, it is preferable to package (seal) the light emitting element with a protection film (laminate film, UV setting resin film, etc.) or a light-transmitting covering material having excellent airtightness and causing less degassing so as not to be exposed to atmosphere. In this instance, by providing inert atmosphere in the interior of the covering material or providing a moisture-absorbing material (for example, barium oxide) in the interior, the reliability of the OLED can be enhanced.

The invention is not limited to the manufacturing method described as above, and the light emitting apparatus can be manufactured through a known method. Also, the present example can be optionally combined with Examples 1 through 15 above.

In the invention, a laser beam is not irradiated by scanning a laser beam across the entire semiconductor film, but by scanning a laser beam at the absolutely necessary portion, so that this specific portion is crystallized at least. According to the above arrangement, it is possible to save the time for irradiating a laser beam to a portion that will be removed through patterning after the semiconductor film is crystallized, and the processing time per substrate can be thus shortened markedly.

What is claimed is:

1. A method of manufacturing a semiconductor device, wherein an insular semiconductor film having crystalline characteristics is formed by irradiating a first laser beam in a first direction to a semiconductor film at a region defined by pattern information and then irradiating a second laser beam in a second direction at a region defined by said pattern information and thereby enhancing the crystalline characteristics of said regions defined by said pattern information, followed by patterning of said regions where the crystalline characteristics have been enhanced through the use of said pattern information, wherein:

said first laser beam or said second laser beam is irradiated to said semiconductor film at a partial region containing said regions defined by said pattern information;

said first direction and said second direction cross with each other; and in a thin film transistor fabricated using said insular semiconductor film, a direction in which carriers move in a channel forming region is in parallel with at least one of said first direction and said second direction.

2. The method of manufacturing a semiconductor device according to claim 1, wherein:

a shape of a beam spot of said first laser beam is an elliptical shape or a rectangular shape; and an angle between a central axis of said beam spot in a longitudinal direction and said first direction is kept at or nearly at right angles.

3. The method of manufacturing a semiconductor device according to claim 1, wherein:

a shape of a beam spot of said second laser beam is an elliptical shape or a rectangular shape; and an angle between a central axis of said beam spot in a longitudinal direction and said second direction is kept in a range from 10° to 80° both inclusive.

4. The method of manufacturing a semiconductor device according to claim 1, wherein a laser oscillating apparatus is utilized, said laser oscillating apparatus comprising one or more than one type selected from a YAG laser, a $YVO_4$ laser, a YLF laser, a $YAlO_3$ laser, a glass laser, a ruby laser, an alexandrite laser, a Ti:sapphire laser, and a $Y_2O_3$ laser.

5. The method of manufacturing a semiconductor device according to claim 1, wherein a laser oscillating apparatus is utilized, said laser oscillating apparatus comprising a pulse-oscillating laser, and said semiconductor film is melted in a full thickness when irradiated by said first laser beam or said second laser beam.

6. The method of manufacturing a semiconductor device according to claim 1, wherein a laser oscillating apparatus is utilized, said laser oscillating apparatus comprising one or more than one type selected from continuous-oscillating excimer laser, Ar laser, and Kr laser.

7. The method of manufacturing a semiconductor device according to claim 6, said laser beam is a second harmonic.

8. A semiconductor device characterized by being manufactured through the method of manufacturing a semiconductor device according to claim 1.

9. Electronic equipment characterized by employing the semiconductor device according to claim 8.

10. A method of manufacturing a semiconductor device, wherein an insular semiconductor film having crystalline characteristics formed by irradiating a first laser beam in a first direction to a semiconductor film at a region defined by pattern information and then irradiating a second laser beam in a second direction at a region defined by said pattern information and thereby enhancing the crystalline characteristics of said regions defined by said pattern information, followed by patterning of said regions where the crystalline characteristics have been enhanced through the use of said pattern information, wherein:

said first laser beam or said second laser beam is irradiated to said semiconductor film at a partial region containing said regions defined by said pattern information;

said first direction and said second direction cross with each other; and in a thin film transistor fabricated using said insular semiconductor film, a direction in which carriers move in a channel forming region is in parallel with said first direction or said second direction.

11. The method of manufacturing a semiconductor device according to claim 10, wherein:

a shape of a beam spot of said first laser beam is an elliptical shape or a rectangular shape; and an angle between a central axis of said beam spot in a longitudinal direction and said first direction is kept at or nearly at right angles.

12. The method of manufacturing a semiconductor device according to claim 10, wherein:

a shape of a beam spot of said second laser beam is an elliptical shape or a rectangular shape; and an angle between a central axis of said beam spot in a longitudinal direction and said second direction is kept in a range from 10° to 80° both inclusive.

13. The method of manufacturing a semiconductor device according to claim 10, wherein a laser oscillating apparatus is utilized, said laser oscillating apparatus comprising one or more than one type selected from a YAG laser, a $YVO_4$ laser, a YLF laser, a $YAlO_3$ laser, a glass laser, a ruby laser, an alexandrite laser, a Ti:sapphire laser, and a $Y_2O_3$ laser.

14. The method of manufacturing a semiconductor device according to claim 10, wherein a laser oscillating apparatus is utilized, said laser oscillating apparatus comprising a pulse-oscillating laser, and said semiconductor film is melted in a full thickness when irradiated by said first laser beam or said second laser beam.

15. The method of manufacturing a semiconductor device according to claim 10, wherein a laser oscillating apparatus is utilized, said laser oscillating apparatus comprising one or more than one type selected from continuous-oscillating excimer laser, Ar laser, and Kr laser.

16. The method of manufacturing a semiconductor device according to claim 15, wherein said laser beam is a second harmonic.

17. Electronic equipment comprising the semiconductor device according to claim 16.

18. A semiconductor device manufactured through the method of manufacturing a semiconductor device according to claim 10.

19. A method of manufacturing a semiconductor device, wherein an insular semiconductor film having crystalline characteristics is formed by irradiating a first laser beam in a first direction to a semiconductor film at a region defined by pattern information and then irradiating a second laser beam in a second direction at a region defined by said pattern information and thereby enhancing the crystalline characteristics of said regions defined by said pattern information, followed by patterning of said regions where the crystalline characteristics have been enhanced through the use of said pattern information, wherein:

said first laser beam or said second laser beam is irradiated to said semiconductor film at a partial region containing said regions defined by said pattern information;

said first direction and said second direction cross with each other;

in a thin film transistor fabricated using said insular semiconductor film, a direction in which carriers move in a channel forming region is in parallel with said first direction; and said first laser beam is irradiated at energy density higher than energy density of said second laser beam.

20. The method of manufacturing a semiconductor device according to claim 19, wherein:

a shape of a beam spot of said first laser beam is an elliptical shape or a rectangular shape; and an angle between a central axis of said beam spot in a longitudinal direction and said first direction is kept at or nearly at right angles.

21. The method of manufacturing a semiconductor device according to claim 19, wherein:

a shape of a beam spot of said second laser beam is an elliptical shape or a rectangular shape; and an angle between a central axis of said beam spot in a longitudinal direction and said second direction is kept in a range from 10° to 80° both inclusive.

22. The method of manufacturing a semiconductor device according to claim 19, wherein a laser oscillating apparatus is utilized, said laser oscillating apparatus comprising one or more than one type selected from a YAG laser, a $YVO_4$ laser, a YLF laser, a $YAlO_3$ laser, a glass laser, a ruby laser, an alexandrite laser, a Ti:sapphire laser, and a $Y_2O_3$ laser.

23. The method of manufacturing a semiconductor device according to claim 19, wherein a laser oscillating apparatus is utilized, said laser oscillating apparatus comprising a pulse-oscillating laser, and said semiconductor film is melted in a full thickness when irradiated by said first laser beam or said second laser beam.

24. The method of manufacturing a semiconductor device according to claim 19, wherein a laser oscillating apparatus is utilized, said laser oscillating apparatus comprising one or more than one type selected from continuous-oscillating excimer laser, Ar laser, and Kr laser.

25. The method of manufacturing a semiconductor device according to claim 24, wherein said laser beam is a second harmonic.

26. Electronic equipment comprising the semiconductor device according to claim 25.

27. A semiconductor device manufactured through the method of manufacturing a semiconductor device according to claim 19.

28. A method of manufacturing a semiconductor device, wherein an insular semiconductor film having crystalline characteristics is formed by irradiating a first laser beam in a first direction to a semiconductor film at a region defined by pattern information and then irradiating a second laser beam in a second direction at a region defined by said pattern information and thereby enhancing the crystalline characteristics of said regions defined by said pattern information, followed by patterning of said regions where the crystalline characteristics have been enhanced through the use of said pattern information, wherein:

said first laser beam or said second laser beam is irradiated to said semiconductor film at a partial region containing said regions defined by said pattern information;

said first direction and said second direction cross with each other;

in a thin film transistor fabricated using said insular semiconductor film, a direction in which carriers move in a channel forming region is in parallel with said second direction; and said second laser beam is irradiated at energy density higher than energy density of said first laser beam.

29. The method of manufacturing a semiconductor device according to claim 28, wherein:

a shape of a beam spot of said first laser beam is an elliptical shape or a rectangular shape; and an angle between a central axis of said beam spot in a longitudinal direction and said first direction is kept at or nearly at right angles.

30. The method of manufacturing a semiconductor device according to claim 28, wherein:

a shape of a beam spot of said second laser beam is an elliptical shape or a rectangular shape; and an angle between a central axis of said beam spot in a longitudinal direction and said second direction is kept in a range from 10° to 80° both inclusive.

31. The method of manufacturing a semiconductor device according to claim 28, wherein a laser oscillating apparatus is utilized, said laser oscillating apparatus comprising one or more than one type selected from a YAG laser, a $YVO_4$ laser, a YLF laser, a $YAlO_3$ laser, a glass laser, a ruby laser, an alexandrite laser, a Ti:sapphire laser, and a $Y_2O_3$ laser.

32. The method of manufacturing a semiconductor device according to claim 28, wherein a laser oscillating apparatus is utilized, said laser oscillating apparatus comprising a pulse-oscillating laser, and said semiconductor film is melted in a full thickness when irradiated by said first laser beam or said second laser beam.

33. The method of manufacturing a semiconductor device according to claim 28, wherein a laser oscillating apparatus is utilized, said laser oscillating apparatus comprising one or more than one type selected from continuous-oscillating excimer laser, Ar laser, and Kr laser.

34. The method of manufacturing a semiconductor device according to claim 33, wherein said laser beam is a second harmonic.

35. Electronic equipment comprising the semiconductor device according to claim 34.

36. A semiconductor device manufactured through the method of manufacturing a semiconductor device according claim 28.

* * * * *